US010249577B2

(12) United States Patent
Lee et al.

(10) Patent No.: US 10,249,577 B2
(45) Date of Patent: Apr. 2, 2019

(54) METHOD OF FORMING METAL INTERCONNECTION AND METHOD OF FABRICATING SEMICONDUCTOR APPARATUS USING THE METHOD

(71) Applicant: ASM IP Holding B.V., Almere (NL)

(72) Inventors: Choong Man Lee, Chungcheongnam-do (KR); Yong Min Yoo, Seoul (KR); Young Jae Kim, Chungcheongnam-do (KR); Seung Ju Chun, Chungcheongnam-do (KR); Sun Ja Kim, Chungcheongnam-do (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/499,647

(22) Filed: Apr. 27, 2017

(65) Prior Publication Data

US 2017/0338192 A1 Nov. 23, 2017

(30) Foreign Application Priority Data

May 17, 2016 (KR) .................. 10-2016-0060210

(51) Int. Cl.
*H01L 21/4763* (2006.01)
*H01L 23/00* (2006.01)
*H01L 21/768* (2006.01)
*H01L 21/02* (2006.01)
(Continued)

(52) U.S. Cl.
CPC ........ *H01L 23/564* (2013.01); *H01L 21/0217* (2013.01); *H01L 21/0228* (2013.01); *H01L 21/02178* (2013.01); *H01L 21/02211* (2013.01); *H01L 21/02219* (2013.01); *H01L 21/02274* (2013.01); *H01L 21/7684* (2013.01);

*H01L 21/76802* (2013.01); *H01L 21/76832* (2013.01); *H01L 21/76834* (2013.01); *H01L 21/76843* (2013.01); *H01L 21/76877* (2013.01); *H01L 23/5226* (2013.01); *H01L 23/53238* (2013.01);
(Continued)

(58) Field of Classification Search
None
See application file for complete search history.

(56) References Cited

U.S. PATENT DOCUMENTS

| D30,036 S | 1/1899 | Rhind |
| D31,889 S | 11/1899 | Gill |
| D56,051 S | 8/1920 | Cohn |

(Continued)

FOREIGN PATENT DOCUMENTS

| CN | 2588350 | 11/2003 |
| CN | 1563483 | 1/2005 |

(Continued)

OTHER PUBLICATIONS

USPTO; Final Office Action dated Apr. 11, 2013 in U.S. Appl. No. 13/191,762.
(Continued)

*Primary Examiner* — Bradley Smith
(74) *Attorney, Agent, or Firm* — Snell & Wilmer L.L.P.

(57) ABSTRACT

A semiconductor manufacturing method includes depositing a low-k dielectric layer, forming a trench in the low-k dielectric layer, forming a barrier layer in the trench, filling a metal on the barrier layer, planarizing the metal, and forming a capping layer on the planarized metal, wherein the capping layer includes at least two layers.

16 Claims, 7 Drawing Sheets

(51) Int. Cl.
*H01L 23/532* (2006.01)
*H01L 23/522* (2006.01)
(52) U.S. Cl.
CPC .. *H01L 23/53295* (2013.01); *H01L 21/02074* (2013.01)

(56) References Cited

U.S. PATENT DOCUMENTS

| | | |
|---|---|---|
| 2,059,480 A | 11/1936 | Obermaier |
| 2,161,626 A | 6/1939 | Loughner et al. |
| 2,266,416 A | 12/1941 | Duclos |
| 2,280,778 A | 4/1942 | Anderson |
| 2,410,420 A | 11/1946 | Bennett |
| 2,563,931 A | 8/1951 | Harrison |
| 2,660,061 A | 11/1953 | Lewis |
| 2,745,640 A | 5/1956 | Cushman |
| 2,990,045 A | 9/1959 | Root |
| 3,038,951 A | 6/1962 | Mead |
| 3,089,507 A | 5/1963 | Drake et al. |
| 3,094,396 A | 6/1963 | Flugge et al. |
| 3,232,437 A | 2/1966 | Hultgren |
| 3,263,502 A | 8/1966 | Springfield Redwood |
| 3,410,349 A | 11/1968 | Troutman |
| 3,588,192 A | 6/1971 | Drutchas et al. |
| 3,647,387 A | 3/1972 | Benson |
| 3,647,716 A | 3/1972 | Koches |
| 3,713,899 A | 1/1973 | Sebestyen |
| 3,718,429 A | 2/1973 | Williamson |
| 3,833,492 A | 9/1974 | Bollyky |
| 3,854,443 A | 12/1974 | Baerg |
| 3,862,397 A | 1/1975 | Anderson et al. |
| 3,867,205 A | 2/1975 | Schley |
| 3,885,504 A | 5/1975 | Baermann |
| 3,887,790 A | 6/1975 | Ferguson |
| 3,904,371 A | 9/1975 | Neti |
| 3,913,058 A | 10/1975 | Nishio et al. |
| 3,913,617 A | 10/1975 | van Laar |
| 3,947,685 A | 3/1976 | Meinel |
| 3,960,559 A | 6/1976 | Suzuki |
| 4,054,071 A | 10/1977 | Patejak |
| 4,058,430 A | 11/1977 | Suntola et al. |
| 4,093,491 A | 6/1978 | Whelpton et al. |
| D249,341 S | 9/1978 | Mertz |
| 4,126,027 A | 11/1978 | Smith et al. |
| 4,134,425 A | 1/1979 | Gussefeld et al. |
| 4,145,699 A | 3/1979 | Hu et al. |
| 4,164,959 A | 8/1979 | Wurzburger |
| 4,176,630 A | 12/1979 | Elmer |
| 4,181,330 A | 1/1980 | Kojima |
| 4,194,536 A | 3/1980 | Stine et al. |
| 4,217,463 A | 8/1980 | Swearingen |
| 4,234,449 A | 11/1980 | Wolson et al. |
| 4,322,592 A | 3/1982 | Martin |
| 4,333,735 A | 6/1982 | Hardy |
| 4,355,912 A | 10/1982 | Haak |
| 4,389,973 A | 6/1983 | Suntola et al. |
| 4,393,013 A | 7/1983 | McMenamin |
| 4,401,507 A | 8/1983 | Engle |
| 4,414,492 A | 11/1983 | Hanlet |
| 4,436,674 A | 3/1984 | McMenamin |
| 4,444,990 A | 4/1984 | Villar |
| 4,454,370 A | 6/1984 | Voznick |
| 4,455,193 A | 6/1984 | Jeuch et al. |
| 4,466,766 A | 8/1984 | Geren et al. |
| 4,479,831 A | 10/1984 | Sandow |
| 4,499,354 A | 2/1985 | Hill et al. |
| 4,512,113 A | 4/1985 | Budinger |
| 4,527,005 A | 7/1985 | McKelvey et al. |
| 4,537,001 A | 8/1985 | Uppstrom |
| 4,548,688 A | 10/1985 | Mathews |
| 4,570,328 A | 2/1986 | Price et al. |
| 4,575,636 A | 3/1986 | Caprari |
| 4,578,560 A | 3/1986 | Tanaka et al. |
| 4,579,378 A | 4/1986 | Snyders |
| 4,579,623 A | 4/1986 | Suzuki et al. |
| 4,590,326 A | 5/1986 | Woldy |
| 4,611,966 A | 9/1986 | Johnson |
| 4,620,998 A | 11/1986 | Lalvani |
| D288,556 S | 3/1987 | Wallgren |
| 4,653,541 A | 3/1987 | Oehlschlaeger et al. |
| 4,654,226 A | 3/1987 | Jackson et al. |
| 4,664,769 A | 5/1987 | Cuomo et al. |
| 4,681,134 A | 7/1987 | Paris |
| 4,718,637 A | 1/1988 | Contin |
| 4,721,533 A | 1/1988 | Phillippi et al. |
| 4,722,298 A | 2/1988 | Rubin et al. |
| 4,724,272 A | 2/1988 | Raniere et al. |
| 4,735,259 A | 4/1988 | Vincent |
| 4,749,416 A | 6/1988 | Greenspan |
| 4,753,192 A | 6/1988 | Goldsmith et al. |
| 4,756,794 A | 7/1988 | Yoder |
| 4,771,015 A | 9/1988 | Kanai |
| 4,780,169 A | 10/1988 | Stark et al. |
| 4,789,294 A | 12/1988 | Sato et al. |
| 4,821,674 A | 4/1989 | deBoer et al. |
| 4,827,430 A | 5/1989 | Aid et al. |
| 4,830,515 A | 5/1989 | Cortes |
| 4,837,113 A | 6/1989 | Luttmer et al. |
| 4,837,185 A | 6/1989 | Yau et al. |
| 4,854,263 A | 8/1989 | Chang et al. |
| 4,854,266 A | 8/1989 | Simson et al. |
| 4,857,137 A | 8/1989 | Tachi et al. |
| 4,857,382 A | 8/1989 | Liu et al. |
| 4,882,199 A | 11/1989 | Sadoway et al. |
| 4,916,091 A | 4/1990 | Freeman et al. |
| 4,934,831 A | 6/1990 | Volbrecht |
| 4,949,848 A | 8/1990 | Kos |
| D311,126 S | 10/1990 | Crowley |
| 4,976,996 A | 12/1990 | Monkowski et al. |
| 4,978,567 A | 12/1990 | Miller |
| 4,984,904 A | 1/1991 | Nakano et al. |
| 4,985,114 A | 1/1991 | Okudaira |
| 4,986,215 A | 1/1991 | Yamada |
| 4,987,856 A | 1/1991 | Hey |
| 4,989,992 A | 2/1991 | Piai |
| 4,991,614 A | 2/1991 | Hammel |
| 5,013,691 A | 5/1991 | Lory et al. |
| 5,027,746 A | 7/1991 | Frijlink |
| 5,028,366 A | 7/1991 | Harakal et al. |
| 5,057,436 A | 10/1991 | Ball |
| 5,060,322 A | 10/1991 | Delepine |
| 5,061,083 A | 10/1991 | Grimm et al. |
| 5,062,386 A | 11/1991 | Christensen |
| 5,065,698 A | 11/1991 | Koike |
| 5,071,258 A | 12/1991 | Usher et al. |
| 5,074,017 A | 12/1991 | Toya et al. |
| 5,098,638 A | 3/1992 | Sawada |
| 5,098,865 A | 3/1992 | Machado |
| 5,104,514 A | 4/1992 | Quartarone |
| 5,108,192 A | 4/1992 | Mailliet et al. |
| 5,116,018 A | 5/1992 | Friemoth et al. |
| D327,534 S | 6/1992 | Manville |
| 5,119,760 A | 6/1992 | McMillan et al. |
| 5,130,003 A | 7/1992 | Conrad |
| 5,137,286 A | 8/1992 | Whitford |
| 5,154,301 A | 10/1992 | Kos |
| 5,158,128 A | 10/1992 | Inoue et al. |
| 5,167,716 A | 12/1992 | Boitnott et al. |
| 5,176,451 A | 1/1993 | Sasada |
| 5,178,682 A | 1/1993 | Tsukamoto et al. |
| 5,181,779 A | 1/1993 | Shia et al. |
| 5,183,511 A | 2/1993 | Yamazaki et al. |
| 5,192,717 A | 3/1993 | Kawakami |
| 5,194,401 A | 3/1993 | Adams et al. |
| 5,199,603 A | 4/1993 | Prescott |
| 5,213,650 A | 5/1993 | Wang et al. |
| 5,221,556 A | 6/1993 | Hawkins et al. |
| 5,225,366 A | 7/1993 | Yoder et al. |
| 5,226,383 A | 7/1993 | Bhat |
| 5,228,114 A | 7/1993 | Suzuki |
| 5,242,539 A | 9/1993 | Kumihashi et al. |
| 5,243,195 A | 9/1993 | Nishi |
| 5,243,202 A | 9/1993 | Mori et al. |
| 5,246,218 A | 9/1993 | Yap et al. |

(56) References Cited

U.S. PATENT DOCUMENTS

| | | |
|---|---|---|
| 5,246,500 A | 9/1993 | Samata et al. |
| 5,259,881 A | 11/1993 | Edwards et al. |
| 5,266,526 A | 11/1993 | Aoyama |
| 5,271,967 A | 12/1993 | Kramer et al. |
| 5,278,494 A | 1/1994 | Obigane |
| 5,284,519 A | 2/1994 | Gadgil |
| 5,288,684 A | 2/1994 | Yamazaki et al. |
| 5,294,778 A | 3/1994 | Carman et al. |
| 5,306,666 A | 4/1994 | Izumi |
| 5,306,946 A | 4/1994 | Yamamoto |
| 5,310,456 A | 5/1994 | Kadomura |
| 5,314,570 A | 5/1994 | Ikegaya et al. |
| 5,315,092 A | 5/1994 | Takahashi et al. |
| 5,326,427 A | 7/1994 | Jerbic |
| 5,336,327 A | 8/1994 | Lee |
| 5,354,580 A | 10/1994 | Goela et al. |
| 5,356,478 A | 10/1994 | Chen et al. |
| 5,356,672 A | 10/1994 | Schmitt et al. |
| 5,360,269 A | 11/1994 | Ogawa et al. |
| 5,364,667 A | 11/1994 | Rhieu |
| D353,452 S | 12/1994 | Groenhoff |
| 5,374,315 A | 12/1994 | Deboer et al. |
| 5,380,367 A | 1/1995 | Bertone |
| 5,382,311 A | 1/1995 | Ishikawa et al. |
| 5,388,945 A | 2/1995 | Garric et al. |
| 5,404,082 A | 4/1995 | Hernandez et al. |
| 5,407,449 A | 4/1995 | Zinger |
| 5,413,813 A | 5/1995 | Cruse et al. |
| 5,414,221 A | 5/1995 | Gardner |
| 5,415,753 A | 5/1995 | Hurwitt et al. |
| 5,421,893 A | 6/1995 | Perlov |
| 5,422,139 A | 6/1995 | Fischer |
| 5,423,942 A | 6/1995 | Robbins et al. |
| 5,430,011 A | 7/1995 | Tanaka et al. |
| 5,444,217 A | 8/1995 | Moore |
| 5,453,124 A | 9/1995 | Moslehi et al. |
| 5,494,494 A | 2/1996 | Mizuno et al. |
| 5,496,408 A | 3/1996 | Motoda et al. |
| 5,504,042 A | 4/1996 | Cho et al. |
| 5,514,439 A | 5/1996 | Sibley |
| 5,518,549 A | 5/1996 | Hellwig |
| 5,523,616 A | 6/1996 | Yasuhide |
| 5,527,111 A | 6/1996 | Lysen et al. |
| 5,527,417 A | 6/1996 | Iida et al. |
| 5,531,835 A | 7/1996 | Fodor et al. |
| 5,540,898 A | 7/1996 | Davidson |
| 5,558,717 A | 9/1996 | Zhao et al. |
| 5,559,046 A | 9/1996 | Oishi et al. |
| 5,574,247 A | 11/1996 | Nishitani et al. |
| 5,576,629 A | 11/1996 | Turner |
| 5,577,331 A | 11/1996 | Suzuki |
| 5,583,736 A | 12/1996 | Anderson et al. |
| 5,589,002 A | 12/1996 | Su |
| 5,589,110 A | 12/1996 | Motoda et al. |
| 5,595,606 A | 1/1997 | Fujikawa et al. |
| 5,601,641 A | 2/1997 | Stephens |
| 5,604,410 A | 2/1997 | Vollkommer et al. |
| 5,616,264 A | 4/1997 | Nishi et al. |
| 5,616,947 A | 4/1997 | Tamura |
| 5,621,982 A | 4/1997 | Yamashita |
| 5,632,919 A | 5/1997 | MacCracken et al. |
| D380,527 S | 7/1997 | Velez |
| 5,656,093 A | 8/1997 | Burkhart et al. |
| 5,663,899 A | 9/1997 | Zvonar et al. |
| 5,665,608 A | 9/1997 | Chapple-Sokol et al. |
| 5,679,215 A | 10/1997 | Barnes et al. |
| 5,681,779 A | 10/1997 | Pasch et al. |
| 5,683,517 A | 11/1997 | Shan |
| 5,695,567 A | 12/1997 | Kordina |
| 5,697,706 A | 12/1997 | Ciaravino et al. |
| 5,700,729 A | 12/1997 | Lee et al. |
| 5,708,825 A | 1/1998 | Sotomayor |
| 5,711,811 A | 1/1998 | Suntola et al. |
| 5,716,133 A | 2/1998 | Hosokawa et al. |
| 5,718,574 A | 2/1998 | Shimazu |
| D392,855 S | 3/1998 | Pillow |
| 5,724,748 A | 3/1998 | Brooks |
| 5,728,223 A | 3/1998 | Murakarni et al. |
| 5,730,801 A | 3/1998 | Tepman et al. |
| 5,732,744 A | 3/1998 | Barr et al. |
| 5,736,314 A | 4/1998 | Hayes et al. |
| 5,753,835 A | 5/1998 | Gustin |
| 5,761,328 A | 6/1998 | Solberg et al. |
| 5,777,838 A | 7/1998 | Tamagawa et al. |
| 5,779,203 A | 7/1998 | Edlinger |
| 5,781,693 A | 7/1998 | Balance et al. |
| 5,782,979 A | 7/1998 | Kaneno |
| 5,791,782 A | 8/1998 | Wooten et al. |
| 5,792,272 A | 8/1998 | Van Os et al. |
| 5,796,074 A | 8/1998 | Edelstein et al. |
| 5,801,104 A | 9/1998 | Schuegraf et al. |
| 5,806,980 A | 9/1998 | Berrian |
| 5,813,851 A | 9/1998 | Nakao |
| 5,819,092 A | 10/1998 | Ferguson et al. |
| 5,819,434 A | 10/1998 | Herchen et al. |
| 5,827,435 A | 10/1998 | Seiji |
| 5,827,757 A | 10/1998 | Robinson, Jr. et al. |
| 5,836,483 A | 11/1998 | Disel |
| 5,837,058 A | 11/1998 | Chen et al. |
| 5,837,320 A | 11/1998 | Hampden-Smith et al. |
| 5,844,683 A | 12/1998 | Pavloski et al. |
| 5,846,332 A | 12/1998 | Zhao et al. |
| 5,851,294 A | 12/1998 | Young et al. |
| 5,852,879 A | 12/1998 | Schumaier |
| 5,853,484 A | 12/1998 | Jeong |
| 5,855,680 A | 1/1999 | Soininen et al. |
| 5,855,681 A | 1/1999 | Maydan et al. |
| 5,857,777 A | 1/1999 | Schuh |
| 5,863,123 A | 1/1999 | Lee |
| 5,865,205 A | 2/1999 | Wilmer |
| 5,873,942 A | 2/1999 | Park |
| 5,877,095 A | 3/1999 | Tamura et al. |
| 5,879,128 A | 3/1999 | Tietz et al. |
| 5,884,640 A | 3/1999 | Fishkin et al. |
| D409,894 S | 5/1999 | McClurg |
| 5,908,672 A | 6/1999 | Ryu |
| 5,916,365 A | 6/1999 | Sherman |
| D412,270 S | 7/1999 | Fredrickson |
| 5,920,798 A | 7/1999 | Higuchi et al. |
| 5,937,323 A | 8/1999 | Orczyk et al. |
| 5,947,718 A | 9/1999 | Weaver |
| 5,954,375 A | 9/1999 | Trickle et al. |
| 5,961,775 A | 10/1999 | Fujimura |
| 5,968,275 A | 10/1999 | Lee et al. |
| 5,970,621 A | 10/1999 | Bazydola |
| 5,975,492 A | 11/1999 | Brenes |
| 5,979,506 A | 11/1999 | Aarseth |
| 5,982,931 A | 11/1999 | Ishimaru |
| 5,984,391 A | 11/1999 | Vanderpot et al. |
| 5,987,480 A | 11/1999 | Donohue et al. |
| 5,997,588 A | 12/1999 | Goodwin |
| 5,997,768 A | 12/1999 | Scully |
| 5,998,870 A | 12/1999 | Lee et al. |
| 6,001,267 A | 12/1999 | Van Os et al. |
| D419,652 S | 1/2000 | Hall et al. |
| 6,013,553 A | 1/2000 | Wallace |
| 6,013,920 A | 1/2000 | Gordon et al. |
| 6,015,465 A | 1/2000 | Kholodenko et al. |
| 6,017,779 A | 1/2000 | Miyasaka |
| 6,017,818 A | 1/2000 | Lu |
| 6,024,799 A | 2/2000 | Chen |
| 6,035,101 A | 3/2000 | Sajoto et al. |
| 6,042,652 A | 3/2000 | Hyun |
| 6,044,860 A | 4/2000 | Nue |
| 6,045,260 A | 4/2000 | Schwartz et al. |
| 6,048,154 A | 4/2000 | Wytman |
| 6,050,506 A | 4/2000 | Guo et al. |
| 6,054,678 A | 4/2000 | Miyazaki |
| 6,060,691 A | 5/2000 | Minami et al. |
| 6,060,721 A | 5/2000 | Huang |
| 6,068,441 A | 5/2000 | Raaijmakers et al. |
| 6,072,163 A | 6/2000 | Armstrong |
| 6,073,973 A | 6/2000 | Boscaljon et al. |
| 6,074,443 A | 6/2000 | Venkatesh |

(56) References Cited

U.S. PATENT DOCUMENTS

| | | |
|---|---|---|
| 6,083,321 A | 7/2000 | Lei et al. |
| 6,086,677 A | 7/2000 | Umotoy et al. |
| 6,091,062 A | 7/2000 | Pfahnl et al. |
| 6,093,252 A | 7/2000 | Wengert et al. |
| 6,093,253 A | 7/2000 | Lofgren |
| 6,096,267 A | 8/2000 | Kishkovich |
| 6,099,302 A | 8/2000 | Hong et al. |
| 6,102,565 A | 8/2000 | Kita et al. |
| 6,104,011 A | 8/2000 | Juliano |
| 6,104,401 A | 8/2000 | Parsons |
| 6,106,678 A | 8/2000 | Shufflebotham |
| 6,119,710 A | 9/2000 | Brown |
| 6,121,061 A | 9/2000 | Van Bilsen et al. |
| 6,121,158 A | 9/2000 | Benchikha et al. |
| 6,122,036 A | 9/2000 | Yamasaki et al. |
| 6,124,600 A | 9/2000 | Moroishi et al. |
| 6,125,789 A | 10/2000 | Gupta et al. |
| 6,126,848 A | 10/2000 | Li et al. |
| 6,129,044 A | 10/2000 | Zhao et al. |
| 6,129,546 A | 10/2000 | Sada |
| 6,134,807 A | 10/2000 | Komino |
| 6,137,240 A | 10/2000 | Bogdan et al. |
| 6,140,252 A | 10/2000 | Cho et al. |
| 6,148,761 A | 11/2000 | Majewski et al. |
| 6,158,941 A | 12/2000 | Muka et al. |
| 6,160,244 A | 12/2000 | Ohashi |
| 6,161,500 A | 12/2000 | Kopacz et al. |
| 6,162,323 A | 12/2000 | Koshimizu et al. |
| 6,174,809 B1 | 1/2001 | Kang et al. |
| 6,178,918 B1 | 1/2001 | Van Os et al. |
| 6,180,979 B1 | 1/2001 | Hofman et al. |
| 6,187,672 B1 | 2/2001 | Zhao |
| 6,187,691 B1 | 2/2001 | Fukuda |
| 6,190,634 B1 | 2/2001 | Lieber et al. |
| 6,191,399 B1 | 2/2001 | Van Bilsen |
| 6,194,037 B1 | 2/2001 | Terasaki et al. |
| 6,201,999 B1 | 3/2001 | Jevtic |
| 6,203,613 B1 | 3/2001 | Gates et al. |
| 6,207,932 B1 | 3/2001 | Yoo |
| 6,212,789 B1 | 4/2001 | Kato |
| 6,214,122 B1 | 4/2001 | Thompson |
| 6,217,658 B1 | 4/2001 | Orczyk et al. |
| 6,218,288 B1 | 4/2001 | Li et al. |
| 6,225,020 B1 | 5/2001 | Jung et al. |
| 6,235,858 B1 | 5/2001 | Swarup et al. |
| 6,242,359 B1 | 6/2001 | Misra |
| 6,243,654 B1 | 6/2001 | Johnson et al. |
| 6,245,665 B1 | 6/2001 | Yokoyama |
| 6,250,250 B1 | 6/2001 | Maishev et al. |
| 6,257,758 B1 | 7/2001 | Culbertson |
| 6,264,467 B1 | 7/2001 | Andreas et al. |
| 6,271,148 B1 | 8/2001 | Kao |
| 6,274,878 B1 | 8/2001 | Li et al. |
| 6,281,098 B1 | 8/2001 | Wang |
| 6,281,141 B1 | 8/2001 | Das et al. |
| 6,284,050 B1 | 9/2001 | Shi et al. |
| 6,287,965 B1 | 9/2001 | Kang et al. |
| 6,293,700 B1 | 9/2001 | Lund et al. |
| D449,873 S | 10/2001 | Bronson |
| 6,296,909 B1 | 10/2001 | Spitsberg |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,311,016 B1 | 10/2001 | Yanagawa et al. |
| 6,312,525 B1 | 11/2001 | Bright et al. |
| 6,315,512 B1 | 11/2001 | Tabrizi et al. |
| 6,316,162 B1 | 11/2001 | Jung et al. |
| D451,893 S | 12/2001 | Robson |
| D452,220 S | 12/2001 | Robson |
| 6,325,858 B1 | 12/2001 | Wengert |
| 6,326,597 B1 | 12/2001 | Lubomirsky et al. |
| 6,329,297 B1 | 12/2001 | Balish |
| 6,342,427 B1 | 1/2002 | Choi et al. |
| 6,344,084 B1 | 2/2002 | Koinuma et al. |
| 6,344,232 B1 | 2/2002 | Jones et al. |
| 6,347,636 B1 | 2/2002 | Xia |
| 6,350,391 B1 | 2/2002 | Livshits et al. |
| 6,352,945 B1 | 3/2002 | Matsuki |
| D455,024 S | 4/2002 | Mimick et al. |
| 6,367,410 B1 | 4/2002 | Leahey et al. |
| 6,368,773 B1 | 4/2002 | Jung et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran |
| 6,375,312 B1 | 4/2002 | Ikeda et al. |
| 6,375,750 B1 | 4/2002 | Van Os et al. |
| D457,609 S | 5/2002 | Piano |
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,395,650 B1 | 5/2002 | Callegari et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,432,849 B1 | 8/2002 | Endo et al. |
| 6,435,798 B1 | 8/2002 | Satoh |
| 6,435,865 B1 | 8/2002 | Tseng et al. |
| 6,436,819 B1 | 8/2002 | Zhang |
| 6,437,444 B2 | 8/2002 | Andideh |
| 6,438,502 B1 | 8/2002 | Awtrey |
| 6,441,350 B1 | 8/2002 | Stoddard et al. |
| 6,445,574 B1 | 9/2002 | Saw et al. |
| 6,446,573 B2 | 9/2002 | Hirayama et al. |
| 6,447,232 B1 | 9/2002 | Davis et al. |
| 6,447,651 B1 | 9/2002 | Ishikawa et al. |
| 6,448,192 B1 | 9/2002 | Kaushik |
| 6,450,757 B1 | 9/2002 | Saeki |
| 6,451,713 B1 | 9/2002 | Tay et al. |
| 6,454,860 B2 | 9/2002 | Metzner et al. |
| 6,455,225 B1 | 9/2002 | Kong et al. |
| 6,455,445 B2 | 9/2002 | Matsuki |
| 6,461,435 B1 | 10/2002 | Littau et al. |
| 6,468,924 B2 | 10/2002 | Lee |
| 6,471,779 B1 | 10/2002 | Nishio et al. |
| 6,472,266 B1 | 10/2002 | Yu et al. |
| 6,475,276 B1 | 11/2002 | Elers et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Buckland |
| 6,483,989 B1 | 11/2002 | Okada et al. |
| 6,494,065 B2 | 12/2002 | Babbitt |
| 6,494,998 B1 | 12/2002 | Brcka |
| 6,496,819 B1 | 12/2002 | Bello et al. |
| 6,499,533 B2 | 12/2002 | Yamada |
| 6,503,079 B2 | 1/2003 | Kogano et al. |
| 6,503,562 B1 | 1/2003 | Saito et al. |
| 6,503,826 B1 | 1/2003 | Oda |
| 6,506,253 B2 | 1/2003 | Sakuma |
| 6,507,410 B1 | 1/2003 | Robertson et al. |
| 6,511,539 B1 | 1/2003 | Raaijmakers |
| 6,514,313 B1 | 2/2003 | Spiegelman |
| 6,514,666 B1 | 2/2003 | Choi et al. |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,133 B1 | 3/2003 | Kaloyeros et al. |
| 6,534,395 B2 | 3/2003 | Werkhoven et al. |
| 6,536,950 B1 | 3/2003 | Green |
| 6,544,906 B2 | 4/2003 | Rotondaro et al. |
| 6,552,209 B1 | 4/2003 | Lei et al. |
| 6,558,755 B2 | 5/2003 | Berry et al. |
| 6,559,026 B1 | 5/2003 | Rossman et al. |
| 6,566,278 B1 | 5/2003 | Harvey et al. |

(56) References Cited

U.S. PATENT DOCUMENTS

| | | |
|---|---|---|
| 6,569,239 B2 | 5/2003 | Arai et al. |
| 6,569,971 B2 | 5/2003 | Roh et al. |
| 6,573,030 B1 | 6/2003 | Fairbairn et al. |
| 6,574,644 B2 | 6/2003 | Hsu et al. |
| 6,576,062 B2 | 6/2003 | Matsuse |
| 6,576,064 B2 | 6/2003 | Griffiths et al. |
| 6,576,300 B1 | 6/2003 | Berry et al. |
| 6,576,564 B2 | 6/2003 | Agarwal |
| 6,578,589 B1 | 6/2003 | Mayusumi |
| 6,579,833 B1 | 6/2003 | McNallan et al. |
| 6,580,050 B1 | 6/2003 | Miller et al. |
| 6,583,048 B1 | 6/2003 | Vincent et al. |
| 6,589,707 B2 | 7/2003 | Lee et al. |
| 6,589,868 B2 | 7/2003 | Rossman |
| 6,590,251 B2 | 7/2003 | Kang et al. |
| 6,594,550 B1 | 7/2003 | Okrah |
| 6,596,653 B2 | 7/2003 | Tan |
| 6,598,559 B1 | 7/2003 | Vellore et al. |
| 6,607,868 B2 | 8/2003 | Choi |
| 6,607,948 B1 | 8/2003 | Sugiyama et al. |
| 6,608,745 B2 | 8/2003 | Tsuruta et al. |
| 6,620,251 B2 | 9/2003 | Kitano |
| 6,624,064 B1 | 9/2003 | Sahin |
| 6,627,268 B1 | 9/2003 | Fair et al. |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 | 10/2003 | Deng et al. |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,656,281 B1 | 12/2003 | Ueda |
| 6,660,662 B2 | 12/2003 | Ishikawa et al. |
| 6,662,817 B2 | 12/2003 | Yamagishi |
| 6,673,196 B1 | 1/2004 | Oyabu |
| 6,676,290 B1 | 1/2004 | Lu |
| 6,682,971 B2 | 1/2004 | Tsuneda et al. |
| 6,682,973 B1 | 1/2004 | Paton et al. |
| D486,891 S | 2/2004 | Cronce |
| 6,684,659 B1 | 2/2004 | Tanaka et al. |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki |
| 6,699,399 B1 | 3/2004 | Qian et al. |
| 6,709,989 B2 | 3/2004 | Ramdani et al. |
| 6,710,364 B2 | 3/2004 | Guldi et al. |
| 6,710,857 B2 | 3/2004 | Kondo |
| 6,713,824 B1 | 3/2004 | Mikata |
| 6,716,571 B2 | 4/2004 | Gabriel |
| 6,720,260 B1 | 4/2004 | Fair et al. |
| 6,722,837 B2 | 4/2004 | Inui |
| 6,723,642 B1 | 4/2004 | Lim et al. |
| 6,730,614 B1 | 5/2004 | Lim et al. |
| 6,732,006 B2 | 5/2004 | Haanstra et al. |
| 6,734,090 B2 | 5/2004 | Agarwala et al. |
| 6,740,853 B1 | 5/2004 | Johnson et al. |
| 6,743,475 B2 | 6/2004 | Skarp et al. |
| 6,743,738 B2 | 6/2004 | Todd et al. |
| 6,745,095 B1 | 6/2004 | Ben-Dov |
| 6,753,507 B2 | 6/2004 | Fure et al. |
| 6,755,221 B2 | 6/2004 | Jeong et al. |
| 6,756,085 B2 | 6/2004 | Waldfried |
| 6,756,293 B2 | 6/2004 | Li et al. |
| 6,756,318 B2 | 6/2004 | Nguyen et al. |
| 6,759,098 B2 | 7/2004 | Han |
| 6,760,981 B2 | 7/2004 | Leap |
| 6,784,108 B1 | 8/2004 | Donohoe et al. |
| D497,977 S | 11/2004 | Engelbrektsson |
| 6,811,960 B2 | 11/2004 | Lee et al. |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,828,235 B2 | 12/2004 | Takano |
| 6,831,004 B2 | 12/2004 | Byun |
| 6,835,039 B2 | 12/2004 | Van Den Berg |
| 6,846,146 B2 | 1/2005 | Inui |
| 6,846,515 B2 | 1/2005 | Vrtis |
| 6,846,742 B2 | 1/2005 | Rossman |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,863,281 B2 | 3/2005 | Endou et al. |
| 6,864,041 B2 | 3/2005 | Brown |
| 6,872,258 B2 | 3/2005 | Park et al. |
| 6,872,259 B2 | 3/2005 | Strang |
| 6,874,247 B1 | 4/2005 | Hsu |
| 6,874,480 B1 | 4/2005 | Ismailov |
| 6,875,677 B1 | 4/2005 | Conley, Jr. et al. |
| 6,876,017 B2 | 4/2005 | Goodner |
| 6,878,402 B2 | 4/2005 | Chiang et al. |
| 6,884,066 B2 | 4/2005 | Nguyen et al. |
| 6,884,295 B2 | 4/2005 | Ishii |
| 6,884,319 B2 | 4/2005 | Kim |
| D505,590 S | 5/2005 | Greiner |
| 6,889,211 B1 | 5/2005 | Yoshiura et al. |
| 6,889,864 B2 | 5/2005 | Lindfors et al. |
| 6,895,158 B2 | 5/2005 | Alyward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,152 B2 | 7/2005 | Zuk |
| 6,913,796 B2 | 7/2005 | Albano et al. |
| 6,917,755 B2 | 7/2005 | Nguyen et al. |
| 6,924,078 B2 | 8/2005 | Lee et al. |
| 6,929,700 B2 | 8/2005 | Tan et al. |
| 6,930,041 B2 | 8/2005 | Agarwal |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,942,753 B2 | 9/2005 | Choi et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,055 B2 | 12/2005 | Sferlazzo |
| 6,972,478 B1 | 12/2005 | Waite et al. |
| 6,974,781 B2 | 12/2005 | Timmermans et al. |
| 6,975,921 B2 | 12/2005 | Verhaar |
| 6,976,822 B2 | 12/2005 | Woodruff |
| 6,981,832 B2 | 1/2006 | Zinger et al. |
| 6,982,046 B2 | 1/2006 | Srivastava et al. |
| 6,984,595 B1 | 1/2006 | Yamazaki |
| 6,985,788 B2 | 1/2006 | Haanstra et al. |
| 6,987,155 B2 | 1/2006 | Roh et al. |
| 6,990,430 B2 | 1/2006 | Hosek |
| 7,005,227 B2 | 2/2006 | Yueh et al. |
| 7,005,391 B2 | 2/2006 | Min |
| 7,010,580 B1 | 3/2006 | Fu et al. |
| 7,017,514 B1 | 3/2006 | Shepherd et al. |
| 7,018,941 B2 | 3/2006 | Cui et al. |
| 7,021,881 B2 | 4/2006 | Yamagishi |
| 7,036,453 B2 | 5/2006 | Ishikawa et al. |
| 7,041,609 B2 | 5/2006 | Vaartstra |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,062,161 B2 | 6/2006 | Kusuda et al. |
| 7,070,178 B2 | 7/2006 | Van Der Toorn et al. |
| 7,071,051 B1 | 7/2006 | Jeon et al. |
| 7,073,834 B2 | 7/2006 | Matsumoto et al. |
| 7,080,545 B2 | 7/2006 | Dimeo et al. |
| 7,084,060 B1 | 8/2006 | Furukawa |
| 7,084,079 B2 | 8/2006 | Conti et al. |
| 7,085,623 B2 | 8/2006 | Siegers |
| 7,088,003 B2 | 8/2006 | Gates et al. |
| 7,090,394 B2 | 8/2006 | Hashikura et al. |
| 7,092,287 B2 | 8/2006 | Beulens et al. |

(56) References Cited

U.S. PATENT DOCUMENTS

| | | |
|---|---|---|
| 7,098,149 B2 | 8/2006 | Lukas |
| 7,101,763 B1 | 9/2006 | Anderson et al. |
| 7,109,098 B1 | 9/2006 | Ramaswamy et al. |
| 7,109,114 B2 | 9/2006 | Chen et al. |
| 7,111,232 B1 | 9/2006 | Bascom |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,156,380 B2 | 1/2007 | Soininen |
| 7,163,393 B2 | 1/2007 | Adachi et al. |
| 7,163,721 B2 | 1/2007 | Zhang et al. |
| 7,163,900 B2 | 1/2007 | Weber |
| 7,168,852 B2 | 1/2007 | Linnarsson |
| 7,172,497 B2 | 2/2007 | Basol et al. |
| 7,186,648 B1 | 3/2007 | Rozbicki |
| 7,192,824 B2 | 3/2007 | Ahn et al. |
| 7,192,892 B2 | 3/2007 | Ahn et al. |
| 7,195,693 B2 | 3/2007 | Cowans |
| 7,201,943 B2 | 4/2007 | Park et al. |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,210,925 B2 | 5/2007 | Adachi |
| 7,211,524 B2 | 5/2007 | Ryu et al. |
| 7,211,525 B1 | 5/2007 | Shanker |
| 7,214,630 B1 | 5/2007 | Varadarajan et al. |
| 7,223,014 B2 | 5/2007 | Lojen |
| 7,208,413 B2 | 6/2007 | Byun et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,238,616 B2 | 7/2007 | Agarwal |
| 7,238,653 B2 | 7/2007 | Lee et al. |
| 7,265,061 B1 | 9/2007 | Cho et al. |
| 7,274,867 B2 | 9/2007 | Peukert |
| D553,104 S | 10/2007 | Oohashi et al. |
| 7,279,256 B2 | 10/2007 | Son |
| 7,290,813 B2 | 11/2007 | Bonora |
| 7,294,581 B2 | 11/2007 | Haverkort et al. |
| 7,296,460 B2 | 11/2007 | Dimeo et al. |
| 7,297,641 B2 | 11/2007 | Todd et al. |
| 7,298,009 B2 | 11/2007 | Yan et al. |
| D557,226 S | 12/2007 | Uchino et al. |
| 7,307,028 B2 | 12/2007 | Goto et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,320,544 B2 | 1/2008 | Hsieh |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,351,057 B2 | 4/2008 | Berenbak et al. |
| 7,354,847 B2 | 4/2008 | Chan et al. |
| 7,354,873 B2 | 4/2008 | Fukazawa et al. |
| 7,356,762 B2 | 4/2008 | van Driel |
| 7,357,138 B2 | 4/2008 | Ji et al. |
| 7,361,447 B2 | 4/2008 | Jung |
| 7,376,520 B2 | 5/2008 | Wong |
| 7,379,785 B2 | 5/2008 | Higashi et al. |
| 7,381,644 B1 | 6/2008 | Soubramonium et al. |
| 7,387,685 B2 | 6/2008 | Choi et al. |
| 7,393,207 B2 | 7/2008 | Imai |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,399,570 B2 | 7/2008 | Lee et al. |
| 7,402,534 B2 | 7/2008 | Mahajani |
| 7,405,166 B2 | 7/2008 | Liang et al. |
| 7,405,454 B2 | 7/2008 | Ahn et al. |
| D575,713 S | 8/2008 | Ratcliffe |
| 7,410,290 B2 | 8/2008 | Tanaka |
| 7,410,666 B2 | 8/2008 | Elers |
| 7,411,352 B2 | 8/2008 | Madocks |
| 7,414,281 B1 | 8/2008 | Fastow |
| D576,001 S | 9/2008 | Brunderman |
| 7,422,635 B2 | 9/2008 | Zheng et al. |
| 7,422,653 B2 | 9/2008 | Blahnik et al. |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,432,476 B2 | 10/2008 | Morita et al. |
| 7,437,060 B2 | 10/2008 | Wang et al. |
| 7,442,275 B2 | 10/2008 | Cowans |
| 7,467,632 B2 | 12/2008 | Lee et al. |
| 7,475,588 B2 | 1/2009 | Dimeo et al. |
| 7,476,291 B2 | 1/2009 | Wang et al. |
| 7,479,198 B2 | 1/2009 | Guffrey |
| 7,482,247 B1 | 1/2009 | Papasouliotis |
| 7,482,283 B2 | 1/2009 | Yamasaki et al. |
| D585,968 S | 2/2009 | Elkins et al. |
| 7,489,389 B2 | 2/2009 | Shibazaki et al. |
| 7,494,882 B2 | 2/2009 | Vitale |
| 7,497,614 B2 | 3/2009 | Gaff |
| 7,498,242 B2 | 3/2009 | Kumar et al. |
| 7,501,292 B2 | 3/2009 | Matsushita et al. |
| 7,501,355 B2 | 3/2009 | Bhatia et al. |
| 7,503,980 B2 | 3/2009 | Kida et al. |
| D590,933 S | 4/2009 | Vansell |
| 7,514,375 B1 | 4/2009 | Shanker et al. |
| D593,969 S | 6/2009 | Li |
| 7,541,297 B2 | 6/2009 | Mallick et al. |
| 7,547,363 B2 | 6/2009 | Tomiyasu et al. |
| 7,547,633 B2 | 6/2009 | Ranish et al. |
| 7,550,396 B2 | 6/2009 | Frohberg et al. |
| 7,561,982 B2 | 7/2009 | Rund et al. |
| 7,563,715 B2 | 7/2009 | Haukka et al. |
| 7,566,891 B2 | 7/2009 | Rocha-Alvarez et al. |
| 7,575,968 B2 | 8/2009 | Sadaka et al. |
| 7,579,285 B2 | 8/2009 | Zimmerman et al. |
| 7,579,785 B2 | 8/2009 | Shinmen et al. |
| D600,223 S | 9/2009 | Aggarwal |
| 7,582,555 B1 | 9/2009 | Lang |
| 7,582,575 B2 | 9/2009 | Fukazawa et al. |
| 7,589,003 B2 | 9/2009 | Kouvetakis et al. |
| 7,589,029 B2 | 9/2009 | Derderian et al. |
| 7,591,601 B2 | 9/2009 | Matsuoka et al. |
| D602,575 S | 10/2009 | Breda |
| 7,598,513 B2 | 10/2009 | Kouvetakis et al. |
| 7,601,223 B2 | 10/2009 | Lindfors et al. |
| 7,601,225 B2 | 10/2009 | Tuominen et al. |
| 7,601,652 B2 | 10/2009 | Singh et al. |
| 7,611,751 B2 | 11/2009 | Elers |
| 7,611,980 B2 | 11/2009 | Wells et al. |
| 7,618,226 B2 | 11/2009 | Takizawa |
| 7,621,672 B2 | 11/2009 | Ripley |
| 7,622,369 B1 | 11/2009 | Lee et al. |
| 7,622,378 B2 | 11/2009 | Liu et al. |
| 7,623,940 B2 | 11/2009 | Huskamp et al. |
| D606,952 S | 12/2009 | Lee |
| 7,625,820 B1 | 12/2009 | Papasouliotis |
| 7,629,277 B2 | 12/2009 | Ghatnagar |
| 7,632,549 B2 | 12/2009 | Goundar |
| 7,640,142 B2 | 12/2009 | Tachikawa et al. |
| 7,645,341 B2 | 1/2010 | Kennedy et al. |
| 7,645,484 B2 | 1/2010 | Ishizaka |
| 7,648,927 B2 | 1/2010 | Singh et al. |
| 7,651,269 B2 | 1/2010 | Comendant |
| 7,651,583 B2 | 1/2010 | Kent et al. |
| 7,651,955 B2 | 1/2010 | Ravish et al. |

(56) References Cited

U.S. PATENT DOCUMENTS

| | | |
|---|---|---|
| 7,651,959 B2 | 1/2010 | Fukazawa et al. |
| 7,651,961 B2 | 1/2010 | Clark |
| D609,652 S | 2/2010 | Nagasaka |
| D609,655 S | 2/2010 | Sugimoto |
| 7,661,299 B2 | 2/2010 | Kusunoki |
| 7,678,197 B2 | 3/2010 | Maki |
| 7,678,715 B2 | 3/2010 | Mungekar et al. |
| 7,682,454 B2 | 3/2010 | Sneh |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| D614,593 S | 4/2010 | Lee |
| 7,690,881 B2 | 4/2010 | Yamagishi |
| 7,691,205 B2 | 4/2010 | Ikedo |
| 7,692,171 B2 | 4/2010 | Kaszuba et al. |
| 7,695,808 B2 | 4/2010 | Tuma |
| 7,713,874 B2 | 5/2010 | Milligan |
| 7,716,993 B2 | 5/2010 | Ozawa et al. |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,736,437 B2 | 6/2010 | Cadwell et al. |
| 7,736,528 B2 | 6/2010 | Okita et al. |
| 7,740,705 B2 | 6/2010 | Li |
| 7,745,346 B2 | 6/2010 | Hausmann et al. |
| 7,748,760 B2 | 7/2010 | Kushida |
| 7,749,563 B2 | 7/2010 | Zheng et al. |
| 7,753,584 B2 | 7/2010 | Gambino et al. |
| 7,754,621 B2 | 7/2010 | Putjkonen |
| 7,763,869 B2 | 7/2010 | Matsushita et al. |
| 7,767,262 B2 | 8/2010 | Clark |
| 7,771,796 B2 | 8/2010 | Kohno et al. |
| 7,780,440 B2 | 8/2010 | Shibagaki et al. |
| 7,781,352 B2 | 8/2010 | Fukazawa et al. |
| 7,789,559 B2 | 9/2010 | Waser et al. |
| 7,789,965 B2 | 9/2010 | Matsushita et al. |
| 7,790,633 B1 | 9/2010 | Tarafdar et al. |
| 7,798,096 B2 | 9/2010 | Mahajani et al. |
| 7,803,722 B2 | 9/2010 | Liang |
| 7,806,587 B2 | 10/2010 | Kobayashi |
| 7,807,566 B2 | 10/2010 | Tsuji et al. |
| 7,807,578 B2 | 10/2010 | Bencher et al. |
| 7,816,278 B2 | 10/2010 | Reed et al. |
| 7,824,492 B2 | 11/2010 | Tois et al. |
| 7,825,040 B1 | 11/2010 | Fukazawa et al. |
| 7,829,460 B2 | 11/2010 | Streck et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,850,449 B2 | 12/2010 | Yang et al. |
| 7,851,019 B2 | 12/2010 | Tuominen et al. |
| 7,851,232 B2 | 12/2010 | van Schravendijk et al. |
| 7,858,519 B2 | 12/2010 | Liu et al. |
| 7,858,533 B2 | 12/2010 | Liu et al. |
| 7,865,070 B2 | 1/2011 | Nakamura |
| 7,871,198 B2 | 1/2011 | Rempe et al. |
| 7,874,726 B2 | 1/2011 | Jacobs et al. |
| 7,884,918 B2 | 2/2011 | Hattori |
| 7,888,233 B1 | 2/2011 | Gauri |
| D634,329 S | 3/2011 | Wastrom |
| D634,719 S | 3/2011 | Yasuda et al. |
| 7,897,215 B1 | 3/2011 | Fair et al. |
| 7,902,582 B2 | 3/2011 | Forbes et al. |
| 7,906,174 B1 | 3/2011 | Wu et al. |
| 7,910,288 B2 | 3/2011 | Abatchev et al. |
| 7,915,139 B1 | 3/2011 | Lang |
| 7,915,667 B2 | 3/2011 | Knoefler et al. |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,939,447 B2 | 5/2011 | Bauer et al. |
| 7,942,969 B2 | 5/2011 | Riker et al. |
| 7,946,762 B2 | 5/2011 | Yednak |
| 7,951,262 B2 | 5/2011 | Koshiishi et al. |
| 7,955,516 B2 | 6/2011 | Chandrachood |
| 7,955,650 B2 | 6/2011 | Tsuji |
| 7,957,708 B2 | 6/2011 | Karschnia et al. |
| 7,963,736 B2 | 6/2011 | Takizawa et al. |
| 7,967,913 B2 | 6/2011 | Hua et al. |
| 7,972,980 B2 | 7/2011 | Lee et al. |
| 7,977,256 B2 | 7/2011 | Liu et al. |
| 7,981,751 B2 | 7/2011 | Zhu et al. |
| D643,055 S | 8/2011 | Takahashi |
| 7,989,736 B2 | 8/2011 | Park et al. |
| 7,992,318 B2 | 8/2011 | Kawaji |
| 7,994,721 B2 | 8/2011 | Espiau et al. |
| 7,997,795 B2 | 8/2011 | Schwagerman et al. |
| 7,998,875 B2 | 8/2011 | Deyoung |
| 8,003,174 B2 | 8/2011 | Fukazawa |
| 8,003,919 B2 | 8/2011 | Goto et al. |
| 8,004,198 B2 | 8/2011 | Bakre et al. |
| 8,020,315 B2 | 9/2011 | Nishimura |
| 8,030,129 B2 | 10/2011 | Jeong |
| 8,033,771 B1 | 10/2011 | Gage et al. |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,043,972 B1 | 10/2011 | Liu et al. |
| 8,046,193 B2 | 10/2011 | Yetter et al. |
| 8,048,783 B2 | 11/2011 | Chung et al. |
| 8,055,378 B2 | 11/2011 | Numakura |
| 8,060,252 B2 | 11/2011 | Gage et al. |
| 8,083,853 B2 | 11/2011 | Choi et al. |
| D651,291 S | 12/2011 | Liebson et al. |
| 8,071,451 B2 | 12/2011 | Berry |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,076,250 B1 | 12/2011 | Rajagopalan |
| 8,076,251 B2 | 12/2011 | Akae et al. |
| 8,078,310 B2 | 12/2011 | Nishimoto et al. |
| 8,082,946 B2 | 12/2011 | Laverdiere et al. |
| 8,084,104 B2 | 12/2011 | Shinriki et al. |
| 8,084,372 B2 | 12/2011 | You et al. |
| D652,896 S | 1/2012 | Gether |
| 8,092,604 B2 | 1/2012 | Tomiyasu et al. |
| 8,100,583 B2 | 1/2012 | Aggarwal |
| D653,734 S | 2/2012 | Sisk |
| D654,884 S | 2/2012 | Honma |
| D655,055 S | 2/2012 | Toll |
| 8,110,099 B2 | 2/2012 | Hersey et al. |
| 8,114,734 B2 | 2/2012 | Yang et al. |
| 8,119,466 B2 | 2/2012 | Avouris |
| 8,129,290 B2 | 3/2012 | Balseanu et al. |
| 8,137,462 B2 | 3/2012 | Fondurulia et al. |
| 8,137,465 B1 | 3/2012 | Shrinivasan et al. |
| 8,138,104 B2 | 3/2012 | Balseanu et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,158,512 B2 | 4/2012 | Ji et al. |
| 8,172,947 B2 | 5/2012 | Shibata et al. |
| 8,173,554 B2 | 5/2012 | Lee et al. |
| 8,178,436 B2 * | 5/2012 | King ............... H01L 21/76807 257/506 |
| 8,187,679 B2 | 5/2012 | Dickey et al. |
| 8,187,951 B1 | 5/2012 | Wang |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,028 B1 | 8/2012 | van Schravendijk |
| 8,242,031 B2 | 8/2012 | Mallick et al. |
| 8,246,900 B2 | 8/2012 | Kasai et al. |

(56) References Cited

U.S. PATENT DOCUMENTS

| | | |
|---|---|---|
| 8,252,114 B2 | 8/2012 | Vukovic |
| 8,252,659 B2 | 8/2012 | Huyghabaert et al. |
| 8,252,691 B2 | 8/2012 | Beynet et al. |
| 8,267,633 B2 | 9/2012 | Obikane |
| 8,272,516 B2 | 9/2012 | Salvador |
| 8,278,176 B2 | 10/2012 | Bauer et al. |
| 8,282,769 B2 | 10/2012 | Iizuka |
| 8,282,847 B2 | 10/2012 | Romano |
| 8,287,648 B2 | 10/2012 | Reed et al. |
| 8,293,016 B2 | 10/2012 | Bahng et al. |
| 8,293,642 B2 | 10/2012 | Kim |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,328,939 B2 | 12/2012 | Choi et al. |
| 8,329,599 B2 | 12/2012 | Fukazawa et al. |
| 8,334,219 B2 | 12/2012 | Lee et al. |
| 8,349,083 B2 | 1/2013 | Takasuka et al. |
| D676,943 S | 2/2013 | Kluss |
| 8,367,528 B2 | 2/2013 | Bauer et al. |
| 8,372,204 B2 | 2/2013 | Nakamura |
| 8,378,464 B2 | 2/2013 | Kato et al. |
| 8,393,091 B2 | 3/2013 | Kawamoto |
| 8,394,466 B2 | 3/2013 | Hong et al. |
| 8,398,773 B2 | 3/2013 | Jdira et al. |
| 8,404,499 B2 | 3/2013 | Moffatt |
| 8,415,258 B2 | 4/2013 | Akae |
| 8,415,259 B2 | 4/2013 | Lee et al. |
| 8,440,259 B2 | 5/2013 | Chiang et al. |
| 8,444,120 B2 | 5/2013 | Gregg et al. |
| 8,445,075 B2 | 5/2013 | Xu et al. |
| 8,450,191 B2 | 5/2013 | Wang |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,492,170 B2 | 7/2013 | Xie et al. |
| 8,496,377 B2 | 7/2013 | Harr et al. |
| 8,496,756 B2 | 7/2013 | Cruse et al. |
| 8,497,213 B2 | 7/2013 | Yasui et al. |
| 8,501,599 B2 | 8/2013 | Ueno et al. |
| 8,506,162 B2 | 8/2013 | Schick et al. |
| 8,506,713 B2 | 8/2013 | Takagi |
| 8,529,701 B2 | 9/2013 | Morita |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,586,484 B2 | 11/2013 | Matsuyama et al. |
| 8,591,659 B1 | 11/2013 | Fang et al. |
| 8,592,005 B2 | 11/2013 | Ueda |
| D695,240 S | 12/2013 | Iida et al. |
| 8,608,885 B2 | 12/2013 | Goto et al. |
| 8,614,047 B2 | 12/2013 | Ayothi et al. |
| 8,616,765 B2 | 12/2013 | Darabnia et al. |
| 8,617,411 B2 | 12/2013 | Singh |
| 8,633,115 B2 | 1/2014 | Chang et al. |
| D698,904 S | 2/2014 | Milligan et al. |
| 8,642,488 B2 | 2/2014 | Liu et al. |
| 8,647,722 B2 | 2/2014 | Kobayashi et al. |
| 8,664,627 B1 | 3/2014 | Ishikawa et al. |
| 8,667,654 B2 | 3/2014 | Gros-Jean |
| 8,668,957 B2 | 3/2014 | Dussarrat et al. |
| 8,669,185 B2 | 3/2014 | Onizawa |
| 8,679,958 B2 | 3/2014 | Takamure et al. |
| D702,188 S | 4/2014 | Jacobs |
| 8,683,943 B2 | 4/2014 | Onodera et al. |
| 8,710,580 B2 | 4/2014 | Sakuma et al. |
| 8,711,338 B2 | 4/2014 | Liu et al. |
| D705,745 S | 5/2014 | Kurs et al. |
| D705,762 S | 5/2014 | Yu |
| 8,664,127 B2 | 5/2014 | Bhatia et al. |
| 8,720,965 B2 | 5/2014 | Hino et al. |
| 8,721,791 B2 | 5/2014 | Choi et al. |
| 8,722,510 B2 | 5/2014 | Watanabe et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,759,223 B2 | 6/2014 | Sapre et al. |
| 8,764,085 B2 | 7/2014 | Urabe |
| 8,779,502 B2 | 7/2014 | Sakuma et al. |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,785,311 B2 | 7/2014 | Miyoshi |
| 8,790,743 B1 | 7/2014 | Omari |
| 8,790,749 B2 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,841,182 B1 | 9/2014 | Chen et al. |
| 8,845,806 B2 | 9/2014 | Aida et al. |
| 8,846,502 B2 | 9/2014 | Haukka et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,882,923 B2 | 11/2014 | Saido et al. |
| 8,883,270 B2 | 11/2014 | Shero et al. |
| 8,901,016 B2 | 12/2014 | Jeongseok et al. |
| 8,911,553 B2 | 12/2014 | Baluja et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,927,906 B2 | 1/2015 | Tadokoro et al. |
| 8,933,375 B2 | 1/2015 | Dunn et al. |
| 8,940,646 B1 | 1/2015 | Chandrasekharan |
| D723,153 S | 2/2015 | Borkholder |
| 8,945,305 B2 | 2/2015 | Marsh |
| 8,945,306 B2 | 2/2015 | Tsuda |
| 8,945,339 B2 | 2/2015 | Kakimoto |
| 8,946,830 B2 | 2/2015 | Jung et al. |
| 8,956,971 B2 | 2/2015 | Huakka |
| 8,956,983 B2 | 2/2015 | Swaminathan |
| D723,330 S | 3/2015 | York |
| D724,553 S | 3/2015 | Choi |
| D724,701 S | 3/2015 | Yamagishi et al. |
| D725,168 S | 3/2015 | Yamagishi |
| 8,967,608 B2 | 3/2015 | Mitsumori et al. |
| 8,974,868 B2 | 3/2015 | Ishikawa et al. |
| 8,986,456 B2 | 3/2015 | Fondurulia et al. |
| 8,991,214 B2 | 3/2015 | Hoshino et al. |
| 8,991,887 B2 | 3/2015 | Shin et al. |
| 8,993,054 B2 | 3/2015 | Jung et al. |
| 8,993,457 B1 | 3/2015 | Ramkumar et al. |
| D726,365 S | 4/2015 | Weigensberg |
| D726,884 S | 4/2015 | Yamagishi et al. |
| 8,999,102 B2 | 4/2015 | Miyoshi et al. |
| 9,005,539 B2 | 4/2015 | Halpin et al. |
| 9,017,481 B1 | 4/2015 | Pettinger et al. |
| 9,017,933 B2 | 4/2015 | Liu et al. |
| 9,018,093 B2 | 4/2015 | Tsuji et al. |
| 9,018,111 B2 | 4/2015 | Milligan et al. |
| 9,018,567 B2 | 4/2015 | de Ridder et al. |
| 9,021,985 B2 | 5/2015 | Alokozai et al. |
| 9,023,737 B2 | 5/2015 | Beynet et al. |
| 9,023,738 B2 | 5/2015 | Kato et al. |
| 9,029,253 B2 | 5/2015 | Milligan et al. |
| 9,029,272 B1 | 5/2015 | Nakano |
| D732,145 S | 6/2015 | Yamagishi |
| D732,644 S | 6/2015 | Yamagishi et al. |
| D733,261 S | 6/2015 | Yamagishi et al. |
| D733,262 S | 7/2015 | Yamagishi et al. |
| D733,843 S | 7/2015 | Yamagishi |
| D734,377 S | 7/2015 | Hirakida |
| D735,836 S | 8/2015 | Yamagishi et al. |
| 9,096,931 B2 | 8/2015 | Yednak et al. |
| 9,099,505 B2 | 8/2015 | Kusakabe et al. |
| 9,117,657 B2 | 8/2015 | Nakano et al. |
| 9,117,866 B2 | 8/2015 | Marquardt et al. |
| D739,222 S | 9/2015 | Chadbourne |

(56) References Cited

U.S. PATENT DOCUMENTS

| | | |
|---|---|---|
| 9,123,510 B2 | 9/2015 | Nakano et al. |
| 9,123,577 B2 | 9/2015 | Fujimoto et al. |
| 9,129,897 B2 | 9/2015 | Pore et al. |
| 9,136,108 B2 | 9/2015 | Matsushita et al. |
| 9,136,180 B2 | 9/2015 | MacHkaoutsan |
| 9,142,393 B2 | 9/2015 | Okabe et al. |
| 9,142,437 B2 | 9/2015 | Fosnight et al. |
| 9,153,441 B2 | 10/2015 | Takamure et al. |
| 9,166,012 B2 | 10/2015 | Sim et al. |
| 9,169,975 B2 | 10/2015 | Sarin et al. |
| 9,171,714 B2 | 10/2015 | Mori |
| 9,171,716 B2 | 10/2015 | Fukuda |
| D742,202 S | 11/2015 | Cyphers et al. |
| D743,357 S | 11/2015 | Vyne |
| D743,513 S | 11/2015 | Yamagishi |
| 9,177,784 B2 | 11/2015 | Raisanen et al. |
| 9,184,047 B2 | 11/2015 | Liu et al. |
| 9,190,263 B2 | 11/2015 | Ishikawa et al. |
| 9,190,264 B2 | 11/2015 | Yuasa et al. |
| 9,196,483 B1 | 11/2015 | Lee et al. |
| 9,202,727 B2 | 12/2015 | Dunn et al. |
| 9,214,333 B1 | 12/2015 | Sims et al. |
| 9,228,259 B2 | 1/2016 | Haukka et al. |
| 9,240,412 B2 | 1/2016 | Xie et al. |
| 9,245,742 B2 | 1/2016 | Haukka |
| 9,252,024 B2 | 2/2016 | Lam et al. |
| 9,257,274 B2 | 2/2016 | Kang et al. |
| 9,267,850 B2 | 2/2016 | Aggarwal |
| 9,281,277 B2 | 3/2016 | Baek et al. |
| 9,284,642 B2 | 3/2016 | Nakano |
| 9,297,705 B2 | 3/2016 | Aggarwal |
| 9,299,557 B2 | 3/2016 | Tolle et al. |
| 9,299,595 B2 | 3/2016 | Dunn et al. |
| D753,269 S | 4/2016 | Yamagishi et al. |
| D753,629 S | 4/2016 | Plattard |
| 9,305,836 B1 | 4/2016 | Gates et al. |
| 9,312,155 B2 | 4/2016 | Mori |
| 9,315,897 B2 | 4/2016 | Byun |
| 9,324,811 B2 | 4/2016 | Weeks |
| 9,324,846 B1 | 4/2016 | Camillo |
| 9,341,296 B2 | 5/2016 | Yednak |
| 9,343,297 B1 | 5/2016 | Fukazawa et al. |
| 9,343,308 B2 | 5/2016 | Isii |
| 9,343,343 B2 | 5/2016 | Mori |
| 9,343,350 B2 | 5/2016 | Arai |
| 9,349,620 B2 | 5/2016 | Kamata et al. |
| 9,353,441 B2 | 5/2016 | Chung |
| 9,365,924 B2 | 6/2016 | Nonaka |
| 9,368,352 B2 | 6/2016 | Takamure et al. |
| 9,370,863 B2 | 6/2016 | Tsuji et al. |
| 9,384,987 B2 | 7/2016 | Jung et al. |
| 9,390,909 B2 | 7/2016 | Pasquale et al. |
| 9,394,608 B2 | 7/2016 | Shero et al. |
| 9,396,934 B2 | 7/2016 | Tolle |
| 9,396,956 B1 | 7/2016 | Fukazawa |
| 9,404,587 B2 | 8/2016 | Shugrue |
| 9,412,564 B2 | 8/2016 | Milligan |
| 9,412,582 B2 | 8/2016 | Sasaki et al. |
| 9,443,725 B2 | 9/2016 | Liu et al. |
| 9,447,498 B2 | 9/2016 | Shiba et al. |
| 9,449,793 B2 | 9/2016 | Shaji et al. |
| 9,455,138 B1 | 9/2016 | Fukazawa |
| 9,464,352 B2 | 10/2016 | Nakano et al. |
| 9,478,414 B2 | 10/2016 | Kobayashi et al. |
| 9,478,415 B2 | 10/2016 | Kimura |
| D770,993 S | 11/2016 | Yoshida et al. |
| 9,484,191 B2 | 11/2016 | Winkler |
| 9,514,927 B2 | 12/2016 | Tolle et al. |
| 9,514,932 B2 | 12/2016 | Mallick et al. |
| 9,543,180 B2 | 1/2017 | Kamiya |
| 9,556,516 B2 | 1/2017 | Takamure |
| 9,558,931 B2 | 1/2017 | Tang |
| 9,564,314 B2 | 2/2017 | Takamure et al. |
| 9,574,268 B1 | 2/2017 | Dunn et al. |
| 9,589,770 B2 | 3/2017 | Winkler |
| 9,605,342 B2 | 3/2017 | Alokozai et al. |
| 9,605,343 B2 | 3/2017 | Winkler |
| 9,607,837 B1 | 3/2017 | Namba |
| D783,351 S | 4/2017 | Fujino et al. |
| 9,613,801 B2 | 4/2017 | Carcasi et al. |
| 9,627,221 B1 | 4/2017 | Zaitsu et al. |
| D785,766 S | 5/2017 | Sato |
| D787,458 S | 5/2017 | Kim et al. |
| 9,640,416 B2 | 5/2017 | Arai |
| 9,640,448 B2 | 5/2017 | Ikegawa et al. |
| 9,647,114 B2 | 5/2017 | Margetis |
| 9,657,845 B2 | 5/2017 | Shugrue |
| 9,659,799 B2 | 5/2017 | Lawson |
| 9,663,857 B2 | 5/2017 | Nakano et al. |
| D789,888 S | 6/2017 | Jang et al. |
| 9,685,320 B2 | 6/2017 | Kang et al. |
| 9,691,771 B2 | 6/2017 | Lansalot-Matras |
| 9,698,031 B2 | 7/2017 | Kobayashi et al. |
| 9,708,707 B2 | 7/2017 | Ditizio et al. |
| 9,708,708 B2 | 7/2017 | Isobe et al. |
| 9,711,345 B2 | 7/2017 | Shiba et al. |
| D793,352 S | 8/2017 | Hill |
| D793,572 S | 8/2017 | Kozuka et al. |
| 9,735,024 B2 | 8/2017 | Zaitsu |
| 9,741,559 B2 | 8/2017 | Shimura et al. |
| 9,748,145 B1 | 8/2017 | Kannan et al. |
| D796,458 S | 9/2017 | Jang et al. |
| 9,754,779 B1 | 9/2017 | Ishikawa |
| 9,754,818 B2 * | 9/2017 | Shiu ............... H01L 21/76811 |
| 9,759,489 B2 | 9/2017 | Kaneko |
| 9,790,595 B2 | 10/2017 | Jung et al. |
| 9,793,115 B2 | 10/2017 | Tolle |
| 9,793,135 B1 | 10/2017 | Zaitsu et al. |
| 9,793,148 B2 | 10/2017 | Yamagishi et al. |
| D802,546 S | 11/2017 | Jang et al. |
| 9,808,246 B2 | 11/2017 | Shelton et al. |
| 9,812,319 B1 | 11/2017 | Fukazawa et al. |
| 9,812,320 B1 | 11/2017 | Pore et al. |
| 9,859,151 B1 | 1/2018 | Niskanen |
| 9,887,082 B1 | 2/2018 | Pore et al. |
| 9,890,456 B2 | 2/2018 | Tolle et al. |
| 9,891,521 B2 | 2/2018 | Kang et al. |
| 9,892,908 B2 | 2/2018 | Pettinger et al. |
| 9,892,913 B2 | 2/2018 | Margetis et al. |
| 9,899,291 B2 | 2/2018 | Kato |
| 9,899,405 B2 | 2/2018 | Kim |
| 9,905,420 B2 | 2/2018 | Margetis et al. |
| 9,909,492 B2 | 2/2018 | Tang |
| 9,909,214 B2 | 3/2018 | Suemori |
| 9,911,676 B2 | 3/2018 | Tang |
| 9,916,980 B1 | 3/2018 | Knaepen |
| 9,929,011 B2 | 3/2018 | Hawryluk et al. |
| 9,960,072 B2 | 5/2018 | Coomer |
| 9,984,869 B1 | 5/2018 | Blanquart |
| 10,032,628 B2 | 6/2018 | Xie et al. |
| 10,023,960 B2 | 7/2018 | Alokozai |
| 10,032,792 B2 | 7/2018 | Kim et al. |
| 10,043,661 B2 | 8/2018 | Kato et al. |
| 10,083,836 B2 | 9/2018 | Milligan |
| 10,087,522 B2 | 10/2018 | Raisanen et al. |
| 10,087,525 B2 | 10/2018 | Schmotzer et al. |
| 10,090,316 B2 | 10/2018 | Ootsuka |
| 10,103,040 B1 | 10/2018 | Oosterlaken et al. |
| 2001/0001953 A1 | 5/2001 | Griffiths et al. |
| 2001/0003191 A1 | 6/2001 | Kovacs et al. |
| 2001/0006070 A1 | 7/2001 | Shang |
| 2001/0007645 A1 | 7/2001 | Honma |
| 2001/0014514 A1 | 8/2001 | Geusic |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0020715 A1 | 9/2001 | Yamasaki |
| 2001/0028924 A1 | 10/2001 | Sherman |
| 2001/0031535 A1 | 10/2001 | Agnello et al. |
| 2001/0038783 A1 | 11/2001 | Nakashima et al. |
| 2001/0040511 A1 | 11/2001 | Bushner et al. |
| 2001/0046765 A1 | 11/2001 | Cappellani et al. |
| 2001/0049080 A1 | 12/2001 | Asano |

(56) References Cited

U.S. PATENT DOCUMENTS

| | | |
|---|---|---|
| 2001/0049202 A1 | 12/2001 | Maeda et al. |
| 2002/0001974 A1 | 1/2002 | Chan |
| 2002/0001976 A1 | 1/2002 | Danek |
| 2002/0005400 A1 | 1/2002 | Gat et al. |
| 2002/0009119 A1 | 1/2002 | Matthew et al. |
| 2002/0011210 A1 | 1/2002 | Satoh et al. |
| 2002/0011211 A1 | 1/2002 | Halpin |
| 2002/0013792 A1 | 1/2002 | Imielinski et al. |
| 2002/0014204 A1 | 2/2002 | Pyo |
| 2002/0014483 A1 | 2/2002 | Suzuki et al. |
| 2002/0016829 A1 | 2/2002 | Defosse |
| 2002/0023677 A1 | 2/2002 | Zheng |
| 2002/0031644 A1 | 3/2002 | Malofsky et al. |
| 2002/0041931 A1 | 4/2002 | Suntola et al. |
| 2002/0043337 A1 | 4/2002 | Goodman et al. |
| 2002/0081826 A1 | 4/2002 | Rotondaro et al. |
| 2002/0064592 A1 | 5/2002 | Datta et al. |
| 2002/0064598 A1 | 5/2002 | Wang et al. |
| 2002/0069222 A1 | 6/2002 | McNeely |
| 2002/0076507 A1 | 6/2002 | Chiang et al. |
| 2002/0078893 A1 | 6/2002 | Van Os et al. |
| 2002/0079714 A1 | 6/2002 | Soucy et al. |
| 2002/0088542 A1 | 7/2002 | Nishikawa et al. |
| 2002/0096211 A1 | 7/2002 | Zheng |
| 2002/0098627 A1 | 7/2002 | Pomarede et al. |
| 2002/0108670 A1 | 8/2002 | Baker et al. |
| 2002/0109115 A1 | 8/2002 | Cederstav et al. |
| 2002/0110695 A1 | 8/2002 | Yang et al. |
| 2002/0110991 A1 | 8/2002 | Li |
| 2002/0112114 A1 | 8/2002 | Blair et al. |
| 2002/0114886 A1 | 8/2002 | Chou et al. |
| 2002/0115252 A1 | 8/2002 | Haukka et al. |
| 2002/0124883 A1 | 9/2002 | Zheng |
| 2002/0127350 A1 | 9/2002 | Ishikawa et al. |
| 2002/0134511 A1 | 9/2002 | Ushioda et al. |
| 2002/0136214 A1 | 9/2002 | Do et al. |
| 2002/0136909 A1 | 9/2002 | Yang |
| 2002/0139775 A1 | 10/2002 | Chang |
| 2002/0146512 A1 | 10/2002 | Rossman |
| 2002/0151327 A1 | 10/2002 | Levitt |
| 2002/0152244 A1 | 10/2002 | Dean et al. |
| 2002/0155219 A1 | 10/2002 | Wang et al. |
| 2002/0164420 A1 | 11/2002 | Derderian et al. |
| 2002/0172768 A1 | 11/2002 | Endo et al. |
| 2002/0174106 A1 | 11/2002 | Martin |
| 2002/0179011 A1 | 12/2002 | Jonnalagadda et al. |
| 2002/0184111 A1 | 12/2002 | Swanson |
| 2002/0187650 A1 | 12/2002 | Blalock et al. |
| 2002/0187656 A1 | 12/2002 | Tan et al. |
| 2002/0197849 A1 | 12/2002 | Mandal |
| 2003/0002562 A1 | 1/2003 | Yerlikaya et al. |
| 2003/0003607 A1 | 1/2003 | Kagoshima |
| 2003/0003635 A1 | 1/2003 | Paranjpe et al. |
| 2003/0003696 A1 | 1/2003 | Gelatos et al. |
| 2003/0010451 A1 | 1/2003 | Tzu |
| 2003/0010452 A1 | 1/2003 | Park et al. |
| 2003/0012632 A1 | 1/2003 | Saeki |
| 2003/0015294 A1 | 1/2003 | Wang |
| 2003/0015596 A1 | 1/2003 | Evans |
| 2003/0017268 A1 | 1/2003 | Hu |
| 2003/0019428 A1 | 1/2003 | Ku et al. |
| 2003/0019580 A1 | 1/2003 | Strang |
| 2003/0022523 A1 | 1/2003 | Irino et al. |
| 2003/0023338 A1 | 1/2003 | Chin et al. |
| 2003/0024901 A1 | 2/2003 | Ishikawa |
| 2003/0025146 A1 | 2/2003 | Narwankar et al. |
| 2003/0029303 A1 | 2/2003 | Hasegawa et al. |
| 2003/0029381 A1 | 2/2003 | Nishibayashi |
| 2003/0029475 A1 | 2/2003 | Hua et al. |
| 2003/0035002 A1 | 2/2003 | Moles |
| 2003/0036272 A1 | 2/2003 | Shamouilian et al. |
| 2003/0038371 A1 | 2/2003 | Hsue |
| 2003/0040158 A1 | 2/2003 | Saitoh |
| 2003/0040841 A1 | 2/2003 | Nasr et al. |
| 2003/0042419 A1 | 3/2003 | Katsumata et al. |
| 2003/0049372 A1 | 3/2003 | Cook et al. |
| 2003/0049375 A1 | 3/2003 | Nguyen et al. |
| 2003/0049937 A1 | 3/2003 | Suzuki |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0065413 A1 | 4/2003 | Liteplo et al. |
| 2003/0066826 A1 | 4/2003 | Lee et al. |
| 2003/0071015 A1 | 4/2003 | Chinn et al. |
| 2003/0075925 A1 | 4/2003 | Lindfors et al. |
| 2003/0082296 A1 | 5/2003 | Elers et al. |
| 2003/0082307 A1 | 5/2003 | Chung et al. |
| 2003/0091938 A1 | 5/2003 | Fairbairn et al. |
| 2003/0094133 A1 | 5/2003 | Yoshidome et al. |
| 2003/0109107 A1 | 6/2003 | Hsieh et al. |
| 2003/0109951 A1 | 6/2003 | Hsiung et al. |
| 2003/0111963 A1 | 6/2003 | Tolmachev et al. |
| 2003/0116087 A1 | 6/2003 | Nguyen |
| 2003/0168750 A1 | 6/2003 | Basceri et al. |
| 2003/0121608 A1 | 7/2003 | Chen |
| 2003/0133854 A1 | 7/2003 | Tabata et al. |
| 2003/0134038 A1 | 7/2003 | Paranjpe |
| 2003/0141820 A1 | 7/2003 | White et al. |
| 2003/0143328 A1 | 7/2003 | Chen |
| 2003/0157436 A1 | 8/2003 | Manger et al. |
| 2003/0159656 A1 | 8/2003 | Tan |
| 2003/0168001 A1 | 9/2003 | Sneh |
| 2003/0168699 A1 | 9/2003 | Honda |
| 2003/0170583 A1 | 9/2003 | Nakashima |
| 2003/0173490 A1 | 9/2003 | Lappen |
| 2003/0180458 A1 | 9/2003 | Sneh |
| 2003/0183156 A1 | 10/2003 | Dando |
| 2003/0183856 A1 | 10/2003 | Wieczorek et al. |
| 2003/0188685 A1 | 10/2003 | Wang |
| 2003/0192875 A1 | 10/2003 | Bieker et al. |
| 2003/0198587 A1 | 10/2003 | Kaloyeros |
| 2003/0201541 A1 | 10/2003 | Kim |
| 2003/0209323 A1 | 11/2003 | Yokogaki |
| 2003/0209326 A1 | 11/2003 | Lee et al. |
| 2003/0211735 A1 | 11/2003 | Rossman |
| 2003/0217915 A1 | 11/2003 | Ouellet |
| 2003/0219972 A1 | 11/2003 | Green |
| 2003/0226840 A1 | 12/2003 | Dalton |
| 2003/0228772 A1 | 12/2003 | Cowans |
| 2003/0231698 A1 | 12/2003 | Yamaguchi |
| 2003/0232138 A1 | 12/2003 | Tuominen et al. |
| 2003/0232491 A1 | 12/2003 | Yamaguchi |
| 2004/0002224 A1 | 1/2004 | Chono et al. |
| 2004/0009307 A1 | 1/2004 | Koh et al. |
| 2004/0009679 A1 | 1/2004 | Yeo et al. |
| 2004/0010772 A1 | 1/2004 | McKenna et al. |
| 2004/0013577 A1 | 1/2004 | Ganguli et al. |
| 2004/0013818 A1 | 1/2004 | Moon et al. |
| 2004/0016637 A1 | 1/2004 | Yang |
| 2004/0018304 A1 | 1/2004 | Chung et al. |
| 2004/0018307 A1 | 1/2004 | Park et al. |
| 2004/0018723 A1 | 1/2004 | Byun et al. |
| 2004/0018750 A1 | 1/2004 | Sophie et al. |
| 2004/0023516 A1 | 2/2004 | Londergan et al. |
| 2004/0026372 A1 | 2/2004 | Takenaka et al. |
| 2004/0029052 A1 | 2/2004 | Park et al. |
| 2004/0036129 A1 | 2/2004 | Forbes et al. |
| 2004/0037675 A1 | 2/2004 | Zinger et al. |
| 2004/0048439 A1 | 3/2004 | Soman |
| 2004/0048492 A1 | 3/2004 | Ishikawa et al. |
| 2004/0050325 A1 | 3/2004 | Samoilov |
| 2004/0062081 A1 | 4/2004 | Drewes |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0087141 A1 | 5/2004 | Ramanathan et al. |
| 2004/0094402 A1 | 5/2004 | Gopalraja |
| 2004/0099213 A1 | 5/2004 | Adomaitis et al. |
| 2004/0101622 A1 | 5/2004 | Park et al. |
| 2004/0103914 A1 | 6/2004 | Cheng et al. |
| 2004/0106249 A1 | 6/2004 | Huotari |

(56) References Cited

U.S. PATENT DOCUMENTS

| | | |
|---|---|---|
| 2004/0124131 A1 | 7/2004 | Aitchison |
| 2004/0124549 A1 | 7/2004 | Curran |
| 2004/0126990 A1 | 7/2004 | Ohta |
| 2004/0129211 A1 | 7/2004 | Blonigan et al. |
| 2004/0129671 A1 | 7/2004 | Ji et al. |
| 2004/0134429 A1 | 7/2004 | Yamanaka |
| 2004/0144311 A1 | 7/2004 | Chen |
| 2004/0144980 A1 | 7/2004 | Ahn et al. |
| 2004/0146644 A1 | 7/2004 | Xia et al. |
| 2004/0151844 A1 | 8/2004 | Zhang et al. |
| 2004/0151845 A1 | 8/2004 | Nguyen et al. |
| 2004/0152287 A1 | 8/2004 | Sherrill et al. |
| 2004/0159343 A1 | 8/2004 | Shimbara et al. |
| 2004/0168627 A1 | 9/2004 | Conley et al. |
| 2004/0169032 A1 | 9/2004 | Murayama et al. |
| 2004/0187777 A1 | 9/2004 | Okamoto et al. |
| 2004/0187790 A1 | 9/2004 | Bader |
| 2004/0187928 A1 | 9/2004 | Ambrosina |
| 2004/0198069 A1 | 10/2004 | Metzner et al. |
| 2004/0200499 A1 | 10/2004 | Harvey et al. |
| 2004/0203251 A1 | 10/2004 | Kawaguchi et al. |
| 2004/0206305 A1 | 10/2004 | Choi et al. |
| 2004/0209477 A1 | 10/2004 | Buxbaum et al. |
| 2004/0211357 A1 | 10/2004 | Gadgil |
| 2004/0212947 A1 | 10/2004 | Nguyen |
| 2004/0213921 A1 | 10/2004 | Leu |
| 2004/0214399 A1 | 10/2004 | Ahn et al. |
| 2004/0214445 A1 | 10/2004 | Shimizu et al. |
| 2004/0217217 A1 | 11/2004 | Han et al. |
| 2004/0219793 A1 | 11/2004 | Hishiya et al. |
| 2004/0221807 A1 | 11/2004 | Verghese et al. |
| 2004/0231600 A1 | 11/2004 | Lee |
| 2004/0238523 A1 | 12/2004 | Kuibira et al. |
| 2004/0241998 A1 | 12/2004 | Hanson |
| 2004/0247779 A1 | 12/2004 | Selvamanickam et al. |
| 2004/0250600 A1 | 12/2004 | Bevers et al. |
| 2004/0253867 A1 | 12/2004 | Matsumoto |
| 2004/0261712 A1 | 12/2004 | Hayashi et al. |
| 2004/0266011 A1 | 12/2004 | Lee et al. |
| 2005/0000428 A1 | 1/2005 | Shero et al. |
| 2005/0003662 A1 | 1/2005 | Jurisch et al. |
| 2005/0008799 A1 | 1/2005 | Tomiyasu et al. |
| 2005/0019026 A1 | 1/2005 | Wang et al. |
| 2005/0019494 A1 | 1/2005 | Moghadam et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0037610 A1 | 2/2005 | Cha |
| 2005/0042778 A1 | 2/2005 | Peukert |
| 2005/0048797 A1 | 3/2005 | Fukazawa |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092247 A1 | 5/2005 | Schmidt |
| 2005/0092249 A1 | 5/2005 | Kilpela et al. |
| 2005/0092733 A1 | 5/2005 | Ito et al. |
| 2005/0095770 A1 | 5/2005 | Kumagai et al. |
| 2005/0098107 A1 | 5/2005 | Du Bois et al. |
| 2005/0100669 A1 | 5/2005 | Kools et al. |
| 2005/0101154 A1 | 5/2005 | Huang |
| 2005/0101843 A1 | 5/2005 | Quinn et al. |
| 2005/0106893 A1 | 5/2005 | Wilk |
| 2005/0110069 A1 | 5/2005 | Kil et al. |
| 2005/0118804 A1 | 6/2005 | Byun et al. |
| 2005/0118837 A1 | 6/2005 | Todd |
| 2005/0120805 A1 | 6/2005 | Lane |
| 2005/0120962 A1 | 6/2005 | Ushioda et al. |
| 2005/0123690 A1 | 6/2005 | Derderian et al. |
| 2005/0130427 A1 | 6/2005 | Seok-Jun |
| 2005/0132957 A1 | 6/2005 | El-Raghy |
| 2005/0133161 A1 | 6/2005 | Carpenter et al. |
| 2005/0141591 A1 | 6/2005 | Sakano |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0172895 A1 | 8/2005 | Kijima et al. |
| 2005/0173003 A1 | 8/2005 | Laverdiere et al. |
| 2005/0175789 A1 | 8/2005 | Helms |
| 2005/0181535 A1 | 8/2005 | Yun et al. |
| 2005/0181555 A1 | 8/2005 | Haukka et al. |
| 2005/0187647 A1 | 8/2005 | Wang et al. |
| 2005/0191828 A1 | 9/2005 | Al-Bayati et al. |
| 2005/0199013 A1 | 9/2005 | Vandroux et al. |
| 2005/0208718 A1 | 9/2005 | Lim et al. |
| 2005/0211167 A1 | 9/2005 | Gunji |
| 2005/0212119 A1 | 9/2005 | Shero |
| 2005/0214457 A1 | 9/2005 | Schmitt et al. |
| 2005/0214458 A1 | 9/2005 | Meiere |
| 2005/0208778 A1 | 10/2005 | Li |
| 2005/0218462 A1 | 10/2005 | Ahn et al. |
| 2005/0221618 A1 | 10/2005 | AmRhein et al. |
| 2005/0223982 A1 | 10/2005 | Park et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229849 A1 | 10/2005 | Silvetti et al. |
| 2005/0229972 A1 | 10/2005 | Hoshi et al. |
| 2005/0233477 A1 | 10/2005 | Yamazaki et al. |
| 2005/0241176 A1 | 11/2005 | Shero et al. |
| 2005/0241763 A1 | 11/2005 | Huang et al. |
| 2005/0245058 A1 | 11/2005 | Lee et al. |
| 2005/0249876 A1 | 11/2005 | Kawahara et al. |
| 2005/0250340 A1 | 11/2005 | Chen et al. |
| 2005/0251990 A1 | 11/2005 | Choi |
| 2005/0252449 A1 | 11/2005 | Nguyen et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263072 A1 | 12/2005 | Balasubramanian et al. |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0277271 A1 | 12/2005 | Beintner |
| 2005/0282101 A1 | 12/2005 | Adachi |
| 2005/0285097 A1 | 12/2005 | Shang et al. |
| 2005/0287725 A1 | 12/2005 | Kitagawa |
| 2005/0287771 A1 | 12/2005 | Seamons et al. |
| 2006/0000411 A1 | 1/2006 | Seo |
| 2006/0013674 A1 | 1/2006 | Elliott et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021572 A1 | 2/2006 | Wolden |
| 2006/0021703 A1 | 2/2006 | Umotoy et al. |
| 2006/0024439 A2 | 2/2006 | Tuominen et al. |
| 2006/0026314 A1 | 2/2006 | Franchuk et al. |
| 2006/0040054 A1 | 2/2006 | Pearlstein et al. |
| 2006/0040508 A1 | 2/2006 | Ji |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0057828 A1 | 3/2006 | Omura |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068104 A1 | 3/2006 | Ishizaka |
| 2006/0068121 A1 | 3/2006 | Lee et al. |
| 2006/0068125 A1 | 3/2006 | Radhakrishnan |
| 2006/0087638 A1 | 4/2006 | Hirayanagi |
| 2006/0096540 A1 | 5/2006 | Choi |

(56) References Cited

U.S. PATENT DOCUMENTS

| | | |
|---|---|---|
| 2006/0099782 A1 | 5/2006 | Ritenour |
| 2006/0105566 A1 | 5/2006 | Waldfried et al. |
| 2006/0107898 A1 | 5/2006 | Blomberg |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128142 A1 | 6/2006 | Whelan et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0154424 A1 | 7/2006 | Yang et al. |
| 2006/0156981 A1 | 7/2006 | Fondurulia |
| 2006/0163612 A1 | 7/2006 | Kouvetakis et al. |
| 2006/0166428 A1 | 7/2006 | Kamioka |
| 2006/0172531 A1 | 8/2006 | Lin et al. |
| 2006/0175669 A1 | 8/2006 | Kim et al. |
| 2006/0177855 A1 | 8/2006 | Utermohlen |
| 2006/0182885 A1 | 8/2006 | Lei et al. |
| 2006/0188360 A1 | 8/2006 | Bonora et al. |
| 2006/0191555 A1 | 8/2006 | Yoshida et al. |
| 2006/0193979 A1 | 8/2006 | Meiere et al. |
| 2006/0196420 A1 | 9/2006 | Ushakov et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0211243 A1 | 9/2006 | Ishizaka et al. |
| 2006/0211259 A1 | 9/2006 | Maes |
| 2006/0213439 A1 | 9/2006 | Ishizaka |
| 2006/0216942 A1 | 9/2006 | Kim et al. |
| 2006/0219169 A1 | 10/2006 | Chen et al. |
| 2006/0223301 A1 | 10/2006 | Vanhaelemeersch et al. |
| 2006/0226117 A1 | 10/2006 | Bertram et al. |
| 2006/0228496 A1 | 10/2006 | Choi |
| 2006/0228863 A1 | 10/2006 | Zhang et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0249253 A1 | 11/2006 | Dando |
| 2006/0251827 A1 | 11/2006 | Nowak |
| 2006/0252228 A1 | 11/2006 | Jeng |
| 2006/0252351 A1 | 11/2006 | Kundracik |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0263522 A1 | 11/2006 | Byun |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269690 A1 | 11/2006 | Watanabe et al. |
| 2006/0269692 A1 | 11/2006 | Balseanu |
| 2006/0275933 A1 | 12/2006 | Du Bois et al. |
| 2006/0278524 A1 | 12/2006 | Stowell |
| 2006/0283629 A1 | 12/2006 | Kikuchi et al. |
| 2006/0286774 A1 | 12/2006 | Singh et al. |
| 2006/0286775 A1 | 12/2006 | Singh et al. |
| 2006/0286818 A1 | 12/2006 | Wang et al. |
| 2006/0286819 A1 | 12/2006 | Seutter |
| 2006/0291982 A1 | 12/2006 | Tanaka |
| 2007/0006806 A1 | 1/2007 | Imai |
| 2007/0010072 A1 | 1/2007 | Bailey et al. |
| 2007/0012402 A1 | 1/2007 | Sneh |
| 2007/0020830 A1 | 1/2007 | Speranza |
| 2007/0020953 A1 | 1/2007 | Tsai et al. |
| 2007/0022954 A1 | 2/2007 | Iizuka et al. |
| 2007/0026148 A1 | 2/2007 | Arai et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0034477 A1 | 2/2007 | Inui |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0056843 A1 | 3/2007 | Ye et al. |
| 2007/0056850 A1 | 3/2007 | Ye et al. |
| 2007/0059948 A1 | 3/2007 | Metzner et al. |
| 2007/0062439 A1 | 3/2007 | Wada et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0066079 A1 | 3/2007 | Kolster et al. |
| 2007/0066084 A1 | 3/2007 | Wajda et al. |
| 2007/0077355 A1 | 4/2007 | Chacin et al. |
| 2007/0082132 A1 | 4/2007 | Shinriki |
| 2007/0082500 A1 | 4/2007 | Norman et al. |
| 2007/0084405 A1 | 4/2007 | Kim |
| 2007/0087579 A1 | 4/2007 | Kitayama et al. |
| 2007/0089670 A1 | 4/2007 | Ikedo |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111470 A1 | 5/2007 | Smythe |
| 2007/0111545 A1 | 5/2007 | Lee et al. |
| 2007/0116873 A1 | 5/2007 | Li et al. |
| 2007/0116888 A1 | 5/2007 | Faguet |
| 2007/0119370 A1 | 5/2007 | Ma et al. |
| 2007/0123037 A1 | 5/2007 | Lee et al. |
| 2007/0123189 A1 | 5/2007 | Saito et al. |
| 2007/0125762 A1 | 6/2007 | Cui et al. |
| 2007/0128538 A1 | 6/2007 | Fairbairn et al. |
| 2007/0128876 A1 | 6/2007 | Fukiage |
| 2007/0128888 A1 | 6/2007 | Goto et al. |
| 2007/0129621 A1 | 6/2007 | Kellogg et al. |
| 2007/0134942 A1 | 6/2007 | Ahn et al. |
| 2007/0137794 A1 | 6/2007 | Qiu et al. |
| 2007/0146621 A1 | 6/2007 | Yeom |
| 2007/0148350 A1 | 6/2007 | Rahtu |
| 2007/0148990 A1 | 6/2007 | Deboer et al. |
| 2007/0155138 A1 | 7/2007 | Tomasini et al. |
| 2007/0157466 A1 | 7/2007 | Kida et al. |
| 2007/0158026 A1 | 7/2007 | Amikura |
| 2007/0163440 A1 | 7/2007 | Kim et al. |
| 2007/0163625 A1 | 7/2007 | Lee |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0178235 A1 | 8/2007 | Yamada et al. |
| 2007/0186952 A1 | 8/2007 | Honda et al. |
| 2007/0187363 A1 | 8/2007 | Oka et al. |
| 2007/0202678 A1 | 8/2007 | Plombon et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0237698 A1 | 10/2007 | Clark |
| 2007/0237699 A1 | 10/2007 | Clark |
| 2007/0241688 A1 | 10/2007 | De Vancentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0251456 A1 | 11/2007 | Herchen et al. |
| 2007/0252244 A1 | 11/2007 | Srividya et al. |
| 2007/0252532 A1 | 11/2007 | De Vancentis et al. |
| 2007/0258506 A1 | 11/2007 | Schwagerman et al. |
| 2007/0264807 A1 | 11/2007 | Leone et al. |
| 2007/0266945 A1 | 11/2007 | Shuto et al. |

(56) References Cited

U.S. PATENT DOCUMENTS

| | | |
|---|---|---|
| 2007/0269983 A1 | 11/2007 | Sneh |
| 2007/0275166 A1 | 11/2007 | Thridandam et al. |
| 2007/0277735 A1 | 12/2007 | Mokhesi et al. |
| 2007/0281082 A1 | 12/2007 | Mokhesi et al. |
| 2007/0281105 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0018004 A1 | 1/2008 | Steidl |
| 2008/0020591 A1 | 1/2008 | Balseanu et al. |
| 2008/0020593 A1 | 1/2008 | Wang et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0031708 A1 | 2/2008 | Bonora et al. |
| 2008/0036354 A1 | 2/2008 | Letz et al. |
| 2008/0038485 A1 | 2/2008 | Fuzakawa et al. |
| 2008/0042165 A1 | 2/2008 | Sugizaki |
| 2008/0043803 A1 | 2/2008 | Bandoh |
| 2008/0050536 A1 | 2/2008 | Aing et al. |
| 2008/0050538 A1 | 2/2008 | Hirata |
| 2008/0054332 A1 | 3/2008 | Kim et al. |
| 2008/0054813 A1 | 3/2008 | Espiau et al. |
| 2008/0056860 A1 | 3/2008 | Natume |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075562 A1 | 3/2008 | Maria et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0102203 A1 | 5/2008 | Wu |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0118334 A1 | 5/2008 | Bonora |
| 2008/0121177 A1 | 5/2008 | Bang et al. |
| 2008/0121626 A1 | 5/2008 | Thomas et al. |
| 2008/0124197 A1 | 5/2008 | van der Meulen et al. |
| 2008/0124908 A1 | 5/2008 | Forbes et al. |
| 2008/0124946 A1 | 5/2008 | Xiao et al. |
| 2008/0132046 A1 | 6/2008 | Walther |
| 2008/0133154 A1 | 6/2008 | Krauss et al. |
| 2008/0142483 A1 | 6/2008 | Hua |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0157157 A1 | 7/2008 | Tonomura |
| 2008/0157365 A1 | 7/2008 | Ott et al. |
| 2008/0173237 A1 | 7/2008 | Collins |
| 2008/0173238 A1 | 7/2008 | Nakashima et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0178805 A1 | 7/2008 | Paterson et al. |
| 2008/0179104 A1 | 7/2008 | Zhang |
| 2008/0179715 A1 | 7/2008 | Coppa |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0202416 A1 | 8/2008 | Provencher |
| 2008/0202689 A1 | 8/2008 | Kim |
| 2008/0203487 A1 | 8/2008 | Hohage et al. |
| 2008/0205483 A1 | 8/2008 | Rempe et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0216742 A1 | 9/2008 | Takebayashi |
| 2008/0220619 A1 | 9/2008 | Matsushita et al. |
| 2008/0224240 A1 | 9/2008 | Ahn et al. |
| 2008/0228306 A1 | 9/2008 | Yetter et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0241387 A1 | 10/2008 | Keto |
| 2008/0242116 A1* | 10/2008 | Clark .................. C23C 16/345 438/791 |
| 2008/0248310 A1 | 10/2008 | Kim et al. |
| 2008/0257494 A1 | 10/2008 | Hayashi et al. |
| 2008/0260963 A1 | 10/2008 | Yoon et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0268635 A1 | 10/2008 | Yu et al. |
| 2008/0277715 A1 | 11/2008 | Ohmi et al. |
| 2008/0282970 A1 | 11/2008 | Heys et al. |
| 2008/0283962 A1 | 11/2008 | Dyer |
| 2008/0289574 A1 | 11/2008 | Jacobs et al. |
| 2008/0291964 A1 | 11/2008 | Shrimpling |
| 2008/0295872 A1 | 12/2008 | Riker et al. |
| 2008/0298945 A1 | 12/2008 | Cox |
| 2008/0299326 A1 | 12/2008 | Fukazawa |
| 2008/0299758 A1 | 12/2008 | Harada et al. |
| 2008/0302303 A1 | 12/2008 | Choi et al. |
| 2008/0305014 A1 | 12/2008 | Honda |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011145 A1 | 1/2009 | Yun |
| 2009/0011608 A1 | 1/2009 | Nabatame |
| 2009/0017631 A1 | 1/2009 | Bencher |
| 2009/0020072 A1 | 1/2009 | Mizunaga et al. |
| 2009/0023229 A1 | 1/2009 | Matsushita |
| 2009/0029503 A1 | 1/2009 | Arai |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0042344 A1 | 2/2009 | Ye et al. |
| 2009/0042408 A1 | 2/2009 | Maeda |
| 2009/0045829 A1 | 2/2009 | Awazu |
| 2009/0050621 A1 | 2/2009 | Awazu |
| 2009/0052498 A1 | 2/2009 | Halpin et al. |
| 2009/0053023 A1 | 2/2009 | Wakabayashi |
| 2009/0053906 A1 | 2/2009 | Miya et al. |
| 2009/0056629 A1 | 3/2009 | Katz et al. |
| 2009/0057269 A1 | 3/2009 | Katz et al. |
| 2009/0061083 A1 | 3/2009 | Chiang et al. |
| 2009/0061644 A1 | 3/2009 | Chiang et al. |
| 2009/0061647 A1 | 3/2009 | Mallick et al. |
| 2009/0075491 A1 | 3/2009 | Liu et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0104351 A1 | 4/2009 | Kakegawa |
| 2009/0104789 A1 | 4/2009 | Mallick et al. |
| 2009/0107404 A1 | 4/2009 | Ogliari et al. |
| 2009/0108308 A1 | 4/2009 | Yang et al. |
| 2009/0112458 A1 | 4/2009 | Nakai |
| 2009/0120580 A1 | 5/2009 | Kagoshima et al. |
| 2009/0122293 A1 | 5/2009 | Shibazaki |
| 2009/0122458 A1 | 5/2009 | Lischer et al. |
| 2009/0124131 A1 | 5/2009 | Breunsbach et al. |
| 2009/0130331 A1 | 5/2009 | Asai |
| 2009/0130859 A1 | 5/2009 | Itatani et al. |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142905 A1 | 6/2009 | Yamazaki |

(56) References Cited

U.S. PATENT DOCUMENTS

| | | |
|---|---|---|
| 2009/0142935 A1 | 6/2009 | Fukazawa et al. |
| 2009/0146322 A1 | 6/2009 | Weling et al. |
| 2009/0156015 A1 | 6/2009 | Park et al. |
| 2009/0159000 A1 | 6/2009 | Aggarwal et al. |
| 2009/0159424 A1 | 6/2009 | Liu et al. |
| 2009/0162996 A1 | 6/2009 | Ramaswarmy et al. |
| 2009/0163038 A1 | 6/2009 | Miyoshi |
| 2009/0165715 A1 | 7/2009 | Oh |
| 2009/0179365 A1 | 7/2009 | Lerner et al. |
| 2009/0186571 A1 | 7/2009 | Haro |
| 2009/0197015 A1 | 8/2009 | Kudela et al. |
| 2009/0200494 A1 | 8/2009 | Hatem |
| 2009/0204403 A1 | 8/2009 | Hollander et al. |
| 2009/0206056 A1 | 8/2009 | Xu |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0227094 A1 | 9/2009 | Bateman |
| 2009/0230211 A1 | 9/2009 | Kobayashi et al. |
| 2009/0236014 A1 | 9/2009 | Wilson |
| 2009/0236276 A1 | 9/2009 | Kurth et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0246971 A1 | 10/2009 | Reid et al. |
| 2009/0250955 A1 | 10/2009 | Aoki |
| 2009/0255901 A1 | 10/2009 | Okita |
| 2009/0261331 A1 | 10/2009 | Yang et al. |
| 2009/0269506 A1 | 10/2009 | Okura et al. |
| 2009/0269941 A1 | 10/2009 | Raisanen |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0302434 A1 | 12/2009 | Pallem et al. |
| 2009/0304558 A1 | 12/2009 | Patton |
| 2009/0308315 A1 | 12/2009 | de Ridder |
| 2009/0308425 A1 | 12/2009 | Yednak |
| 2009/0311857 A1 | 12/2009 | Todd et al. |
| 2009/0315093 A1 | 12/2009 | Li et al. |
| 2009/0320754 A1 | 12/2009 | Oya |
| 2009/0325391 A1 | 12/2009 | De Vusser et al. |
| 2009/0325469 A1 | 12/2009 | Koo et al. |
| 2010/0001409 A1 | 1/2010 | Humbert et al. |
| 2010/0003406 A1 | 1/2010 | Lam et al. |
| 2010/0006031 A1 | 1/2010 | Choi et al. |
| 2010/0006923 A1 | 1/2010 | Fujitsuka |
| 2010/0014479 A1 | 1/2010 | Kim |
| 2010/0015813 A1 | 1/2010 | McGinnis et al. |
| 2010/0018460 A1 | 1/2010 | Singh et al. |
| 2010/0024727 A1 | 2/2010 | Kim et al. |
| 2010/0024872 A1 | 2/2010 | Kishimoto |
| 2010/0025796 A1 | 2/2010 | Dabiran |
| 2010/0032587 A1 | 2/2010 | Hosch et al. |
| 2010/0032842 A1 | 2/2010 | Herdt et al. |
| 2010/0040441 A1 | 2/2010 | Obikane |
| 2010/0041179 A1 | 2/2010 | Lee |
| 2010/0041243 A1 | 2/2010 | Cheng et al. |
| 2010/0050943 A1 | 3/2010 | Kato et al. |
| 2010/0051597 A1 | 3/2010 | Morita et al. |
| 2010/0055312 A1 | 3/2010 | Kato et al. |
| 2010/0055442 A1 | 3/2010 | Kellock |
| 2010/0058984 A1 | 3/2010 | Marubayashi |
| 2010/0065758 A1 | 3/2010 | Liu et al. |
| 2010/0068009 A1 | 3/2010 | Kimura |
| 2010/0068891 A1 | 3/2010 | Hatanaka et al. |
| 2010/0075507 A1 | 3/2010 | Chang et al. |
| 2010/0081094 A1 | 4/2010 | Hasebe et al. |
| 2010/0089320 A1 | 4/2010 | Kim |
| 2010/0089870 A1 | 4/2010 | Hiroshima et al. |
| 2010/0090149 A1 | 4/2010 | Thompson et al. |
| 2010/0092696 A1 | 4/2010 | Shinriki |
| 2010/0093187 A1 | 4/2010 | Lee et al. |
| 2010/0102417 A1 | 4/2010 | Ganguli et al. |
| 2010/0105936 A1 | 4/2010 | Tada et al. |
| 2010/0112496 A1 | 5/2010 | Nakajima et al. |
| 2010/0116207 A1 | 5/2010 | Givens |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126415 A1 | 5/2010 | Ishino et al. |
| 2010/0126539 A1 | 5/2010 | Lee et al. |
| 2010/0126605 A1 | 5/2010 | Stones |
| 2010/0129990 A1 | 5/2010 | Nishizawa et al. |
| 2010/0130015 A1 | 5/2010 | Nakajima et al. |
| 2010/0130017 A1 | 5/2010 | Luo et al. |
| 2010/0130105 A1 | 5/2010 | Lee |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0143609 A1 | 6/2010 | Fukazawa et al. |
| 2010/0144162 A1 | 6/2010 | Lee et al. |
| 2010/0144968 A1 | 6/2010 | Lee et al. |
| 2010/0145547 A1 | 6/2010 | Darabnia et al. |
| 2010/0151206 A1 | 6/2010 | Wu et al. |
| 2010/0159638 A1 | 6/2010 | Jeong |
| 2010/0162752 A1 | 7/2010 | Tabata et al. |
| 2010/0162956 A1 | 7/2010 | Murakami et al. |
| 2010/0163524 A1 | 7/2010 | Arai |
| 2010/0163937 A1 | 7/2010 | Clendenning |
| 2010/0168404 A1 | 7/2010 | Girolami et al. |
| 2010/0170441 A1 | 7/2010 | Won et al. |
| 2010/0170868 A1 | 7/2010 | Lin et al. |
| 2010/0173432 A1 | 7/2010 | White et al. |
| 2010/0178137 A1 | 7/2010 | Chintalapati et al. |
| 2010/0178423 A1 | 7/2010 | Shimizu et al. |
| 2010/0180819 A1 | 7/2010 | Hatanaka et al. |
| 2010/0183825 A1 | 7/2010 | Becker et al. |
| 2010/0184302 A1 | 7/2010 | Lee et al. |
| 2010/0186669 A1 | 7/2010 | Shin et al. |
| 2010/0193501 A1 | 8/2010 | Zucker et al. |
| 2010/0195392 A1 | 8/2010 | Freeman |
| 2010/0202860 A1 | 8/2010 | Reed |
| 2010/0221452 A1 | 9/2010 | Kang |
| 2010/0229795 A1 | 9/2010 | Tanabe |
| 2010/0230051 A1 | 9/2010 | Iizuka |
| 2010/0230863 A1 | 9/2010 | Moench et al. |
| 2010/0233885 A1 | 9/2010 | Kushibiki et al. |
| 2010/0233886 A1 | 9/2010 | Yang et al. |
| 2010/0236691 A1 | 9/2010 | Yamazaki |
| 2010/0243166 A1 | 9/2010 | Hayashi et al. |
| 2010/0244688 A1 | 9/2010 | Braun et al. |
| 2010/0248465 A1 | 9/2010 | Yi et al. |
| 2010/0255198 A1 | 10/2010 | Cleary et al. |
| 2010/0255218 A1 | 10/2010 | Oka et al. |
| 2010/0255625 A1 | 10/2010 | De Vries |
| 2010/0255658 A1 | 10/2010 | Aggarwal |
| 2010/0259152 A1 | 10/2010 | Yasuda et al. |
| 2010/0266765 A1 | 10/2010 | White et al. |
| 2010/0267248 A1 | 10/2010 | Ma |
| 2010/0270675 A1 | 10/2010 | Harada |
| 2010/0246630 A1 | 11/2010 | Kaszynski et al. |
| 2010/0275846 A1 | 11/2010 | Kitagawa |
| 2010/0282163 A1 | 11/2010 | Aggarwal et al. |
| 2010/0282170 A1 | 11/2010 | Nishizawa |
| 2010/0282645 A1 | 11/2010 | Wang |
| 2010/0285237 A1 | 11/2010 | Ditizio et al. |
| 2010/0285319 A1 | 11/2010 | Kwak et al. |
| 2010/0294199 A1 | 11/2010 | Tran et al. |
| 2010/0297391 A1 | 11/2010 | Kley |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2010/0326358 A1 | 12/2010 | Choi |
| 2011/0000619 A1 | 1/2011 | Suh |
| 2011/0006402 A1 | 1/2011 | Zhou |
| 2011/0006406 A1 | 1/2011 | Urbanowicz et al. |

(56) References Cited

U.S. PATENT DOCUMENTS

| | | |
|---|---|---|
| 2011/0014359 A1 | 1/2011 | Hashim |
| 2011/0014795 A1 | 1/2011 | Lee |
| 2011/0027725 A1 | 2/2011 | Tsutsumi et al. |
| 2011/0027999 A1 | 2/2011 | Sparks et al. |
| 2011/0034039 A1 | 2/2011 | Liang et al. |
| 2011/0045610 A1 | 2/2011 | van Schravendijk |
| 2011/0046314 A1 | 2/2011 | Klipp et al. |
| 2011/0048642 A1 | 3/2011 | Mihara et al. |
| 2011/0049100 A1 | 3/2011 | Han et al. |
| 2011/0052833 A1 | 3/2011 | Hanawa et al. |
| 2011/0053383 A1 | 3/2011 | Shero et al. |
| 2011/0056513 A1 | 3/2011 | Hombach et al. |
| 2011/0056626 A1 | 3/2011 | Brown et al. |
| 2011/0057248 A1 | 3/2011 | Ma et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0083496 A1 | 4/2011 | Lin et al. |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0117749 A1 | 5/2011 | Sheu |
| 2011/0124196 A1 | 5/2011 | Lee |
| 2011/0139272 A1 | 6/2011 | Matsumoto et al. |
| 2011/0139748 A1 | 6/2011 | Donnelly et al. |
| 2011/0140172 A1 | 6/2011 | Chu |
| 2011/0143032 A1 | 6/2011 | Vrtis et al. |
| 2011/0143461 A1 | 6/2011 | Fish et al. |
| 2011/0159202 A1 | 6/2011 | Matsushita |
| 2011/0159673 A1 | 6/2011 | Hanawa et al. |
| 2011/0159680 A1 | 6/2011 | Yoo |
| 2011/0168330 A1 | 7/2011 | Sakaue et al. |
| 2011/0171775 A1 | 7/2011 | Yamamoto et al. |
| 2011/0175011 A1 | 7/2011 | Ehrne et al. |
| 2011/0180233 A1 | 7/2011 | Bera et al. |
| 2011/0183079 A1 | 7/2011 | Jackson et al. |
| 2011/0183269 A1 | 7/2011 | Zhu |
| 2011/0183527 A1 | 7/2011 | Cho |
| 2011/0192820 A1 | 8/2011 | Yeom et al. |
| 2011/0198417 A1 | 8/2011 | Detmar et al. |
| 2011/0198736 A1 | 8/2011 | Shero et al. |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0237040 A1 | 9/2011 | Ng et al. |
| 2011/0239936 A1 | 10/2011 | Suzaki et al. |
| 2011/0254052 A1 | 10/2011 | Kouvetakis |
| 2011/0256675 A1 | 10/2011 | Avouris |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0263107 A1 | 10/2011 | Chung et al. |
| 2011/0265549 A1 | 11/2011 | Cruse et al. |
| 2011/0265715 A1 | 11/2011 | Keller |
| 2011/0265725 A1 | 11/2011 | Tsuji |
| 2011/0265951 A1 | 11/2011 | Xu et al. |
| 2011/0275018 A1 | 11/2011 | Matteo et al. |
| 2011/0275166 A1 | 11/2011 | Shero et al. |
| 2011/0277690 A1 | 11/2011 | Rozenzon et al. |
| 2011/0281417 A1 | 11/2011 | Gordon et al. |
| 2011/0283933 A1 | 11/2011 | Makarov et al. |
| 2011/0291243 A1 | 12/2011 | Seamons |
| 2011/0294075 A1 | 12/2011 | Chen et al. |
| 2011/0294288 A1 | 12/2011 | Lee et al. |
| 2011/0298062 A1 | 12/2011 | Ganguli et al. |
| 2011/0300720 A1 | 12/2011 | Fu |
| 2011/0308453 A1 | 12/2011 | Su et al. |
| 2011/0308460 A1 | 12/2011 | Hong et al. |
| 2011/0312191 A1 | 12/2011 | Ohkura et al. |
| 2012/0003500 A1 | 1/2012 | Yoshida et al. |
| 2012/0006489 A1 | 1/2012 | Okita |
| 2012/0009802 A1 | 1/2012 | Lavoie |
| 2012/0024227 A1 | 2/2012 | Takasuka et al. |
| 2012/0024479 A1 | 2/2012 | Palagashvili et al. |
| 2012/0028454 A1 | 2/2012 | Swaminathan et al. |
| 2012/0031333 A1 | 2/2012 | Kurita et al. |
| 2012/0032311 A1 | 2/2012 | Gates |
| 2012/0033695 A1 | 2/2012 | Hayashi et al. |
| 2012/0036732 A1 | 2/2012 | Varadarajan |
| 2012/0040528 A1 | 2/2012 | Kim et al. |
| 2012/0043556 A1 | 2/2012 | Dube et al. |
| 2012/0046421 A1 | 2/2012 | Darling et al. |
| 2012/0052681 A1 | 3/2012 | Marsh |
| 2012/0058630 A1 | 3/2012 | Quinn |
| 2012/0064690 A1 | 3/2012 | Hirota et al. |
| 2012/0068242 A1 | 3/2012 | Shin et al. |
| 2012/0070136 A1 | 3/2012 | Koelmel et al. |
| 2012/0070997 A1 | 3/2012 | Larson |
| 2012/0074533 A1 | 3/2012 | Aoyama |
| 2012/0077349 A1 | 3/2012 | Li et al. |
| 2012/0080756 A1 | 4/2012 | Suzuki |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0108039 A1 | 5/2012 | Zajaji |
| 2012/0114877 A1 | 5/2012 | Lee |
| 2012/0115250 A1 | 5/2012 | Ariga et al. |
| 2012/0115257 A1 | 5/2012 | Matsuyam et al. |
| 2012/0119337 A1 | 5/2012 | Sasaki et al. |
| 2012/0121823 A1 | 5/2012 | Chhabra |
| 2012/0122275 A1 | 5/2012 | Koo et al. |
| 2012/0122302 A1 | 5/2012 | Weisman et al. |
| 2012/0128897 A1 | 5/2012 | Xiao et al. |
| 2012/0135145 A1 | 5/2012 | Je et al. |
| 2012/0149213 A1 | 6/2012 | Nittala |
| 2012/0156108 A1 | 6/2012 | Fondurulia et al. |
| 2012/0156890 A1 | 6/2012 | Yim et al. |
| 2012/0160172 A1 | 6/2012 | Wamura et al. |
| 2012/0161405 A1 | 6/2012 | Mohn |
| 2012/0164327 A1 | 6/2012 | Sato |
| 2012/0164837 A1 | 6/2012 | Tan et al. |
| 2012/0164842 A1 | 6/2012 | Watanabe |
| 2012/0170170 A1 | 7/2012 | Gros-Jean |
| 2012/0171391 A1 | 7/2012 | Won |
| 2012/0171874 A1 | 7/2012 | Thridandam et al. |
| 2012/0175751 A1 | 7/2012 | Gatineau et al. |
| 2012/0183689 A1 | 7/2012 | Suzuki et al. |
| 2012/0187083 A1 | 7/2012 | Hashizume |
| 2012/0187305 A1 | 7/2012 | Elam et al. |
| 2012/0190178 A1 | 7/2012 | Wang et al. |
| 2012/0190185 A1 | 7/2012 | Rogers |
| 2012/0196048 A1 | 8/2012 | Ueda |
| 2012/0196450 A1 | 8/2012 | Balseanu et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0216743 A1 | 8/2012 | Itoh et al. |
| 2012/0219824 A1 | 8/2012 | Prolier et al. |
| 2012/0220139 A1 | 8/2012 | Lee et al. |
| 2012/0225561 A1 | 9/2012 | Watanabe |
| 2012/0231771 A1 | 9/2012 | Marcus |
| 2012/0238074 A1 | 9/2012 | Santhanam et al. |
| 2012/0240858 A1 | 9/2012 | Taniyama et al. |
| 2012/0241411 A1 | 9/2012 | Darling et al. |
| 2012/0252229 A1 | 10/2012 | Timans et al. |
| 2012/0263876 A1 | 10/2012 | Haukka et al. |
| 2012/0264051 A1 | 10/2012 | Angelov et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0289057 A1 | 11/2012 | DeDontney |
| 2012/0295427 A1 | 11/2012 | Bauer |
| 2012/0304935 A1 | 12/2012 | Oosterlaken et al. |
| 2012/0305026 A1 | 12/2012 | Nomura et al. |
| 2012/0305196 A1 | 12/2012 | Mori et al. |

(56) References Cited

U.S. PATENT DOCUMENTS

| | | |
|---|---|---|
| 2012/0305987 A1 | 12/2012 | Hirler et al. |
| 2012/0310440 A1 | 12/2012 | Darabnia et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabai et al. |
| 2013/0019945 A1 | 1/2013 | Hekmatshoar-Tabai et al. |
| 2013/0020246 A1 | 1/2013 | Hoots et al. |
| 2013/0023129 A1 | 1/2013 | Reed |
| 2013/0025786 A1 | 1/2013 | Davidkovich et al. |
| 2013/0026451 A1 | 1/2013 | Bangsaruntip et al. |
| 2013/0037858 A1 | 2/2013 | Hong et al. |
| 2013/0037886 A1 | 2/2013 | Tsai et al. |
| 2013/0048606 A1 | 2/2013 | Mao et al. |
| 2013/0052585 A1 | 2/2013 | Ayothi et al. |
| 2013/0061755 A1 | 3/2013 | Frederick |
| 2013/0064973 A1 | 3/2013 | Chen et al. |
| 2013/0065189 A1 | 3/2013 | Yoshii et al. |
| 2013/0068727 A1 | 3/2013 | Okita |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0082274 A1 | 4/2013 | Yang |
| 2013/0084156 A1 | 4/2013 | Shimamoto |
| 2013/0084714 A1 | 4/2013 | Oka et al. |
| 2013/0089716 A1 | 4/2013 | Krishnamurthy et al. |
| 2013/0095664 A1 | 4/2013 | Matero et al. |
| 2013/0095973 A1 | 4/2013 | Kroneberger et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0115763 A1 | 5/2013 | Takamure et al. |
| 2013/0115768 A1 | 5/2013 | Pore et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0143401 A1 | 6/2013 | Yu et al. |
| 2013/0157409 A1 | 6/2013 | Vaidya |
| 2013/0160709 A1 | 6/2013 | White |
| 2013/0161629 A1 | 6/2013 | Han et al. |
| 2013/0168354 A1 | 7/2013 | Kanarik |
| 2013/0171818 A1 | 7/2013 | Kim et al. |
| 2013/0175596 A1 | 7/2013 | Cheng et al. |
| 2013/0180448 A1 | 7/2013 | Sakaue et al. |
| 2013/0183814 A1 | 7/2013 | Huang et al. |
| 2013/0189854 A1 | 7/2013 | Hausmann et al. |
| 2013/0203266 A1 | 8/2013 | Hintze |
| 2013/0209940 A1 | 8/2013 | Sakamoto et al. |
| 2013/0210241 A1 | 8/2013 | Lavoie et al. |
| 2013/0214232 A1 | 8/2013 | Tendulkar et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256265 A1 | 10/2013 | Darling et al. |
| 2013/0256838 A1 | 10/2013 | Sanchez et al. |
| 2013/0256962 A1 | 10/2013 | Ranish |
| 2013/0264659 A1 | 10/2013 | Jung |
| 2013/0269612 A1 | 10/2013 | Cheng et al. |
| 2013/0270676 A1 | 10/2013 | Lindert et al. |
| 2013/0276978 A1 | 10/2013 | Bluck et al. |
| 2013/0285155 A1 | 10/2013 | Glass |
| 2013/0287526 A1 | 10/2013 | Bluck et al. |
| 2013/0288480 A1 | 10/2013 | Sanchez et al. |
| 2013/0288485 A1 | 10/2013 | Liang et al. |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0295779 A1 | 11/2013 | Chandra et al. |
| 2013/0302999 A1 | 11/2013 | Won et al. |
| 2013/0313656 A1 | 11/2013 | Tong |
| 2013/0319290 A1 | 12/2013 | Xiao et al. |
| 2013/0320429 A1 | 12/2013 | Thomas |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2013/0330933 A1 | 12/2013 | Fukazawa et al. |
| 2013/0333619 A1 | 12/2013 | Omari |
| 2013/0337583 A1 | 12/2013 | Kobayashi et al. |
| 2013/0337653 A1 | 12/2013 | Kovalgin et al. |
| 2013/0340619 A1 | 12/2013 | Tammera |
| 2013/0344248 A1 | 12/2013 | Clark |
| 2014/0000843 A1 | 1/2014 | Dunn et al. |
| 2014/0001520 A1 | 1/2014 | Glass |
| 2014/0014642 A1 | 1/2014 | Elliot et al. |
| 2014/0014644 A1 | 1/2014 | Akiba et al. |
| 2014/0015186 A1 | 1/2014 | Wessel et al. |
| 2014/0020619 A1 | 1/2014 | Vincent et al. |
| 2014/0023794 A1 | 1/2014 | Mahajani et al. |
| 2014/0027884 A1 | 1/2014 | Tang et al. |
| 2014/0033978 A1 | 2/2014 | Adachi et al. |
| 2014/0036274 A1 | 2/2014 | Marquardt et al. |
| 2014/0047705 A1 | 2/2014 | Singh |
| 2014/0048765 A1 | 2/2014 | Ma et al. |
| 2014/0056679 A1 | 2/2014 | Yamabe et al. |
| 2014/0056770 A1 | 2/2014 | Bedard et al. |
| 2014/0057454 A1 | 2/2014 | Subramonium |
| 2014/0058179 A1 | 2/2014 | Stevens et al. |
| 2014/0060147 A1 | 3/2014 | Sarin et al. |
| 2014/0061770 A1 | 3/2014 | Lee |
| 2014/0062304 A1 | 3/2014 | Nakano et al. |
| 2014/0065841 A1 | 3/2014 | Matero |
| 2014/0067110 A1 | 3/2014 | Lawson et al. |
| 2014/0073143 A1 | 3/2014 | Alokozai et al. |
| 2014/0076861 A1 | 3/2014 | Cornelius et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0094027 A1 | 4/2014 | Azumo et al. |
| 2014/0096716 A1 | 4/2014 | Chung et al. |
| 2014/0097468 A1 | 4/2014 | Okita |
| 2014/0099798 A1 | 4/2014 | Tsuji |
| 2014/0103145 A1 | 4/2014 | White et al. |
| 2014/0106574 A1 | 4/2014 | Kang et al. |
| 2014/0110798 A1 | 4/2014 | Cai |
| 2014/0113457 A1 | 4/2014 | Sims |
| 2014/0116335 A1 | 5/2014 | Tsuji et al. |
| 2014/0120487 A1 | 5/2014 | Kaneko |
| 2014/0120723 A1 | 5/2014 | Fu et al. |
| 2014/0120738 A1 | 5/2014 | Jung |
| 2014/0127907 A1 | 5/2014 | Yang |
| 2014/0138779 A1 | 5/2014 | Xie et al. |
| 2014/0141625 A1 | 5/2014 | Fukazawa et al. |
| 2014/0144500 A1 | 5/2014 | Cao et al. |
| 2014/0158786 A1 | 6/2014 | Santo |
| 2014/0159170 A1 | 6/2014 | Raisanen et al. |
| 2014/0167187 A1 | 6/2014 | Kuo et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0191389 A1 | 7/2014 | Lee et al. |
| 2014/0193983 A1 | 7/2014 | Lavoie |
| 2014/0202386 A1 | 7/2014 | Taga |
| 2014/0202388 A1 | 7/2014 | Um et al. |
| 2014/0209976 A1 | 7/2014 | Yang et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0227861 A1 | 8/2014 | Wu et al. |
| 2014/0227881 A1 | 8/2014 | Lubomirsky et al. |
| 2014/0234550 A1 | 8/2014 | Winter et al. |
| 2014/0251953 A1 | 9/2014 | Winkler et al. |
| 2014/0251954 A1 | 9/2014 | Winkler et al. |

(56) References Cited

U.S. PATENT DOCUMENTS

| | | |
|---|---|---|
| 2014/0252134 A1 | 9/2014 | Chen |
| 2014/0252479 A1 | 9/2014 | Utomo et al. |
| 2014/0260684 A1 | 9/2014 | Christmann |
| 2014/0264902 A1* | 9/2014 | Ting .................. H01L 23/5329 257/774 |
| 2014/0272194 A1 | 9/2014 | Xiao et al. |
| 2014/0273428 A1 | 9/2014 | Shero |
| 2014/0273477 A1 | 9/2014 | Niskanen |
| 2014/0273510 A1 | 9/2014 | Chen et al. |
| 2014/0273528 A1 | 9/2014 | Niskanen |
| 2014/0273530 A1 | 9/2014 | Nguyen |
| 2014/0273531 A1 | 9/2014 | Niskanen |
| 2014/0283747 A1 | 9/2014 | Kasai et al. |
| 2014/0346142 A1 | 11/2014 | Chapuis et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0363983 A1 | 12/2014 | Nakano et al. |
| 2014/0363985 A1 | 12/2014 | Jang et al. |
| 2014/0367043 A1 | 12/2014 | Bishara et al. |
| 2014/0367642 A1 | 12/2014 | Guo |
| 2014/0377960 A1 | 12/2014 | Koiwa |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0010381 A1 | 1/2015 | Cai |
| 2015/0014632 A1 | 1/2015 | Kim et al. |
| 2015/0014823 A1 | 1/2015 | Mallikaijunan et al. |
| 2015/0017794 A1 | 1/2015 | Takamure |
| 2015/0021599 A1 | 1/2015 | Ridgeway |
| 2015/0024609 A1 | 1/2015 | Milligan et al. |
| 2015/0041431 A1 | 2/2015 | Zafiropoulo et al. |
| 2015/0048485 A1 | 2/2015 | Tolle |
| 2015/0056815 A1 | 2/2015 | Fernandez |
| 2015/0072509 A1 | 3/2015 | Chi et al. |
| 2015/0078874 A1 | 3/2015 | Sansoni |
| 2015/0079311 A1 | 3/2015 | Nakano |
| 2015/0086316 A1 | 3/2015 | Greenberg |
| 2015/0087154 A1 | 3/2015 | Guha et al. |
| 2015/0091057 A1 | 4/2015 | Xie et al. |
| 2015/0096973 A1 | 4/2015 | Dunn et al. |
| 2015/0099065 A1 | 4/2015 | Canizares et al. |
| 2015/0099072 A1 | 4/2015 | Takamure et al. |
| 2015/0099342 A1 | 4/2015 | Tsai |
| 2015/0102466 A1 | 4/2015 | Colinge |
| 2015/0111374 A1 | 4/2015 | Bao |
| 2015/0111395 A1 | 4/2015 | Hashimoto et al. |
| 2015/0122180 A1 | 5/2015 | Chang et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147488 A1 | 5/2015 | Choi et al. |
| 2015/0147877 A1 | 5/2015 | Jung |
| 2015/0162168 A1 | 6/2015 | Oehrlien |
| 2015/0162185 A1 | 6/2015 | Pore |
| 2015/0162214 A1 | 6/2015 | Thompson |
| 2015/0167159 A1 | 6/2015 | Halpin et al. |
| 2015/0170914 A1 | 6/2015 | Haukka et al. |
| 2015/0170947 A1 | 6/2015 | Bluck |
| 2015/0170954 A1 | 6/2015 | Agarwal |
| 2015/0171177 A1 | 6/2015 | Cheng et al. |
| 2015/0174768 A1 | 6/2015 | Rodnick |
| 2015/0179501 A1 | 6/2015 | Jhaveri et al. |
| 2015/0179564 A1 | 6/2015 | Lee et al. |
| 2015/0184291 A1 | 7/2015 | Alokozai et al. |
| 2015/0187559 A1 | 7/2015 | Sano |
| 2015/0187568 A1 | 7/2015 | Pettinger et al. |
| 2015/0117456 A1 | 8/2015 | Tsuji et al. |
| 2015/0217330 A1 | 8/2015 | Haukka |
| 2015/0217456 A1 | 8/2015 | Tsuji et al. |
| 2015/0218695 A1 | 8/2015 | Odedra |
| 2015/0225850 A1 | 8/2015 | Arora et al. |
| 2015/0228572 A1 | 8/2015 | Yang et al. |
| 2015/0240359 A1 | 8/2015 | Jdira et al. |
| 2015/0243542 A1 | 8/2015 | Yoshihara et al. |
| 2015/0243545 A1 | 8/2015 | Tang |
| 2015/0243658 A1 | 8/2015 | Joshi et al. |
| 2015/0255385 A1 | 9/2015 | Lee et al. |
| 2015/0259790 A1 | 9/2015 | Newman |
| 2015/0263033 A1 | 9/2015 | Aoyama |
| 2015/0267295 A1 | 9/2015 | Hill et al. |
| 2015/0267297 A1 | 9/2015 | Shiba |
| 2015/0267298 A1 | 9/2015 | Saitou et al. |
| 2015/0267299 A1 | 9/2015 | Hawkins |
| 2015/0267301 A1 | 9/2015 | Hill et al. |
| 2015/0270140 A1 | 9/2015 | Gupta |
| 2015/0270146 A1 | 9/2015 | Yoshihara et al. |
| 2015/0279681 A1 | 10/2015 | Knoops |
| 2015/0279708 A1 | 10/2015 | Kobayashi et al. |
| 2015/0284848 A1 | 10/2015 | Nakano et al. |
| 2015/0287626 A1 | 10/2015 | Arai |
| 2015/0287710 A1 | 10/2015 | Yun et al. |
| 2015/0292088 A1 | 10/2015 | Canizares |
| 2015/0299848 A1 | 10/2015 | Haukka |
| 2015/0308586 A1 | 10/2015 | Shugrue et al. |
| 2015/0303056 A1 | 11/2015 | Varadarajan et al. |
| 2015/0315704 A1 | 11/2015 | Nakano et al. |
| 2015/0340247 A1 | 11/2015 | Balakrishnan et al. |
| 2015/0340500 A1 | 11/2015 | Brunco |
| 2015/0343741 A1 | 12/2015 | Shibata et al. |
| 2015/0348755 A1 | 12/2015 | Han et al. |
| 2015/0361553 A1 | 12/2015 | Murakawa |
| 2015/0364371 A1 | 12/2015 | Yen |
| 2015/0367253 A1 | 12/2015 | Kanyal et al. |
| 2015/0376211 A1 | 12/2015 | Girard |
| 2015/0376785 A1 | 12/2015 | Knaapen et al. |
| 2015/0380296 A1 | 12/2015 | Antonelli et al. |
| 2016/0013022 A1 | 1/2016 | Ayoub |
| 2016/0013024 A1 | 1/2016 | Milligan et al. |
| 2016/0020092 A1 | 1/2016 | Kang et al. |
| 2016/0024656 A1 | 1/2016 | White et al. |
| 2016/0035566 A1 | 2/2016 | LaVoie |
| 2016/0051964 A1 | 2/2016 | Tolle et al. |
| 2016/0056074 A1 | 2/2016 | Na |
| 2016/0079054 A1 | 3/2016 | Chen et al. |
| 2016/0097123 A1 | 4/2016 | Shugrue et al. |
| 2016/0099150 A1 | 4/2016 | Tsai |
| 2016/0102214 A1 | 4/2016 | Dietz et al. |
| 2016/0111272 A1 | 4/2016 | Girard |
| 2016/0111438 A1 | 4/2016 | Tsutsumi et al. |
| 2016/0115590 A1 | 4/2016 | Haukka et al. |
| 2016/0133307 A1 | 5/2016 | Lee et al. |
| 2016/0133628 A1 | 5/2016 | Xie |
| 2016/0141172 A1 | 5/2016 | Kang |
| 2016/0145738 A1 | 5/2016 | Liu et al. |
| 2016/0148811 A1 | 5/2016 | Nakatani et al. |
| 2016/0148821 A1 | 5/2016 | Singh |
| 2016/0155629 A1 | 6/2016 | Hawryluk et al. |
| 2016/0163556 A1 | 6/2016 | Briggs et al. |
| 2016/0163561 A1 | 6/2016 | Hudson et al. |
| 2016/0168699 A1 | 6/2016 | Fukazawa et al. |
| 2016/0181128 A1 | 6/2016 | Mori |
| 2016/0181368 A1 | 6/2016 | Weeks |
| 2016/0190137 A1 | 6/2016 | Tsai et al. |
| 2016/0211135 A1 | 7/2016 | Noda et al. |
| 2016/0211147 A1 | 7/2016 | Fukazawa |
| 2016/0217857 A1 | 7/2016 | Paudel |
| 2016/0225607 A1 | 8/2016 | Yamamoto et al. |
| 2016/0245704 A1 | 8/2016 | Osaka et al. |
| 2016/0256187 A1 | 9/2016 | Shelton et al. |
| 2016/0268102 A1 | 9/2016 | White |
| 2016/0268107 A1 | 9/2016 | White |
| 2016/0276148 A1 | 9/2016 | Qian et al. |
| 2016/0284542 A1 | 9/2016 | Noda et al. |
| 2016/0289828 A1 | 10/2016 | Shero et al. |
| 2016/0293398 A1 | 10/2016 | Danek et al. |
| 2016/0307766 A1 | 10/2016 | Jongbloed et al. |
| 2016/0312360 A1 | 10/2016 | Rasheed et al. |
| 2016/0314964 A1 | 10/2016 | Tang et al. |
| 2016/0334709 A1 | 11/2016 | Huli et al. |
| 2016/0358772 A1 | 12/2016 | Xie |
| 2016/0362813 A1 | 12/2016 | Bao et al. |
| 2016/0365280 A1 | 12/2016 | Brink et al. |
| 2016/0372365 A1 | 12/2016 | Tang et al. |

(56) References Cited

U.S. PATENT DOCUMENTS

| | | |
|---|---|---|
| 2016/0372744 A1 | 12/2016 | Essaki et al. |
| 2016/0376700 A1 | 12/2016 | Haukka |
| 2016/0376704 A1 | 12/2016 | Raisanen |
| 2016/0379851 A1 | 12/2016 | Swaminathan et al. |
| 2016/0381732 A1 | 12/2016 | Moench et al. |
| 2017/0011889 A1 | 1/2017 | Winkler et al. |
| 2017/0011950 A1 | 1/2017 | Schmotzer |
| 2017/0018477 A1 | 1/2017 | Kato |
| 2017/0025280 A1 | 1/2017 | Milligan |
| 2017/0029945 A1 | 2/2017 | Kamakura |
| 2017/0033004 A1* | 2/2017 | Siew ............... H01L 21/76871 |
| 2017/0037513 A1 | 2/2017 | Haukka |
| 2017/0040164 A1* | 2/2017 | Wang ............... H01L 21/02178 |
| 2017/0040206 A1 | 2/2017 | Schmotzer et al. |
| 2017/0047446 A1 | 2/2017 | Margetis et al. |
| 2017/0051408 A1 | 2/2017 | Kosuke et al. |
| 2017/0062204 A1 | 3/2017 | Suzuki et al. |
| 2017/0062209 A1* | 3/2017 | Shiba ............... H01L 21/02178 |
| 2017/0062258 A1 | 3/2017 | Bluck |
| 2017/0091320 A1 | 3/2017 | Psota et al. |
| 2017/0092469 A1 | 3/2017 | Kurita et al. |
| 2017/0092531 A1 | 3/2017 | Coomer |
| 2017/0092847 A1 | 3/2017 | Kim et al. |
| 2017/0100742 A1 | 4/2017 | Pore et al. |
| 2017/0103907 A1 | 4/2017 | Chu et al. |
| 2017/0107621 A1 | 4/2017 | Suemori |
| 2017/0110313 A1 | 4/2017 | Tang et al. |
| 2017/0114464 A1 | 4/2017 | Iriuda |
| 2017/0117141 A1 | 4/2017 | Zhu et al. |
| 2017/0117202 A1 | 4/2017 | Tang et al. |
| 2017/0117203 A1 | 4/2017 | Tang et al. |
| 2017/0117222 A1 | 4/2017 | Kim et al. |
| 2017/0130332 A1 | 5/2017 | Stumpf |
| 2017/0136578 A1 | 5/2017 | Yoshimura |
| 2017/0154757 A1 | 6/2017 | Winkler et al. |
| 2017/0173696 A1 | 6/2017 | Sheinman |
| 2017/0186754 A1 | 6/2017 | Blomberg et al. |
| 2017/0191164 A1 | 7/2017 | Alokozai et al. |
| 2017/0196562 A1 | 7/2017 | Shelton |
| 2017/0216762 A1 | 8/2017 | Shugrue et al. |
| 2017/0232457 A1 | 8/2017 | Toshiki et al. |
| 2017/0243734 A1 | 8/2017 | Ishikawa et al. |
| 2017/0250068 A1 | 8/2017 | Ishikawa |
| 2017/0250075 A1 | 8/2017 | Caymax et al. |
| 2017/0256429 A1 | 9/2017 | Lawson et al. |
| 2017/0260649 A1 | 9/2017 | Coomer |
| 2017/0263437 A1 | 9/2017 | Li et al. |
| 2017/0267527 A1 | 9/2017 | Kim et al. |
| 2017/0267531 A1 | 9/2017 | Huakka |
| 2017/0271256 A1 | 9/2017 | Inatsuka |
| 2017/0278707 A1 | 9/2017 | Margetis et al. |
| 2017/0287681 A1 | 10/2017 | Nitadori et al. |
| 2017/0294318 A1 | 10/2017 | Yoshida et al. |
| 2017/0306478 A1 | 10/2017 | Raisanen et al. |
| 2017/0306479 A1 | 10/2017 | Raisanen et al. |
| 2017/0306480 A1 | 10/2017 | Zhu et al. |
| 2017/0316933 A1 | 11/2017 | Xie et al. |
| 2017/0316940 A1 | 11/2017 | Ishikawa |
| 2017/0317194 A1 | 11/2017 | Tang et al. |
| 2017/0338192 A1 | 11/2017 | Lee et al. |
| 2017/0342559 A1 | 11/2017 | Fukazawa et al. |
| 2017/0343896 A1 | 11/2017 | Darling et al. |
| 2017/0372884 A1 | 12/2017 | Margetis et al. |
| 2018/0010247 A1 | 1/2018 | Niskanen |
| 2018/0025890 A1 | 1/2018 | Choi |
| 2018/0025939 A1 | 1/2018 | Kovalgin et al. |
| 2018/0033616 A1 | 2/2018 | Masaru |
| 2018/0033625 A1 | 2/2018 | Yoo |
| 2018/0033645 A1 | 2/2018 | Saido et al. |
| 2018/0033674 A1 | 2/2018 | Jeong |
| 2018/0033679 A1 | 2/2018 | Pore |
| 2018/0040746 A1 | 2/2018 | Johnson et al. |
| 2018/0047749 A1 | 2/2018 | Kim |
| 2018/0057937 A1 | 3/2018 | Lee et al. |
| 2018/0061851 A1 | 3/2018 | Ootsuka |
| 2018/0069019 A1 | 3/2018 | Kim et al. |
| 2018/0076021 A1 | 3/2018 | Fukushima et al. |
| 2018/0087152 A1 | 3/2018 | Yoshida |
| 2018/0087154 A1 | 3/2018 | Pore et al. |
| 2018/0087156 A1 | 3/2018 | Kohei et al. |
| 2018/0102276 A1 | 4/2018 | Zhu et al. |
| 2018/0105930 A1 | 4/2018 | Kang et al. |
| 2018/0108587 A1 | 4/2018 | Jiang |
| 2018/0114680 A1 | 4/2018 | Kim et al. |
| 2018/0119283 A1 | 5/2018 | Fukazawa |
| 2018/0122642 A1 | 5/2018 | Raisanen |
| 2018/0122709 A1 | 5/2018 | Xie |
| 2018/0122959 A1 | 5/2018 | Calka et al. |
| 2018/0127876 A1 | 5/2018 | Tolle |
| 2018/0130652 A1 | 5/2018 | Pettinger et al. |
| 2018/0130701 A1 | 5/2018 | Chun |
| 2018/0135173 A1 | 5/2018 | Kim et al. |
| 2018/0135179 A1 | 5/2018 | Toshiyuki et al. |
| 2018/0142353 A1 | 5/2018 | Tetsuya et al. |
| 2018/0142357 A1 | 5/2018 | Yoshikazu |
| 2018/0151346 A1 | 5/2018 | Blanquart |
| 2018/0151358 A1 | 5/2018 | Margetis et al. |
| 2018/0158688 A1 | 6/2018 | Chen |
| 2018/0166258 A1 | 6/2018 | Kim et al. |
| 2018/0166315 A1 | 6/2018 | Coomer |
| 2018/0171475 A1 | 6/2018 | Maes et al. |
| 2018/0171477 A1 | 6/2018 | Kim et al. |
| 2018/0174826 A1 | 6/2018 | Raaijmakers et al. |
| 2018/0182613 A1 | 6/2018 | Blanquart et al. |
| 2018/0182618 A1 | 6/2018 | Blanquart et al. |
| 2018/0189923 A1 | 7/2018 | Goundar |
| 2018/0195174 A1 | 7/2018 | Kim et al. |
| 2018/0223429 A1 | 8/2018 | Fukazawa et al. |
| 2018/0233372 A1 | 8/2018 | Vayrynen et al. |

FOREIGN PATENT DOCUMENTS

| | | |
|---|---|---|
| CN | 1664987 | 9/2005 |
| CN | 1714168 | 12/2005 |
| CN | 101330015 | 12/2008 |
| CN | 101515563 | 8/2009 |
| CN | 101522943 | 9/2009 |
| CN | 101681873 | 3/2010 |
| CN | 101423937 | 9/2011 |
| CN | 102383106 | 3/2012 |
| DE | 102008052750 | 6/2009 |
| EP | 0887632 | 12/1998 |
| EP | 1889817 | 2/2008 |
| EP | 2036600 | 3/2009 |
| EP | 2426233 | 7/2012 |
| FR | 1408266 | 8/1965 |
| FR | 2233614 | 1/1975 |
| GB | 752-277 | 7/1956 |
| JP | 58-19462 | 4/1983 |
| JP | 59-211779 | 11/1984 |
| JP | 61038863 | 2/1986 |
| JP | H02-185038 | 7/1990 |
| JP | 03-044472 | 2/1991 |
| JP | H03-044472 | 2/1991 |
| JP | H04-115531 | 4/1992 |
| JP | H04115531 | 4/1992 |
| JP | H05-23079 | 3/1993 |
| JP | H05-118928 | 5/1993 |
| JP | H05-171446 | 7/1993 |
| JP | H06-053210 | 2/1994 |
| JP | 1995-01-31 | 1/1995 |
| JP | H07-109576 | 4/1995 |
| JP | 07-034936 | 8/1995 |
| JP | H07-034936 | 8/1995 |
| JP | 7-272694 | 10/1995 |
| JP | H07-283149 | 10/1995 |
| JP | H07283149 | 10/1995 |
| JP | H07-209093 | 11/1995 |
| JP | 08-181135 | 7/1996 |
| JP | 1996-07-12 | 7/1996 |
| JP | H08-335558 | 12/1996 |
| JP | H08335558 | 12/1996 |
| JP | 9-89676 | 4/1997 |
| JP | 10-064696 | 3/1998 |

(56) References Cited

FOREIGN PATENT DOCUMENTS

| | | |
|---|---|---|
| JP | H10-064696 | 3/1998 |
| JP | H10-153494 | 6/1998 |
| JP | H10-227703 | 8/1998 |
| JP | 10-0261620 | 9/1998 |
| JP | H10-0261620 | 9/1998 |
| JP | 2845163 | 1/1999 |
| JP | H11-097163 | 4/1999 |
| JP | H11-118615 | 4/1999 |
| JP | H11-183264 | 7/1999 |
| JP | H11-183265 | 7/1999 |
| JP | H11-287715 | 10/1999 |
| JP | 2001-15698 | 1/2001 |
| JP | 2001015698 | 1/2001 |
| JP | 2001342570 | 12/2001 |
| JP | 2003035574 | 2/2003 |
| JP | 2003153706 | 5/2003 |
| JP | 2004014952 | 1/2004 |
| JP | 2004023043 | 1/2004 |
| JP | 2004091848 | 3/2004 |
| JP | 2004113270 | 4/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005033221 | 2/2005 |
| JP | 2005507030 | 3/2005 |
| JP | 2005172489 | 6/2005 |
| JP | 2006059931 | 3/2006 |
| JP | 2006090762 | 4/2006 |
| JP | 2006153706 | 6/2006 |
| JP | 2006186271 | 7/2006 |
| JP | 2007027777 | 2/2007 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009251216 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2011049592 | 3/2011 |
| JP | 2011162830 | 8/2011 |
| JP | 2012089837 | 5/2012 |
| JP | 2012146939 | 8/2012 |
| JP | 2013235912 | 11/2013 |
| JP | 2014522104 | 8/2014 |
| JP | 2016174158 | 9/2016 |
| KR | 10-2000-0031098 | 6/2000 |
| KR | 2000-07-15 | 7/2000 |
| KR | 10-0295043 | 4/2001 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-0688484 | 2/2007 |
| KR | 10-2007-0084683 | 8/2007 |
| KR | 10-2009-0055443 | 6/2009 |
| KR | 10-2010-0020834 | 2/2010 |
| KR | 20100020834 | 2/2010 |
| KR | 10-2010-0032812 | 3/2010 |
| KR | 20100032812 | 3/2010 |
| KR | 10-1114219 | 2/2012 |
| KR | 10-1114219 | 3/2012 |
| TW | 538327 | 6/2003 |
| TW | I226380 | 1/2005 |
| TW | 2006-06-21 | 6/2006 |
| TW | 200701301 | 1/2007 |
| TW | 200731357 | 8/2007 |
| TW | 201247690 | 12/2012 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004008827 | 1/2004 |
| WO | 2004010467 | 1/2004 |
| WO | 2005112082 | 11/2005 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2006114781 | 11/2006 |
| WO | 2007027165 | 3/2007 |
| WO | 2007117718 | 10/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2010118051 | 1/2011 |
| WO | 2011019950 | 2/2011 |
| WO | 2011149640 | 12/2011 |
| WO | 2012077590 | 6/2012 |
| WO | 2013078065 | 5/2013 |
| WO | 2013078066 | 5/2013 |
| WO | 2014107290 | 7/2014 |
| WO | 2015107009 | 7/2015 |
| WO | 2018109553 | 6/2016 |
| WO | 2018109554 | 6/2016 |
| WO | 2017108713 | 6/2017 |
| WO | 2017108714 | 6/2017 |
| WO | 2017212546 | 12/2017 |
| WO | 2018008088 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2008045972 | 4/2018 |
| WO | 2018-06-21 | 6/2018 |
| WO | 2018109552 | 6/2018 |

OTHER PUBLICATIONS

USPTO; Office Action dated Jan. 10, 2013 in U.S. Appl. No. 13/339,609.
USPTO; Restriction Requirement dated Oct. 29, 2013 in U.S. Appl. No. 13/439,528.
UPPTO; Notice of Allowance dated Oct. 21, 2014 in U.S. Appl. No. 13/439,528.
USPTO; Final Office Action dated Jun. 1, 2015 in U.S. Appl. No. 13/597,108.
USPTO; Non-Final Office Action dated May 25, 206 in U.S. Appl. No. 13/727,324.
USPTO; Final Office Action dated Aug. 28, 2015 in U.S. Appl. No. 14/03 L982.
USPTO; Notice of Allowance dated Nov. 17, 2015 in U.S. Appl. No. 14/03 L982.
USPTO; Final Office Action dated Feb. 11, 2016 U.S. Appl. No. 14/090,750.

(56) References Cited

OTHER PUBLICATIONS

USPTO; Non-Final Office Action dated Mar. 14, 2017 in U.S. Appl. No. 14/938,180.
USPTO; Non-Final Office Action dated Aug. 12, 2016 in U.S. Appl. No. 14/981,434.
USPTO; Notice of Allowance dated Jul. 6, 2015 in U.S. Appl. No. 29/447,298.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
Chang et al. "Small-Subthreshold-Swing and Low-Voltage Flexible Organic Thin-Film Transistors Which Use HfLaO as the Gate Dielectric," IEEE Electron Device Letters, pp. 133-135; vol. 30, No. 2; IEEE Electron Device Society (2009).
Choi et al., "Improvement of Silicon Direct Bonding using Surfaces Activated by Hydrogen Plasma Treatement," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) p. 114-p. 116 (2013).
Dingemans et al., "Comparison Between Aluminum Oxide Surface Passivation Films Deposited with Thermal Aid," Plasma Aid and Pecvd, 35th IEEE PVCS, Jun. (2010).
Jones et al., "Growth of Aluminium Films by Low Pressure Chemical Vapour Deposition Using Tritertiarybutylaluminium," Journal of Crystal Growth 135, pp. 285-289, Elsevier Science B.V. (1994).
Kim et al., "Characteristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Knoops et al., "Atomic Layer Deposition of Silicon Nitride from Bis(tert-butyloamino) silane and N2 Plama," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon, Nov. 5-7, Brno, Czech Republic, EU (2014).
Liu et al., "Research, Design, and Experimen of End Effector for Wafer Transfer Robot," Industrial Robot: An International Journal, 79-91 (2012).
Maeno, "Gecko Tape Using Carbon Nanotubes," Nitto Denko Gihou, 47, 48-51 (2009).
Maeng et al. Electrical properties of atomic layer disposition Hf02 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Marsik et al., "Effect of Ultraviolet Curing Wavelength on Low-k Dielectric Material Proerties and Plasma Damage Resistance," Sciencedirect.com, 519, 11, 3619-3626 (2011).
Nigamananda et al., "Low-Temperature (<200oC) Plasma Enhanced Atomic Deposition of Dense Titanium Nitride Thin Films." (2012).
Novaro et al. Theoretical Study on a Reaction Pathway of Ziegler-Natta-Type Catalysis, J. Chem. Phys. 68(5), p. 2337-2351 (1978).
Presser, et al., "Effect of Pore Size on Carbon Dioxide Sorption by Carbide Derived Caton," Energy & Environmental Science 4.8, 3059-3066 (2011).
Provine et al., "Correlation of Film Density and Wet Etch Rate in Hydrofluoric Acid of Plama Enhanced Atomic Layer Deposited Silicon Nitride," AIP Advances, 6 (2016).
Radamson et al. "Growth of Sn-alloyed Group IV Materials for Photonic and Electronic Applications", Chapter 5 pp. 129-144, Manufacturing NanoStructures.

Athavale et al., "Realization of Atomic Layer Etching of Silicon", Journal of Vacuum Science and Technology B, vol. 14, pp. 3702-3705 (1996).
Shamnia et al., "PDL Oxide Enabled Doubling," Proc. of SPIE, 6924, 69240D, 1-10 (2008).
Yun et al., "Behavior of Various Organosilicon Molecules in PECVD Processes for Hydrocathon-Doped Silicon Oxide Films," Solid State Phenomena, vol. 124-126, 347-350 (2007).
USPTO; Final Office Action dated 065/17/2018 in U.S. Appl. No. 15/222,780.
King et al., "Atomic Layer Deposition of Amorphous Niobium Carbide-Based Thin Film Superconductors"The Journal of Physical Chemistry, 115, pp. 25063-25071 (2011).
Potts et al., "Room-Temperature ALD of Metal Oxide Thin Films by Energy-Enhanced ALD", Chemical Vapor Desposition, col. 19, 99. 125-133 (2013).
Voltaix, "Trisilylamine", Material Safety Data Sheet (2014).
Tseng et al, "Enhanced Block Copolymer Lithography Using Sequential Infiltration Synthesis," Journal of Physical Chemistry, Col. 115, pp. 17725-17729 (2011).
Tseng et al, "Etch Properties of Resists Modified by Sequential Infiltration Synthesis,", American Vacuum Society, FG01-4 (2011).
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Mar. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.

(56) References Cited

OTHER PUBLICATIONS

USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Restriction Requirement dated Dec. 20, 2011 in U.S. Appl. No. 12/436,306.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Advisory Action dated Oct. 1, 2014 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Non- Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Notice of Allowance dated Oct. 9, 2013 in U.S. Appl. No. 12/618,419.
USPTO; Requirement for Restriction dated Sep. 12, 2011 in U.S. Appl. No. 12/718,731.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.

(56) References Cited

OTHER PUBLICATIONS

USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Requirement for Restriction dated Jul. 22, 2013 in U.S. Appl. No. 12/910,607.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Requirement for Restriction dated Sep. 10, 2010 in U.S. Appl. No. 12/148,956.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Requirement for Restriction dated Jun. 5, 2014 in U.S. Appl. No. 13/154,271.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Requirement for Restriction dated Apr. 6, 2016 in U.S. Appl. No. 13/166,367.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Requirement for Restriction dated Jun. 18, 2014 in U.S. Appl. No. 13/169,951.
USPTO; Non-Final Office Action dated Oct. 27, 2014 in U.S. Appl. No. 13/169,951.

(56) References Cited

OTHER PUBLICATIONS

USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Requirement for Restriction Sep. 25, 2012 in U.S. Appl. No. 13/184,351.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Restriction Requirement dated Aug. 21, 2014 in U.S. Appl. No. 13/187,300.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Restriction Requirement dated Oct. 2, 2013 in U.S. Appl. No. 13/312,591.
USPTO; Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Requirement for Restriction dated Nov. 26, 2013 in U.S. Appl. No. 13/333,420.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Requirement for Restriction dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.

(56) References Cited

OTHER PUBLICATIONS

USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
USPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 01, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Restriction Requirement dated Jul. 9, 2013 in U.S. Appl. No. 13/612,538.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Notice of Allowance dated Feb. 25, 2015 in U.S. Appl. No. 13/612,538.
USPTO; Requirement for Restriction dated Feb. 4, 2015 in U.S. Appl. No. 13/646,403.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Requirement for Restriction dated Apr. 11, 2014 in U.S. Appl. No. 13/646,471.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.

(56) References Cited

OTHER PUBLICATIONS

USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Restriction Requirement dated Mar. 4, 2015 in U.S. Appl. No. 13/651,144.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
Uspto; Non-Final Office Action dated Nov. 19, 2015 in Application No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Requirement for Restriction dated Dec. 24, 2014 in U.S. Appl. No. 13/665,366.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.

(56) References Cited

OTHER PUBLICATIONS

USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Sep. 1, 2016 in U.S. Appl. No. 14/827,177.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Requirement for Restriction dated Sep. 4, 2014 in U.S. Appl. No. 13/915,732.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action Restriction dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.

(56) References Cited

OTHER PUBLICATIONS

USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Requirement for Restriction dated Aug. 11, 2015 in U.S. Appl. No. 14/090,750.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Notice of Allowance dated Aug. 31, 2015 in U.S. Appl. No. 14/183,187.
USPTO; Final Office Action dated Jul. 10, 2015 in U.S. Appl. No. 14/183,187.
USPTO; Requirement for Restriction dated Sep. 24, 2015 in U.S. Appl. No. 14/188,760.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Restriction Requirement dated May 20, 2016 in U.S. Appl. No. 14/218,690.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Requirement for Restriction dated Jun. 15, 2015 in U.S. Appl. No. 14/268,348.

(56) References Cited

OTHER PUBLICATIONS

USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 30, 2016 in U.S. Appl. No. 14/268,348.
USPTO; Requirement for Restriction dated May 21, 2015 in U.S. Appl. No. 14/281,477.
USPTO; Non-Final Office Action dated Oct. 20, 2015 in U.S. Appl. No. 14/281,477.
USPTO; Advisory Action dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action Dated Jul. 27, 2018 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated May 31, 2018 in U.S. Appl. No. 15/491,726.
USPTO; Requirement for Restriction dated Sep. 3, 2015 in U.S. Appl. No. 14/498,036.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Requirement for Restriction dated Mar. 20, 2015 in U.S. Appl. No. 14/505,290.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Restriction for Requirement dated Dec. 30, 2016 in U.S. Appl. No. 14/508,489.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Restriction Requirement dated Mar. 7, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.

(56) References Cited

OTHER PUBLICATIONS

USPTO; Non-Final Office Action dated Sep. 27, 2016 in U.S. Appl. No. 14/606,354.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Requirement for Restriction dated Oct. 26, 2015 in U.S. Appl. No. 14/659,152.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Non-Final Office Action dated Sep. 7, 2017 in U.S. Appl. No. 14/660,755.
USPTO; Restriction Requirement dated Sep. 11, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Requirement for Restriction dated Jul. 5, 2017 in U.S. Appl. No. 14/752,712.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Requirement for Restriction dated Mar. 17, 2016 in U.S. Appl. No. 14/827,177.
USPTO; Notice of Allowance dated Jan. 27, 2017 in U.S. Appl. No. 14/827,177.
USPTO; Requirement for Restriction dated Aug. 8, 2016 in U.S. Appl. No. 14/829,565.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Requirement for Restriction dated Dec. 1, 2016 in U.S. Appl. No. 14/886,571.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Requirement for Restriction dated Sep. 20, 2016 in U.S. Appl. No. 14/919,536.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Requirement for Restriction dated Sep. 15, 2016 in U.S. Appl. No. 14/938,180.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.

(56) References Cited

OTHER PUBLICATIONS

USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
Uspto; Non-Final Office Action dated Aug. 12, 2016 in Application No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Requirement for Restriction dated Apr. 19, 2017 in U.S. Appl. No. 15/050,159.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Requirement for Restriction dated Jun. 4, 2018 in U.S. Appl. No. 15/067,028.
USPTO; Requirement for Restriction dated Jun. 28, 2018 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Jan. 9, 2018 in U.S. Appl. No. 15/135,333.
USPTO; Non Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Requirement for Restriction dated Jun. 22, 2018 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Requirement for Restriction dated Jan. 26, 2017 in U.S. Appl. No. 15/205,890.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Requirement for Restriction dated Apr. 3, 2017 in U.S. Appl. No. 15/222,715.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated Feb. 3, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO; Final Office Action dated Jun. 4, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.

(56) References Cited

OTHER PUBLICATIONS

USPTO; Requirement for Restriction dated Dec. 5, 2017 in U.S. Appl. No. 15/254,605.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Aug. 3, 2018 in U.S. Appl. No. 15/273,488.
USPTO; Non-Final Office Action dated Jul. 2, 2018 in U.S. Appl. No. 15/286,503.
USPTO; Requirement for Restriction dated Sep. 12, 2017 in U.S. Appl. No. 15/377,439.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated Jan. 4, 2018 in U.S. Appl. No. 15/380,921.
USPTO; Requirement for Restriction dated Sep. 21, 2017 in U.S. Appl. No. 15/380,921.
USPTO; Final Office Action dated Jun. 28, 2018 in U.S. Appl. No. 15/380,921.
USPTO; Final Office Action dated May 15, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Aug. 7, 2018 in U.S. Appl. No. 15/428,808.
USPTO; Non-Final Office Action dated Apr. 6, 2018 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Notice of Allowance dated Dec. 19, 2017 in U.S. Appl. No. 15/489,660.
USPTO; Non-Final Office Action dated Apr. 6, 2018 in U.S. Appl. No. 15/472,750.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Office Action dated May 3, 2018 in U.S. Appl. No. 15/589,861.
USPTO; Requirement of Restriction dated Mar. 30, 2018 in U.S. Appl. No. 15/589,849.
USPTO; Office Action dated Aug. 30, 2018 in U.S. Appl. No. 15/589,849.
USPTO; Non-Final Office Action dated Apr. 4, 2018 in U.S. Appl. No. 15/592,730.
USPTO; Requirement for Restriction dated Aug. 1, 2018 in U.S. Appl. No. 15/627,189.
USPTO; Non-Final Office Action dated Jun. 5, 2018 in U.S. Appl. No. 15/650,686.
USPTO; Requirement for Restriction dated Apr. 6, 2018 in U.S. Appl. No. 15/659,631.
USPTO; Non-Final Office Action dated Aug. 9, 2018 in U.S. Appl. No. 15/660,805.
USPTO; Non-Final Office Action dated Jul. 27, 2018 in U.S. Appl. No. 15/673,110.
USPTO; Non-Final Office Action dated Apr. 25, 2018 in U.S. Appl. No. 15/673,278.
USPTO; Non-Final Office Action dated Jan. 18, 2018 in U.S. Appl. No. 15/683,701.
USPTO; Final Office Action dated Aug. 24, 2018 in U.S. Appl. No. 15/683,701.
USPTO; Non-Final Office Action dated Aug. 9, 2018 in U.S. Appl. No. 15/691,241.
USPTO; Requirement for Restriction dated Jul. 11, 2018 in U.S. Appl. No. 15/707,786.
USPTO; Requirement for Restriction dated May 11, 2018 in U.S. Appl. No. 15/711,989.
USPTO; Non-Final Office Action dated Jun. 14, 2018 in U.S. Appl. No. 15/711,989.
USPTO; Non-Final Office Action dated May 29, 2018 in U.S. Appl. No. 15/719,208.
USPTO; Non-Final Office Action dated Apr. 19, 2018 in U.S. Appl. No. 15/726,959.
USPTO; Non-Final Office Action dated May 17, 2018 in U.S. Appl. No. 15/729,485.
USPTO; Non-Final Office Action dated Jun. 26, 2018 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Requirement for Restriction dated Apr. 6, 2018 in U.S. Appl. No. 15/798,201.
USPTO; Non-Final Office Action dated Aug. 9, 2018 in U.S. Appl. No. 15/798,201.
USPTO; Non-Final Office Action dated Jul. 2, 2018 in U.S. Appl. No. 15/815,483.
USPTO; Requirement for Restriction dated Mar. 21, 2018 in U.S. Appl. No. 15/863,340.
USPTO; Non-Final Office Action dated Jul. 23, 2018 in U.S. Appl. No. 15/863,340.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul.B 6, 2015 in U.S. Appl. No. 29/447,298.
USPTO; Notice of Allowance dated Dec. 19, 2013 in U.S. Appl. No. 29/448,094.

(56) References Cited

OTHER PUBLICATIONS

USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Requirement for Restriction dated Dec. 1, 2014 in U.S. Appl. No. 29/481,312.
USPTO; Notice of Allowance dated Jan. 12, 2015 in U.S. Appl. No. 29/481,312.
USPTO; Requirement for Restriction dated Dec. 4, 2014 in U.S. Appl. No. 29/481,315.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Notice of Allowance dated Jun. 26, 2018 in U.S. Appl. No. 29/604,288.
PCT; International Preliminary Report on Patentability dated Nov. 24, 2009 and International Search Report dated Jul. 31, 2008 in Application No. PCT/US2008/063919.
PCT; International Preliminary Report on Patentability dated Feb. 24, 2010 in Application No. PCT/US2008/074063.
PCT; International Preliminary Report on Patentability dated Nov. 26, 2009 in Application No. PCT/US2009/043454.
PCT; International Preliminary Report on Patentability dated Jun. 14, 2011 in Application No. PCT/US2009/066377.
PCT; International Preliminary Report on Patentability dated Oct. 11, 2011 in Application No. PCT/US2010/030126.
PCT; International Preliminary Report on Patentability dated Nov. 9, 2011 in Application No PCT/US2010/03344.
PCT; International Preliminary Report on Patentability dated Nov. 9, 2011 in Application No. PCT/US2010/033248.
PCT; International Preliminary Report on Patentability dated Nov. 9, 2011 in Application No PCT/US2010/033252.
PCT; International Search report and Written Opinion dated Jan. 20, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
PCT; International Search Report and Written Opinion dated Nov. 16, 2017 in Application No. PCT/IB2017/001015.
PCT; International Search Report and Written Opinion dated Nov. 13, 2017 in Application No. PCT/IB2017/001050.
PCT; International Search Report and Written Opinion dated Nov. 30, 2017 in Application No. PCT/IB2017/001070.
PCT; International Search Report and Written Opinion dated Jan. 25, 2018 in Application No. PCT/IB2017/001262.
PCT; International Search Report and Written Opinion dated Jun. 1, 2018 in Application No. PCT/IB2017/001644.
PCT; International Search Report and Written Opinion dated Jun. 1, 2018 in Application No. PCT/IB2017/001656.
Chinese Patent Office; Office Action dated Jan. 10, 2013 in Application No. 201080015699.9.
Chinese Patent Office; Office Action dated Aug. 01, 2013 in Application No. 201080015699.9.
Chinese Patent Office; Office Action dated Jan. 21, 2014 in Application No. 201080015699.9.
Chinese Patent Office; Office Action dated Jul. 24, 2014 in Application No. 201080015699.9.
Chinese Patent Office; Office Action dated Jan. 12, 2015 in Application No. 201080015699.9.
Chinese Patent Office; Office Action dated Dec. 10, 2013 in Application No. 201080020267.7.
Chinese Patent Office; Office Action dated Jan. 21, 2013 in Application No. 201080020268.1.
Chinese Patent Office; Office Action dated Sep. 26, 2013 in Application No. 201080020268.1.
Chinese Patent Office; Office Action dated Apr. 3, 2014 in Application No. 201080020268.1.
Chinese Patent Office; Office Action dated Sep. 23, 2014 in Application No. 201080020268.1.
Chinese Patent Office; Office Action dated Apr. 7, 2015 in Application No. 201080020268.1.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Chinese Patent Office; Office Action dated Dec. 4, 2015 in Application No. 201210201995.9.
Chinese Patent Office; Office Action dated Jul. 14, 2016 in Application No. 201210201995.9.
Chinese Patent Office; Office Action dated Jan. 20, 2017 in Application No. 201210201995.9.
Chinese Patent Office; Office Action dated Dec. 24, 2015 in Application No. 201280057466.4.
Chinese Patent Office; Office Action dated Dec. 4, 2015 in Application No. 201280057542.1.
Chinese Patent Office; Office Action dated May 16, 2016 in Application No. 201280057542.1.
Chinese Patent Office; Office Action dated Sep. 9, 2016 in Application No. 201280057542.1.
Chinese Patent Office; Office Action dated Dec. 5, 2016 in Application No. 201310412808.6.
Chinese Patent Office; Office Action dated Feb. 5, 2018 in Application No. 201410331047.6.
European Patent Office; Supplementary European Search Report and Opinion dated Nov. 09, 2012 in Application No. 08798519.8.
European Patent Office; Office Action dated Jul. 18, 2016 in Application No. 08798519.8.
European Patent Office; Extended European Search Report dated Dec. 9, 2016 in Application No. 9767208.3.
European Patent Office; Supplementary European Search Report and Opinion dated Jan. 5, 2017 in Application No. 09836647.9.
European Patent Office; Office Action dated Feb. 28, 2018 in Application No. 09836647.9.
Japanese Patent Office; Office Action dated Dec. 20, 2011 in Application No. 2010-522075.
Japanese Patent Office; Office Action dated Apr. 11, 2012 in Application No. 2010-522075.
Japanese Patent Office; Office Action dated May 31, 2012 in Application No. 2011-514650.
Japanese Patent Office; Office Action dated Sep. 11, 2012 in Application No. 2011-514650.
Japanese Patent Office; Office Action dated Dec. 25, 2013 in Application No. 2012-504786.
Japanese Patent Office; Office Action dated Jan. 25, 2014 in Application No. 2012-504786.
Japanese Patent Office; Office Action dated Dec. 1, 2014 in Application No. 2012-504786.
Japanese Patent Office; Office Action dated Mar. 11, 2013 in Application No. 2012-509857.
Korean Patent Office; Office Action dated Dec. 10, 2015 in Application No. 10-2010-0028336.
Korean Patent Office; Final Office Action dated Jun. 29, 2016 in Application No. 10-2010-0028336.
Korean Patent Office; Office Action dated Mar. 3, 2016 in Application No. 10-2010-0067768.

(56) References Cited

OTHER PUBLICATIONS

Korean Patent Office; Office Action dated Aug. 1, 2016 in Application No. 10-2010-0067768.
Korean Patent Office; Office Action dated May 2, 2016 in Application No. 10-2010-0082446.
Korean Patent Office; Office Action dated Sep. 19, 2016 in Application No. 10-2010-0082446.
Korean Patent Office; Office Action dated Nov. 24, 2017 in Application No. 10-20110036449.
Korean Patent Office; Office Action dated May 23, 2017 in Application No. 10-20110036449.
Korean Patent Office; Office Action dated Sep. 4, 2017 in Application No. 10-2011-0087600.
Korean Patent Office; Office Action dated Oct. 23, 2017 in Application No. 10-2011-0142924.
Korean Patent Office; Office Action dated Dec. 11, 2015 in Application No. 10-20117023416.
Korean Patent Office; Office Action dated Mar. 13, 2016 in Application No. 10-20117023416.
Korean Patent Office; Office Action dated Oct. 30, 2017 in Application No. 10-2012-0041878.
Korean Patent Office; Office Action dated Mar. 21, 2018 in Application No. 20120042518.
Korean Patent Office; Office Action dated Mar. 21, 2018 in Application No. 10-2012-0064526.
Korean Patent Office; Office Action dated Mar. 30, 2018 in Application No. 10-2012-0076564.
Korean Patent Office; Office Action dated Apr. 30, 2018 in Application No. 10-2012-0103114.
Korean Patent Office; Office Action dated Oct. 24, 2016 in Application No. 10-20127004062.
Korean Patent Office; Office Action dated Jul. 24, 2017 in Application No. 10-20127004062.
Korean Patent Office; Office Action dated Sep. 28, 2017 in Application No. 10-20147017112.
Korean Patent Office; Office Action dated Nov. 9, 2016 in Application No. 10-20167023913.
Korean Patent Office; Office Action dated Sep. 15, 2017 in Application No. 30-2017-0001320.
Korean Patent Office; Office Action dated Jul. 11, 2018 in Application No. 30-2018-006016.
Taiwanese Patent Office; Office Action dated Aug. 30, 2013 in Application No. 97132391.
Taiwanese Patent Office; Office Action dated Dec. 20, 2013 in Application No. 98117513.
Taiwan Patent Office; Office Action dated Jul. 4, 2014 in Application No. 099110511.
Taiwanese Patent Office; Office Action dated Aug. 27, 2014 in Application No. 99114329.
Taiwanese Patent Office; Office Action dated Dec. 26, 2014 in Application No. 99114330.
Taiwanese Patent Office; Office Action dated Aug. 14, 2014 in Application No. 99114331.
Taiwan Patent Office; Office Action dated Dec. 19, 2014 in Taiwan Application No. 099127063.
Taiwanese Patent Office; Office Action received in Application No. 100113130.
Taiwan Patent Office; Office Action dated May 13, 2016 in Taiwan Application No. 101142582.
Taiwanese Patent Office; Office Action dated Aug. 1, 2016 in Application No. 101124745.
Taiwanese Patent Office; Office Action received in Application No. 102113028.
Taiwanese Patent Office; Office Action received in Application No. 102115605.
Taiwanese Patent Office; Office Action dated Feb. 24, 2017 in Application No. 102115605.
Taiwanese Patent Office; Office Action received in Application No. 102125191.
Taiwanese Patent Office; Office Action dated Dec. 6, 2016 in Application No. 102126071.
Taiwanese Patent Office; Office Action dated May 17, 2018 in Application No. 102126071.
Taiwanese Patent Office; Office Action dated Feb. 10, 2017 in Application No. 102127065.
Taiwanese Patent Office; Office Action dated Mar. 11, 2016 in Application No. 102129262.
Taiwanese Patent Office; Office Action dated Dec. 29, 2016 in Application No. 102129397.
Taiwanese Patent Office; Office Action dated Nov. 4, 2016 in Application No. 102131839.
Taiwanese Patent Office; Office Action dated Dec. 2, 2016 in Application No. 102136496.
Taiwanese Patent Office; Office Action dated Jan. 10, 2018 in Application No. 102136496.
Taiwanese Patent Office; Office Action dated Nov. 11, 2016 in Application No. 102132952.
Taiwanese Patent Office; Office Action dated Jul. 17, 2017 in Application No. 103101400.
Taiwanese Patent Office; Office Action dated Feb. 23, 2017 in Application No. 103102563.
Taiwanese Patent Office; Office Action dated Mar. 3, 2017 in Application No. 103105251.
Taiwanese Patent Office; Office Action received in Application No. 103106021.
Taiwanese Patent Office; Office Action dated Oct. 31, 2017 in Application No. 103106022.
Taiwanese Patent Office; Office Action dated Jul. 5, 2017 in Application No. 103117477.
Taiwanese Patent Office; Office Action dated Nov. 22, 2017 in Application No. 103117478.
Taiwanese Patent Office; Office Action dated May 19, 2017 in Application No. 103120478.
Taiwanese Patent Office; Office Action dated Nov. 8, 2017 in Application No. 103124509.
Taiwanese Patent Office; Office Action dated Nov. 20, 2017 in Application No. 103127588.
Taiwanese Patent Office; Office Action dated Sep. 19, 2017 in Application No. 103127734.
Taiwanese Patent Office; Office Action dated Nov. 22, 2017 in Application No. 103134537.
Taiwanese Patent Office; Office Action dated Aug. 24, 2017 in Application No. 103136251.
Taiwanese Patent Office; Office Action dated Feb. 26, 2018 in Application No. 103138510.
Taiwanese Patent Office; Office Action dated May 21, 2018 in Application No. 103139014.
Taiwanese Patent Office; Office Action dated Jun. 22, 2018 in Application No. 104105533.
Taiwanese Patent Office; Office Action dated Jun. 13, 2018 in Application No. 104111910.
Taiwanese Patent Office; Office Action received in Application No. 106117181.
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al., "Sub-100nm Gate Length Metal Gate NMOS Transistors Fabricated by a Replacement by a Replacement Gate Process," IEEE Semiconductor Process and Device Center, 821-824 (1997).

(56) References Cited

OTHER PUBLICATIONS

Chen et al., "A Self-Aligned Airgap Interconnect Scheme," IEEE International Interconnect Technology Conference, vol. 1-3, 146-148 (2009).

Choi et al., "Improvement of Silicon Direct Bonding using Surfaces Activated by Hydrogen Plasma Treatment," Journal of the Korean Physical Society, 37, 6, 878-881 (2000).

Choi et al., "Low Temperature Formation of Silicon Oxide Thin Films by Atomic Layer Deposition Using NH3/O2 Plasma," ECS Solid State Letters, 2(12) P114-P116 (2013).

Coates, "Process Analytical Technology: Spectroscopic Tools and Implementation Strategies for the Chemical and Pharmaceutical Industries." Blackwell Publishing Ltd, 91-132, (2005).

Crowell, "Chemical methods of thin film deposition: Chemical vapor deposition, atomic layer deposition, and related technologies," Journal of Vacuum Science & Technology a 21.5, (2003): S88-S95.

Cui et al., "Impact of Reductive N2/H2 Plasma on Porous Low-Dielectric Constant SiCOH Thin Films," Journal of Applied Physics 97, 113302, 1-8 (2005).

Dingemans et al., "Comparison Between Aluminum Oxide Surface Passivation Films Deposited with Thermal Aid,"Plasma Aid and Pecvd, 35th IEEE PVCS, June (2010).

Drummond et al., "Hydrophobic Radiofrequency Plasma-Deposited Polymer Films: Dielectric Properties and Surface Forces," Colloids and Surfaces A, 129-130, 117-129 (2006).

Easley et al., "Thermal Isolation of Microchip Reaction Chambers for Rapid Non-Contact DNA Amplification," J. Micromech. Microeng. 17, 1758-1766 (2007).

Elam et al., "New Insights into Sequential Infiltration Synthesis", ECS Transactions, vol. 69, pp. 147-157 (2015).

Ge et al., "Carbon Nanotube-Based Synthetic Gecko Tapes," Department of Polymer Science, PNAS, 10792-10795 (2007).

George et al., "Atomic Layer Deposition: An Overview," Chem. Rev. 110, 111-131 (2010).

Grill et al., "The Effect of Plasma Chemistry on the Damage Induced Porous SiCOH Dielectrics," IBM Research Division, RC23683 (W0508-008), Materials Science, 1-19 (2005).

Guan et al., "Voltage gated ion and molecule transport in engineered nanochannels: theory, fabrication and applications," Nanotechnology 25 (2014) 122001.

Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).

Harrison et al., "Poly-gate Replacement Through Contact Hole (PRETCH): A New Method for High-K/ Metal Gate and Multi-Oxide Implementation on Chip," IEEE (2004).

Heo et al., "Structural Characterization of Nanoporous Low-Dielectric Constant SiCOH Films Using Organosilane Precursors," NSTI-Nanotech, vol. 4, 122-123 (2007).

Henke et al., "X-Ray Interactions: Photo absorption, Scattering, Transmission, and Reflection at E = 50-30,000 eV, Z = 1-92," Atomic Data and Nuclear Data Tables, 54, 181-342 (1993).

H.J. Yun et al., "Comparison of Atomic Scale Etching of Poly-Si in Inductively Coupled Ar and He Plasmas", Korean Journal of Chemical Engineering, vol. 24, 670-673 (2007).

Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637 — 640 (2009).

Hudis, "Surface Crosslinking of Polyethylene Using a Hydrogen Glow Discharge," J. Appl. Polym. Sci., 16 (1972) 2397.

Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).

Jones et al., "Recent Developments in Metalorganic Precursors for Metalorganic Chemical Vapour Deposition," Journal of Crystal Growth 146, pp. 503-510, Elsevier Science B.V. (1995).

Jung et al., "Double Patterning of Contact Array with Carbon Polymer," Proc. Of SPIE, 6924, 69240C, 1-10 (2008).

Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).

Kim et al., "Passivation Effect on Low-k S/OC Dielectrics by H2 Plasma Treatment," Journal of the Korean Physical Society, 40, 1, 94-98 (2002).

Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).

King, Plasma Enhanced Atomic Layer Deposition of SiNx: H and SiO2, J. Vac. Sci. Technol., A29(4) (2011).

Klug et al., "Atomic Layer Deposition of Amorphous Niobium Carbide-Based Thin Film Superconductors," The Journal of Physical Chemistry C, vol. 115, Pgs. 25063-25071, (2011).

Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).

Koo et al., "Characteristics of A1203 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

Koutsokeras et al. "Texture and Microstructure Evolution in Single-Phase TixTa1—xN Alloys of Rocksalt Structure," Journal of Applied Physics, 110, pp. 043535-1-043535-6, (2011).

Knoops et al., "Atomic Layer Deposition of Silicon Nitride from Bis(tert-butyloamino) silane and N2 Plasma," Applied Materials & Interfaces, American Chemical Society, A-E (2015).

Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5th-7th, Brno, Czech Republic, EU.

Kurosawa et al., "Synthesis and Characterization of Plasma-Polymerized Hexamethyldisiloxane Films," Thin Solid Films, 506-507, 176-179 (2006).

Lanford et al., "The Hydrogen Content of Plasmadeposited Silicon Nitride," J. Appl. Phys., 49, 2473 (1978).

Lee et al., Layer Selection by Multi-Level Permutation in 3-D Stacked NAND Flash Memory, IEEE Electron Device Letters, vol. 37, No. 7, 866-869 (2016).

Lieberman, et al., "Principles of Plasma Discharges and Materials Processing," Second Edition, 368-381.

Lim et al., "Low-Temperature Growth of SiO2 Films by Plasma-Enhanced Atomic Layer Deposition," ETRI Journal, 27 (1), 118-121 (2005).

Liu et al., "Research, Design, and Experiment of End Effector for Wafer Transfer Robot," Industrial Robot: An International Journal, 79-91 (2012).

Longrie et al., "Plasma-Enhanced ALD of Platinum with O2, N2 and NH3 Plasmas", ECS Journal of Solid State Science and Technology, vol. 1, pp. Q123-Q129 (2012).

Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).

Maeno, "Gecko Tape Using Carbon Nanotubes," Nitto Denko Gihou, 47, 48-51.

Maeng et al. Electrical properties of atomic layer disposition Hf02 and HfOxNy on Si substrates with various crystal orientations, Journal of the Electrochemical Society, 2008-04, p. H267-H271, vol. 155, No. 4, Department of Materials Science and Engineering, Pohang University of Science and Technology, Pohang, Korea.

Marsik et al., "Effect of Ultraviolet Curing Wavelength on Low-k Dielectric Material Properties and Plasma Damage Resistance," Sciencedirect.com, 519, 11, 3619-3626 (2011).

(56) References Cited

OTHER PUBLICATIONS

Mason et al., "Hydrolysis of Tri-tert-butylaluminum: The First Structural Characterization of Alkylalumoxanes [(R2Al)2O]n and (RAlO)n," J. American Chemical Society, vol. 115, No. 12, pp. 4971-4984 (1993).
Massachusetts Institute of Technology Lincoln Laboratory, "Solid State Research," Quarterly Technical Report (1995).
Maydannik et al., "Spatial atomic layer deposition: Performance of low temperature H2O and O3oxidant chemistry for flexible electronics encapsulation", Journal of Vacuum Science and Technology: Part A AVS/AIP, vol. 33 (1901).
Meng et al., "Atomic Layer of Deposition of Silicon Nitride Thin Films: A Review of Recent Progress, Challenges, and Outlooks," Materials, 9, 1007 (2016).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnC14 Precursor," ECS Transactions, 69 (5), 279-285 (2015).
Mukai et al., "A Study of CD Budget in Spacer Patterning Technology," Proc. Of SPIE, 6924, 1-8 (2008).
Nigamananda et al., "Low-Temperature (<200oC) Plasma Enhanced Atomic Deposition of Dense Titanium Nitride Thin Films."
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
S. Okamoto et al., "Luminescent Properties of Pr3+—sensitized LaPO4: Gd3+Ultraviolet-B Phosphor Under Vacuum-Ultraviolet Light Excitation," J. App. Phys. 106, 013522 (2009).
Park "Substituted Aluminum Metal Gate on High-K Dielectric for Low Work-Function and Fermi-Level Pinning Free," 4 pages, IEEE 0/7803-8684-1/04 (2004).
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature Ald of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plasma Enhanced Atomic Layer Deposited Silicon Nitride," AIP Advances, 6 (2016).
Radamson et al. "Growth of Sn-alloyed Group IV Materials for Photonic and Electronic Applications", Chapter 5 pp. 129-144, Manugacturing Nano Structures.
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
S.D. Athavale and D.J. Economou, "Realization of Atomic Layer Etching of Silicon", Journal of Vacuum Science and Technology B, col. 14, year 1996, pp. 3702-3705.
Shamma et al., "PDL Oxide Enabled Doubling," Proc. Of SPIE, 6924, 69240D, 1-10 (2008).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67(10), Sep. 4, pp. 1384-1386, American Institute of Physics (1995).
Wirths, et al, "SiGeSn Growth tudies Using Reduced Pressure Chemical Vapor Deposition Towards Optoeleconic Applications," This Soid Films, 557, 183-187 (2014).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Chemistry Stack Exchange, "Why is CF4 Non-Polar and CHF Polar," https://chemistry.stackexchange.com/questions/31604/why-is-cf4-non-polar-and-chf3-polar, (2015).
USPTO; Notice of Allowance dated Jun. 28, 2017 in U.S. Appl. No. 13/166,367.
USPTO; Non-Final Office Action dated Sep. 20, 2018 in U.S. Appl. No. 13/651,144.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Notice of Allowance dated Aug. 29, 2018 in U.S. Appl. No. 14/090,750.
USPTO; Notice of Allowance dated Sep. 24, 2018 in U.S. Appl. No. 14/218,690.
USPTO; Final Office Action dated Sep. 5, 2018 in U.S. Appl. No. 14/752,712.
USPTO; Advisory Action dated Aug. 10, 2018 in U.S. Appl. No. 14/829,565.

(56) References Cited

OTHER PUBLICATIONS

USPTO; Non-Final Office Action dated Sep. 6, 2018 in U.S. Appl. No. 14/829,565.
USPTO; Notice of Allowance dated Oct. 20, 2017 in U.S. Appl. No. 14/884,695.
USPTO; Notice of Allowance dated Oct. 4, 2018 in U.S. Appl. No. 14/919,536.
USPTO; Non-Final Office Action dated Aug. 27, 2018 in U.S. Appl. No. 15/067,028.
USPTO; Notice of Allowance dated Oct. 14, 2018 in U.S. Appl. No. 15/135,333.
USPTO; Notice of Allowance dated May 22, 2017 in U.S. Appl. No. 15/222,738.
USPTO; Notice of Allowance dated Sep. 10, 2018 in U.S. Appl. No. 15/222,749.
USPTO; Non-Final Office Action dated Oct. 1, 2018 in U.S. Appl. No. 15/222,780.
USPTO; Non-Final Office Action dated Sep. 13, 2018 in U.S. Appl. No. 15/262,990.
USPTO; Non-Final Office Action dated Oct. 3, 2017 in U.S. Appl. No. 15/388,410.
USPTO; Non-Final Office Action dated Sep. 20, 2018 in U.S. Appl. No. 15/410,503.
USPTO; Final Office Action dated Aug. 29, 2018 in U.S. Appl. No. 15/434,051.
USPTO; Non-Final Office Action dated Sep. 10, 2018 in U.S. Appl. No. 15/489,453.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Sep. 21, 2017 in U.S. Appl. No. 15/659,631.
USPTO; Non-Final Office Action dated Aug. 27, 2018 in U.S. Appl. No. 15/662,107.
USPTO; Requirement for Restriction dated Sep. 11, 2018 in U.S. Appl. No. 15/672,063.
USPTO; Requirement for Restriction dated Aug. 14, 2018 in U.S. Appl. No. 15/705,955.
USPTO; Non-Final Office Action dated Oct. 4, 2018 in U.S. Appl. No. 15/726,222.
USPTO; Restriction Requirement dated Aug. 31, 2018 in U.S. Appl. No. 15/795,056.
USPTO; Non-Final Office Action dated Jun. 26, 2018 in U.S. Appl. No. 15/796,693.
USPTO; Non-Final Office Action dated Sep. 10, 2018 in U.S. Appl. No. 15/836,547.
European Patent Office; Office Action dated Aug. 10, 2018 in Application No. 09767208.3.
Korean Patent Office; Office Action dated Apr. 2, 2018 in Application No. 10-2011-0036449.
Korean Patent Office; Office Action dated Sep. 18, 2018 in Application No. 10-2012-0064526.
Korean Patent Office; Office Action dated Sep. 27, 2018 in Application No. 10-2012-0076564.
Korean Patent Office; Office Action dated Sep. 28, 2017 in Application No. 10-2017-7023740.
Taiwanese Patent Office; Office Action dated Sep. 26, 2018 in Application No. 103132230.
Taiwanese Patent Office; Office Action dated May 21, 2018 Application No. 103139014.
Taiwanese Patent Office; Office Action dated Jul. 9, 2018 in Application No. 104107876.
Taiwanese Patent Office; Office Action dated Aug. 7, 2018 Application No. 104107888.
Taiwanese Patent Office; Office Action dated Jul. 9, 2018 in Application No. 104110326.
Taiwanese Patent Office; Office Action dated Jul. 11, 2018 in Application No. 104124377.
Taiwanese Patent Office; Office Action dated Jun. 25, 2018 in Application No. 106138800.
Taiwanese Patent Office; Office Action dated Aug. 31, 2018 in Application No. 10720809210.
WIPO; International Search Report and Written Opinion dated Jul. 9, 2018 in Application No. PCT/IB2018/000419.
WIPO; International Search Report and Written Opinion dated Sep. 14, 2018 in Application No. PCT/IB2017/001640.
Crystal Is "Application Note: Using UV Reflective Materials to Maximize Disinfection"; AN011; Jun. 16, 2016.
Kukli, Kaupo, et al., "Properties of hafnium oxide films grown by atomic layer deposition from hafnium tetraiodide and oxygen". Journal of Applied Physics, vol. 92. No. 10, Nov. 15, 2002, pp. 5698-5703.
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 pp. 62230JI-62230J-11 lines 3-14 in the "Abstract" section and lines 7-9 in the "Introduction" section of p. 1, lines 3-4 in the "Introduction" section and lines 3-4 in the "Experimental Procedure" section of p. 2.
Making Your Own Timber Dogs, Paul Sellers blog, Published on Nov. 18, 2014, [online], [site visted Jun. 10, 2017]. Available from Internet, <URL: https://paulsellers.com/2014/11/making-your-own-.
"Polyurethane_HF"; webpage; no date.
Xu et al., "14NM Metal Gate Film Stack Development and Challenges," SMIC et al. (2016).

\* cited by examiner

METHOD OF FORMING METAL INTERCONNECTION AND METHOD OF FABRICATING SEMICONDUCTOR APPARATUS USING THE METHOD

CROSS-REFERENCE TO RELATED APPLICATION

This application claims the benefit of Korean Patent Application No. 10-2016-0060210, filed on May 17, 2016, in the Korean Intellectual Property Office, the disclosure of which is incorporated herein in its entirety by reference.

BACKGROUND

1. Field

One or more embodiments relate to a method of forming a metal interconnection and a method of fabricating a semiconductor device in the semiconductor device manufacturing apparatus using the method.

2. Description of the Related Art

As the size of semiconductor device shrinks, a response time of the semiconductor device slows down due to line resistances of metal interconnections in wiring structures and dielectric constants of interlayer dielectric layers that surround the metal interconnections. Such problems are referred to as resistance-capacitance (RC) delay. In order to reduce RC delay, materials of the metal interconnections are changed from aluminum to copper with a resistance lower than that of aluminum and materials of the interlayer dielectric layers that surround the metal interconnections are changed to materials having lower dielectric constants.

According to the prior art, a SiCN layer is deposited on a wiring layer after a chemical-mechanical planarization (CMP) process. The SiCN layer prevents an etching gas (e.g., a dry etching gas) or water ($H_2O$) from penetrating into an interlayer dielectric layer having a porous structure and a low dielectric constant and is used as an etch-stop layer (ESL). Meanwhile, as the size of a device shrinks, there is a demand for a thinner SiCN layer. However, the thinner SiCN film (e.g. with a thickness less than 100 Å) results in a limitation in preventing moisture or water from penetrating into a sub-layer low-k film (due to the limitation of a dielectric constant, etc.).

SUMMARY

One or more embodiments include a method of depositing a thin film with a thickness that is less than that of an existing capping layer (i.e., a SiCN layer) and excellent hermetic properties for protecting a sub-layer low-k layer from water or moisture.

Additional aspects will be set forth in part in the description which follows and, in part, will be apparent from the description, or may be learned by practice of the presented embodiments.

According to one or more embodiments, a method of forming a metal interconnection includes: depositing a low-k dielectric layer; forming a trench in the low-k dielectric layer; forming a barrier layer in the trench; filling a metal on the barrier layer; planarizing the metal; and forming a capping layer on the planarized metal, wherein the capping layer includes at least two layers and has a thickness equal to or less than 100 Å.

The forming of the capping layer may include depositing a first nitride layer and a second nitride layer.

The depositing of the first nitride layer and the second nitride layer may include: depositing an aluminum nitride (AlN) layer; and depositing a silicon nitride (SiN) layer.

The AlN layer may be formed by using a plasma-enhanced atomic layer deposition (PEALD) method. The deposition of the AlN layer may include a plurality of cycles, wherein each of the plurality of cycles includes: supplying an aluminum (Al) source gas; supplying a purge gas; supplying a reactive gas and activating the reactive gas by using plasma; and supplying the purge gas, wherein the purge gas is continuously supplied to a reactive space during the plurality of cycles. The Al source gas may include trimethyl aluminum ($Al(CH_3)_3$ or TMA), and the reactive gas may include a gas mixture of nitrogen and hydrogen.

The SiN layer may be formed by using a pulsed plasma-enhanced chemical vapor deposition (pulsed-PECVD, P-PECVD) method. The deposition of the SiN layer may include a plurality of cycles, wherein each of the plurality of cycles includes: supplying a silicon (Si) source gas; supplying a purge gas; supplying a reactive gas and activating the reactive gas by using plasma; and supplying the purge gas, wherein the reactive gas, the purge gas, and the plasma are continuously supplied to a reactive space during the plurality of cycles.

The Si source gas may include a silane gas.

The Si source gas may include at least one from among $SiH_4$, bis(diethylamino) silane (BDEAS), and diisopropylamino silane (DIPAS).

The reactive gas may include a gas mixture of nitrogen and hydrogen.

A thickness of the SiN layer may be at least 30 Å.

The method may further include performing plasma processing during the deposition of the first nitride layer and the second nitride layer, wherein the performing of the plasma processing includes at least one cycle, wherein each of the at least one cycle includes: supplying a nitrogen-containing gas; activating the nitrogen-containing gas by using plasma; and supplying a purge gas, wherein a metal oxide on the metal is reduced into a metal due to the cycle.

The forming of the capping layer may be performed at a temperature ranging from about 250° C. to about 350° C.

The first nitride layer and the second nitride layer may be formed in-situ in a same reactor.

A ratio of a thickness of the AlN layer to a thickness of the SiN layer may range from 1:1.5 to 1:2.

When the capping layer including the AlN layer and the SiN layer is exposed for 17 hours at a temperature of 85° C. and a humidity of 85%, a change in a stress of a thin film may be equal to or less than 50 MPa.

A ratio of power of plasma supplied during the deposition of the AlN layer to power of plasma supplied during the deposition of the SiN layer may range from about 10:1 to 8:1.

According to one or more embodiments, a method of manufacturing a device in a semiconductor apparatus includes: depositing a low-k dielectric layer; forming a trench in the low-k dielectric layer; forming a barrier layer in the trench; filling copper on the barrier layer to form a copper layer; planarizing the copper layer; applying plasma to the planarized copper layer; forming an aluminum nitride (AlN) layer on the planarized copper layer by using a plasma-enhanced atomic layer deposition (PEALD) method; and forming a silicon nitride (SiN) layer on the AlN layer in-situ in a reactor in which the AlN layer has been formed, wherein a sum of a thickness of the AlN layer and a thickness of the SiN layer ranges from about 50 Å to about 100 Å, wherein the forming the AlN layer and the forming of the SiN layer are performed at a temperature ranging from about 250° C. to about 350° C.

According to one or more embodiments, a method of manufacturing a device in a semiconductor apparatus includes: forming a first dielectric layer; forming a first metal layer in the first dielectric layer; and forming a capping layer with a thickness less than 100 Å on the first dielectric layer and the first metal layer, wherein the forming of the capping layer includes: forming an aluminum nitride layer; and forming a silicon nitride layer on the aluminum nitride layer.

According to one or more embodiments, a semiconductor device manufactured in a semiconductor apparatus includes: a first metal layer; a first dielectric layer surrounding a side surface of the first metal layer; an aluminum nitride layer contacting at least a part of the first metal layer and the first dielectric layer; a silicon nitride layer on the aluminum nitride layer; a second metal layer contacting a top surface of the first metal layer, a side surface of the aluminum nitride layer, and a side surface of the silicon nitride layer; and a second dielectric layer surrounding a side surface of the second metal layer, wherein a sum of a thickness of the aluminum nitride layer and a thickness of the silicon nitride layer is less than 100 Å.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
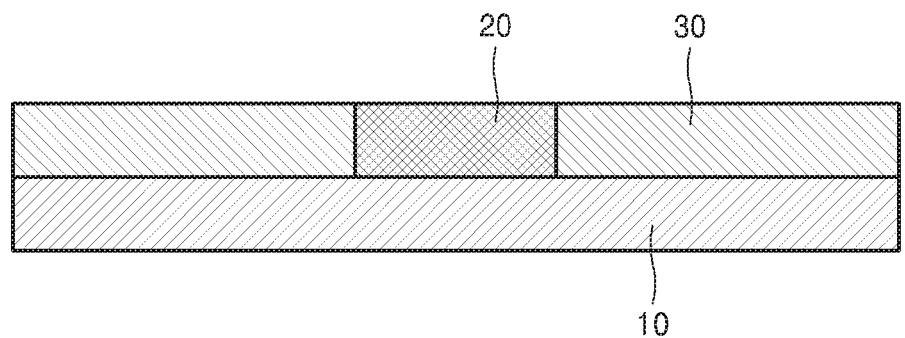
FIGS. 1 through 8 are cross-sectional views for explaining a method of forming a metal interconnection, according to embodiments.

The present disclosure will now be described more fully with reference to the accompanying drawings, in which embodiments of the present disclosure are shown.

The present disclosure now will be described more fully hereinafter with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the present disclosure to one of ordinary skill in the art.

The terminology used herein is for the purpose of describing embodiments only and is not intended to be limiting of embodiments of the present disclosure. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, components, and/or groups, but do not preclude the presence or addition of one or more other features, integers, steps, operations, elements, components, and/or groups thereof. As used here, the term "and/or" includes any and all combinations of one or more of the associated listed items.

It will be understood that although the terms "first", "second", etc. may be used herein to describe various members, regions, layers, and/or portions, these members, regions, layers, and/or portions should not be limited by these terms. The terms do not refer to a specific order, a vertical relationship, or a preference, and are only used to distinguish one member, region, or portion from another member, region, or portion. Accordingly, a first member, region, or portion which will be described below may refer to a second member, region, or portion without departing from the teaching of the present disclosure.

The present disclosure will now be described more fully with reference to the accompanying drawings, in which embodiments of the present disclosure are shown. In the drawings, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing.

Expressions such as "at least one of" when preceding a list of elements, modify the entire list of elements and do not modify the individual elements of the list.

FIGS. 1 through 8 are cross-sectional views for explaining a method of forming a metal interconnection (and a method of manufacturing a semiconductor manufacturing apparatus), according to embodiments.

First, referring to FIG. 1, a circuit element 20 is formed on a substrate 10. Although the circuit element 20 has a simple quadrangular shape in FIG. 1, the circuit element 20 may have any of various other shapes. For example, the circuit element 20 may be a gate structure or a capacitor structure of a memory device, or may be a photodiode or a driving transistor of an image device. An insulating layer 30 may be formed around the circuit element 20.

Although the circuit element 20 protrudes from the substrate 10 in FIG. 1, the circuit element 20 may be a doped region formed in the substrate 10 or a structure (e.g., a buried gate structure) formed in the substrate 10. In this case, the insulating layer 30 may be an element included in the substrate 10.

Figure 2:
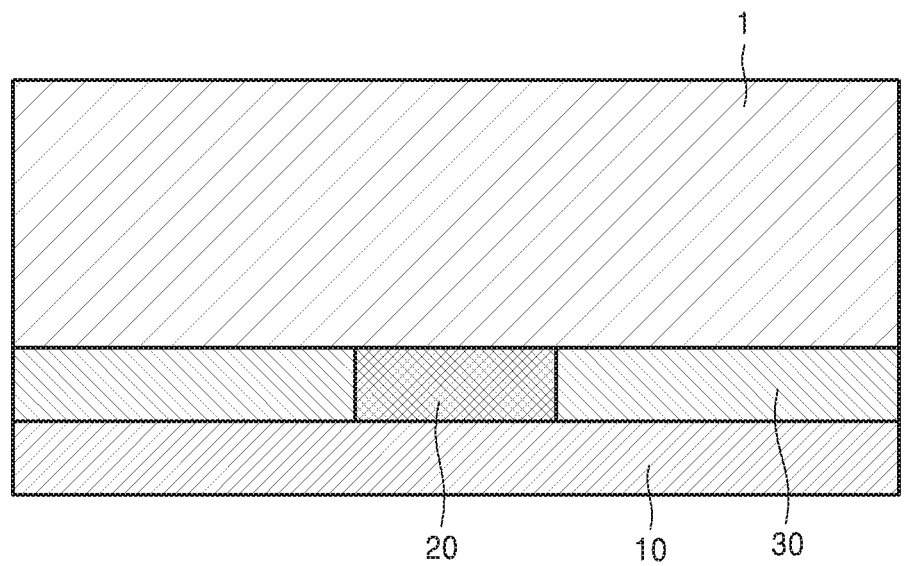

Referring to FIG. 2, an interlayer dielectric layer 1 is formed on the circuit element 20. The interlayer dielectric layer 1 may be formed on the insulating layer 30. In an optional embodiment, the interlayer dielectric layer 1 and the insulating layer 30 may be formed at the same time. The interlayer dielectric layer 1 may be deposited so that the interlayer dielectric layer 1 has a thickness suitable for a via structure.

Figure 3:
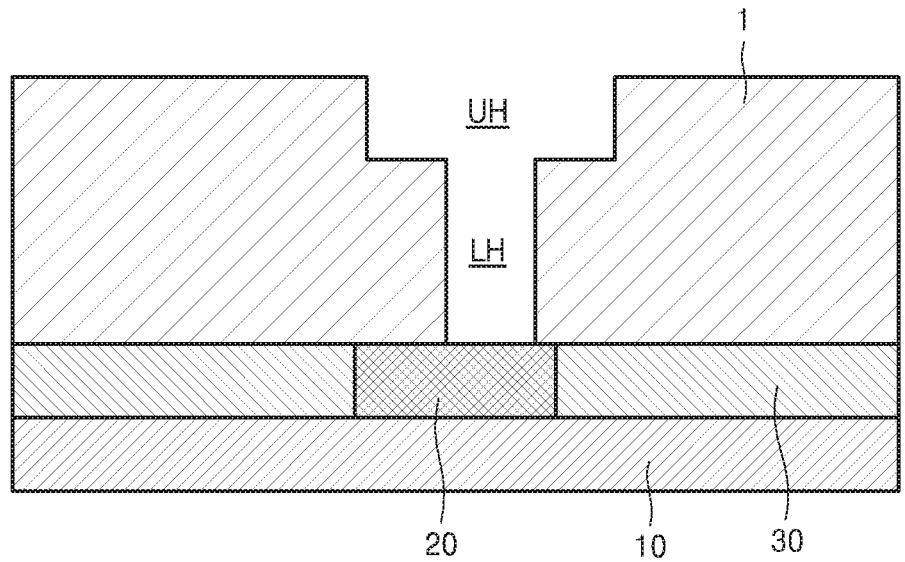

Referring to FIG. 3, the circuit element 20 is exposed by etching the interlayer dielectric layer 1. Although a via-hole structure including double trenches (i.e., a hole structure including an upper hole UH and a lower hole LH with different thicknesses) is illustrated in FIG. 3, the via-hole structure is not limited thereto. The via-hole structure may have a shape including a single trench or a shape including multiple trenches.

In order to form the via-hole structure including the double trenches, the following process may be used.

First step: A first photosensitive pattern having an opening with a first width is formed on the interlayer dielectric layer 1.

Second step: The upper hole UH with the first width is formed by a first etching (i.e. etching the interlayer dielectric layer 1 by using the first photosensitive pattern as a mask).

Third step: A second photosensitive pattern that contacts a side wall of the upper hole UH and exposes a part of the bottom of the upper hole UH is formed.

Fourth step: The lower hole LH with a second width is formed by a second etching (i.e. etching the interlayer dielectric layer 1 by using the second photosensitive pattern as a mask), the second width being less than the first width.

Fifth step: The second photosensitive pattern (and the first photosensitive pattern) is removed.

The present disclosure is not limited to the above process, and any of other processes for forming the via-hole structure including the double trenches may be used. For example, a lower interlayer dielectric layer may be formed while the interlayer dielectric layer 1 is formed, an etch-stop layer having an opening with a second width may be formed on the lower interlayer dielectric layer, and then an upper interlayer dielectric layer may be formed on the etch-stop layer. In this case, when the upper interlayer dielectric layer is etched, the etch-stop layer and the opening with the second width are exposed, and the lower insulating layer under the etch-stop layer is not etched and the lower insulating layer under the opening with the second width is etched. Accordingly, an upper hole with a first width may be formed in the upper interlayer dielectric layer and a lower hole with the second width may be formed in the lower interlayer dielectric layer.

Figure 4:
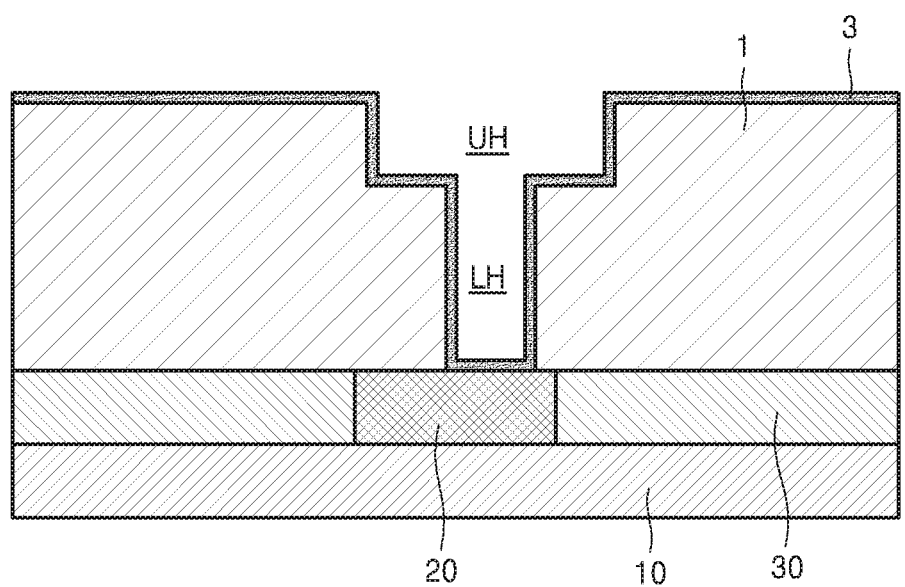

Referring to FIG. 4, a diffusion barrier layer 3 is formed on the via-hole structure including the double trenches. The diffusion barrier layer 3 may prevent a metal element of a via structure from diffusing into the interlayer dielectric layer 1. The diffusion barrier layer 3 may include at least one from among, for example, tantalum (Ta), tantalum nitride (TaN), titanium (Ti), titanium nitride (TiN), tungsten (W), tungsten nitride (WN), tantalum silicon nitride (TaSiN), titanium silicon nitride (TiSiN), and tungsten silicon nitride (WSiN).

Figure 5:
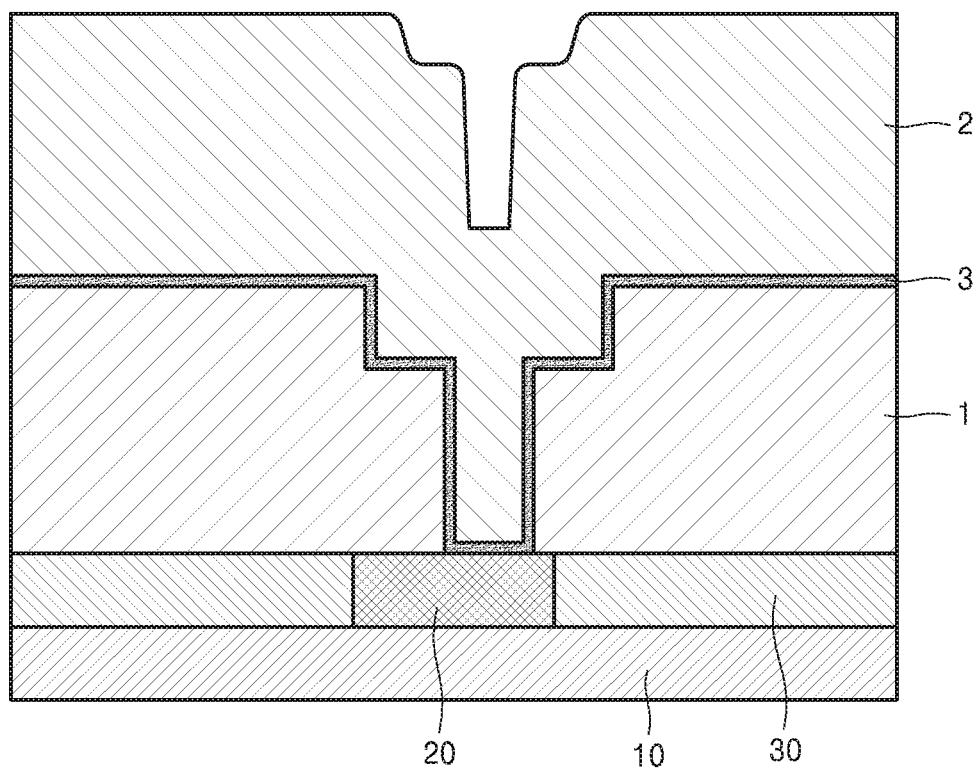

Referring to FIG. 5, a metal layer 2 is formed on the diffusion barrier layer 3. The metal layer 2 may include, for example, copper, and may be formed of another metal material in consideration of a thermal expansion coefficient difference from an ambient material. Although not shown in FIG. 5, when the metal layer 2 is formed by using copper, a copper seed layer may be first formed on the diffusion barrier layer 3 and then the metal layer 2 may be formed by using the copper seed layer.

Figure 6:
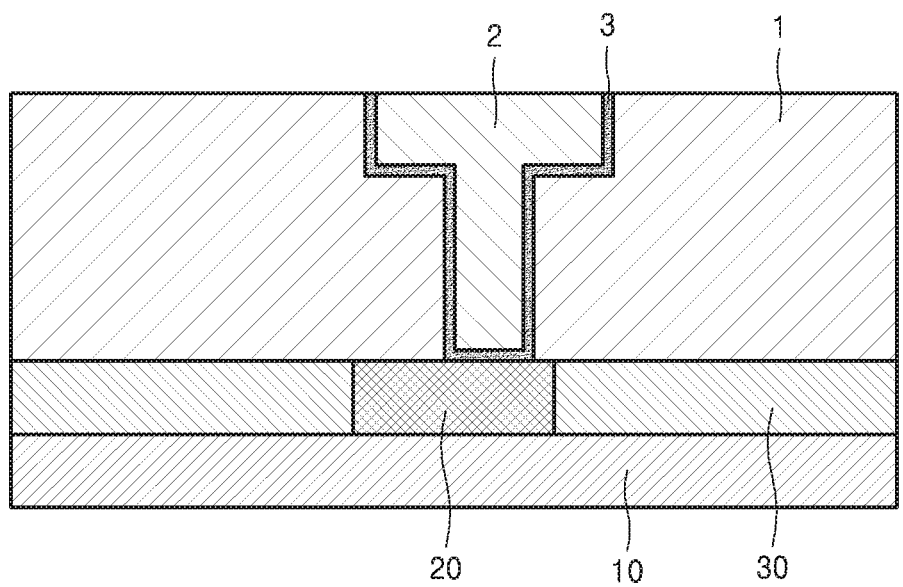

Referring to FIG. 6, a top surface of the metal layer 2 is planarized by removing a part of the metal layer 2 by using a planarization process. A chemical mechanical polishing (CMP) process may be used to planarize the top surface of the metal layer 2.

Figure 7:
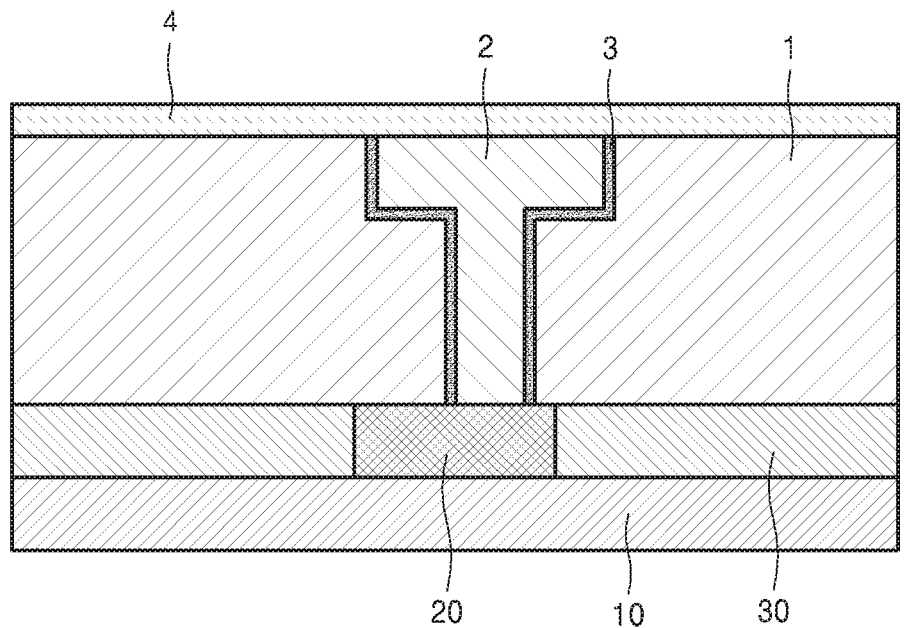
Figure 8:
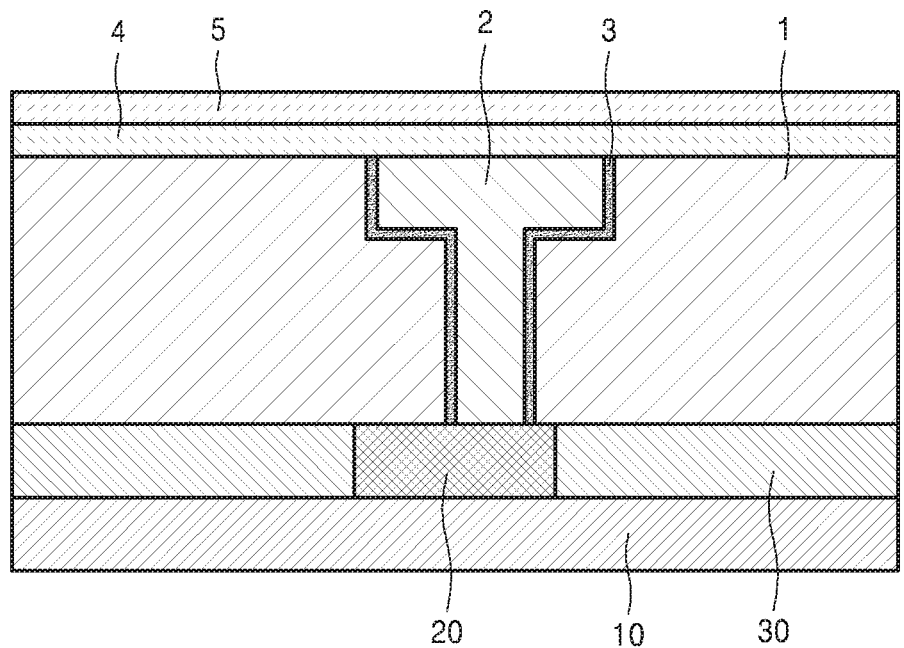

Referring to FIGS. 7 and 8, a capping layer having a double-layer structure may be formed on the planarized metal layer 2. The capping layer may prevent a dry etching gas, water ($H_2O$), oxygen ($O_2$), or soluble chemical species used in CMP from diffusing/penetrating into the interlayer dielectric layer 1 or a metal interconnection (e.g. a copper wiring) during a subsequent wiring process.

Once water or oxygen penetrates into the interlayer dielectric layer 1, a dielectric constant of the interlayer dielectric layer 1 may increase, RC delay may increase, and a response time of a device may slow down. According to the present disclosure, since the capping layer having the double-layer structure is used, such problems may be solved. Also, when an upper interlayer dielectric layer is formed on the lower metal layer 2 in order to form the capping layer including two metal layers, a metal component may be prevented from diffusing from the metal layer 2 to the upper interlayer dielectric layer 1 and the metal layer 2 may be prevented from corroding, owing to the capping layer of the double-layer structure.

The applicant has recognized that as a size of a device shrinks (and a thickness of a capping layer decreases), hermetic properties of a capping layer that includes an existing SiCN single layer against water or moisture decrease, and thus has invented a method of depositing a film with excellent hermetic properties even by using a capping layer with a thinner thickness.

The method may be performed by using the following process.

A first layer 4 is deposited on the metal layer 2 (see FIG. 7).

A second layer 5 is deposited on the first layer 4 (see FIG. 8).

A sum of thicknesses of the first layer 4 and the second layer 5 may be equal to or less than 100 Å. Also, each of the first layer 4 and the second layer 5 may be, for example, a nitride layer. Accordingly, the forming of the capping layer having the double-layer structure according to an embodiment may include depositing a first nitride layer and a second nitride layer. The first nitride layer and the second nitride layer may be sequentially deposited, and may be formed, for example, in-situ in the same reactor.

In an embodiment, the first layer 4 may be an aluminum nitride (AlN) layer and the second layer 5 may be a silicon nitride (SiN) layer. For example, the AlN layer may be formed by using plasma-enhanced (PEALD). Also, the SiN layer may be formed by using PEALD or pulsed plasma-enhanced chemical vapor deposition (P-PECVD). Accordingly, the forming of the capping layer may be performed at a low temperature ranging from, for example, about 250° C. to about 350° C.

In a PEALD method, a precursor and plasma may be alternately and intermittently supplied to a reactor repeatedly. In a P-PECVD method, plasma may be continuously supplied to the reactor and a precursor may be intermittently supplied.

Figure 9:
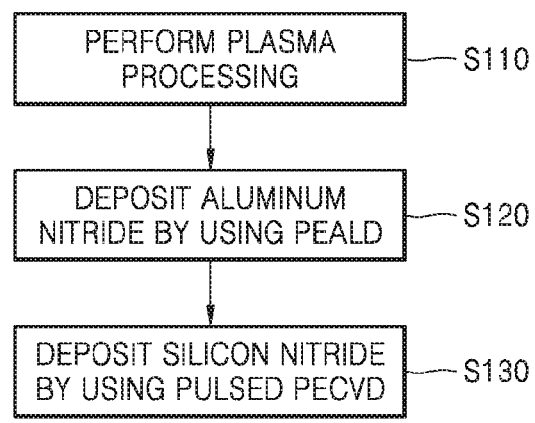
FIG. 9 is a flowchart of a method of forming a metal interconnection and a method of manufacturing a device in a semiconductor manufacturing apparatus according to embodiments.

FIG. 9 is a flowchart of a method of forming a metal interconnection and a method of manufacturing a device in a semiconductor manufacturing apparatus according to embodiments. The manufacturing method may be a modification of the manufacturing method according to the above embodiments, and a repeated explanation thereof will not be given.

Referring to FIG. 9, a process of forming a capping layer having a double-layer structure on the metal layer 2 may be performed as follows.

In operation S110, plasma processing is performed.
In operation S120, AlN is deposited by using PEALD.
In operation S130, SiN is deposited by using P-PECVD.
Operations S110 through S130 are continuously performed in-situ in a reactor at the same temperature ranging from about 250° C. to about 350° C.

First, operation S110, in which plasma processing is performed, is a step of reducing a metal oxide (e.g., a copper oxide (CuO)) formed on the metal layer 2 (e.g., a copper wiring interconnection) in a CMP process that is a front-end process into a metal (e.g., copper).

In the present disclosure, a gas mixture of ammonia ($NH_3$), nitrogen ($N_2$), and hydrogen ($H_2$) is supplied to a reaction space in which the substrate 10 is mounted and plasma is activated. Power of the plasma may range from about 50 W to about 300 W. As the plasma is activated, a metal oxide may be reduced and a process residue remaining on a surface of the planarized metal layer 2 (see FIG. 6) may be removed.

Operation S110 has a cycle including a step of activating plasma and a step of performing a purge process. In the present embodiment, the cycle is performed only once. However, an in an optional embodiment, the cycle may be performed a plurality of times.

A process condition in operation S110, in which the plasma processing is performed, is briefed as follows.
  Process temperature: 250° C.-350° C.
  Reactive gas: $N_2/H_2/NH_3$ (gas mixture)
  Power of plasma: 100 W-300 W
  Process pressure: 2 Torr-4 Torr
  Process sequence: plasma ignition/purge
  Repetition number: 1 cycle Although a method of generating plasma in a reactive space is used in the present embodiment, according to an optional embodiment, plasma processing may be performed by generating active species by using remote plasma and the active species may be supplied into the reaction space.

Operation S120, in which AlN is deposited, is performed by using a PEALD method. In the present embodiment, trimethyl aluminum ($Al(CH_3)_3$ or TMA) is used as a aluminum (Al) source gas and a gas mixture of $N_2/H_2$ is used as a reactive gas. When operation S120, in which an AlN layer is deposited, has a cycle including a step of supplying TMA, a step of performing a purge process, a step of supplying plasma along with a gas mixture of $N_2/H_2$, and a step of performing a purge process, the cycle is repeatedly performed 18 times until the AlN layer has a thickness of 20 Å.

A process condition in operation S120, in which the AlN layer is deposited, is briefed as follows.
  Process temperature: 250° C. to 350° C.
  Source gas: TMA (trimethyl aluminum)
  Reactive gas: $N_2/H_2$ (gas mixture)
  Purge gas: argon (Ar)
  Power of plasma: 200 W-400 W
  Process pressure: 2 Torr-4 Torr
  Process sequence: TMA supply/purge/plasma ignition/purge
  Repetition number: 18 cycles (20 Å)

Although a method of generating plasma in a reactive space is used in the present embodiment, according to an optional embodiment, plasma processing may be performed by generating active species by using remote plasma and the active species may be supplied into the reaction space as described above.

Operation S130, in which SiN is deposited, is performed by using a P-PECVD method. In the present embodiment, silane ($SiH_4$) is used as a silicon (Si) source and a gas mixture of $N_2/H_2$ is used as a reactive gas. In the present embodiment, a reactive gas, a purge gas, and plasma are continuously supplied and $SiH_4$ is intermittently supplied. In a preferable embodiment, when one cycle is performed by supplying $SiH_4$ for 0.2 seconds and supplying a purge gas for 2 seconds, the cycle is repeatedly performed, for example, 50 times, until a thickness of a SiN layer is 30 Å.

A process condition in operation S130, in which the SiN layer is deposited, is briefed as follows.
  Process temperature: 250° C.-350° C.
  Source gas: $SiH_4$
  Reactive gas: $N_2/H_2$ (gas mixture)
  Purge gas: Ar
  Power of plasma: 20 W-50 W
  Process pressure: 2 Torr-4 Torr
  Process sequence: $SiH_4$ supply/purge
  Repetition number: 50 cycles (30 Å)

Although a method of generating plasma in a reaction space is used in the present embodiment, according to an optional embodiment, plasma processing may be performed by generating active species by using remote plasma and the active species may be supplied into the reaction space as described above. Also, although $SiH_4$ is used as a silane-based source gas in the present embodiment, any of other silane-based source gases may be used. That is, an aminosilane-based silicon source gas such as bisdiethylaminosilane (BDEAS), bisethylmethylaminosilane (BEMAS), or diisoprophylaminosilane (DIPAS), a silane chloride-based silicon source gas such as dichlorosilane (DCS), trichlorosilane (TCS), or hexachlorodisilane (HCD), or a combination thereof may be used as a source gas in operation S130.

In the above embodiment, since a capping layer having a double-layer structure of AlN/SiN is deposited, excellent hermetic properties against water or moisture may be ensured. Copper may be prevented from diffusing into a low-k interlayer dielectric layer and moisture may be prevented from penetrating into the low-k interlayer dielectric layer in a metal (copper) wiring process. That is, the applicant has found that, a thin AlN/SiN layer, instead of an existing thick SiCN layer, is realized and excellent hermetic properties against water or moisture are ensured, and the thin film of AiN/SiN with a thickness equal to or less than 100 Å that is required as a size of a device shrinks may be formed.

Also, in the above embodiment, since a plasma process, instead of an existing thermal process, is used at a low temperature, deformation of and damage to a sub-layer low-k dielectric layer may be minimized. Since a film is deposited by using a PEALD process, the film may be more finely and uniformly deposited than a film formed by using a CVD. A ratio of power of plasma for more efficiently achieving such effects is the same as a value obtained in the above embodiment. That is, power of plasma supplied during the depositing of the AlN layer ranges from about 200 W to about 400 W, and power of plasma supplied during the depositing of the SiN layer ranges from about 20 W to about 50 W. The inventor has found that it is optimal for a ratio of power of plasma supplied during the depositing of the AlN layer to power of plasma supplied during the depositing of the SiN layer to range from 10:1 to 8:1.

In addition, according to the above embodiment, since two layers are continuously deposited in-situ in one reactor, a film with excellent hermetic properties may be deposited without exposure to air and without deformation due to the exposure.

Figure 10:
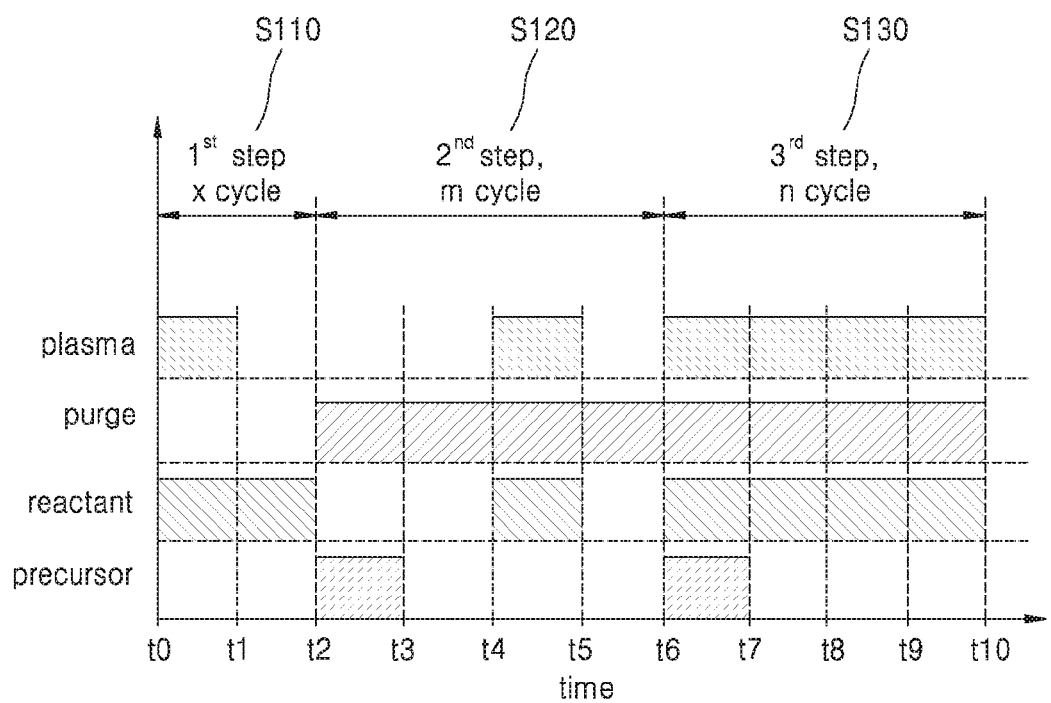
FIG. 10 is a timing diagram for explaining a method of forming a metal interconnection and a method of manufacturing a device in a semiconductor manufacturing apparatus according to embodiments.

FIG. 10 is a timing diagram for explaining a method of forming a metal interconnection and a method of manufacturing a device in a semiconductor manufacturing apparatus according to embodiments. The manufacturing method may be a modification of the manufacturing method according to the above embodiments, and thus a repeated explanation thereof will not be given.

Referring to FIG. 10, operation S110 is a step of performing plasma treatment process during a period from a time t0 to a time t2. During operation S110, a metal oxide (e.g., a copper oxide) formed on a surface of a metal interconnection (e.g., a copper wiring) during a CMP front-end process is reduced into a metal element.

For example, a copper wiring may be used as the metal interconnection, and an inert purge gas (e.g., $N_2$) may be used as a reactive gas. In this case, a source gas (e.g., a precursor) may not be supplied.

In an optional embodiment, $NH_3$ may be supplied as a reactive gas and the reactive gas may be activated by using plasma to reduce a copper oxide. In this case, a purge gas may be supplied additionally.

Although operation S110 may be performed x times, operation S110 is performed only once in an embodiment.

Operation S120 is a step of performing a PEALD process during a period from the time t2 to a time t6. During operation S120, a precursor that is a source gas and a reactant (e.g., a reactive gas) may be sequentially supplied. In more detail, the source gas may be supplied during a period from the time t2 to a time t3 and the reactive gas may be supplied during a period from a time t4 to a time t5. A purge gas may be supplied during the period from the time t2 to the time t6.

As plasma is supplied during the period from the time t4 to the time t5, the reactive gas may be activated and the activated reactive gas may react with the source gas deposited to a thickness of an atomic layer level to deposit a film on the substrate 10. In an embodiment, during operation S120, an AlN layer may be deposited by using TMA as the source gas and a gas mixture of $N_2$ and $H_2$ or $NH_3$ as the reactive gas.

When steps performed during the period from the time t2 to the time t6 are referred to as one cycle, a plurality of atomic layers may be deposited by repeatedly performing the cycle m times. Preferably, an AlN layer with a thickness equal to or greater than 10 Å may be deposited by repeatedly performing the cycle. More preferably, an AlN layer may be formed to have a thickness ranging from about 20 Å to about 30 Å.

Although the reactive gas is supplied during the period from the time t4 to the time t5 (that is, after the time t4) during which the plasma is supplied in operation S120 of FIG. 10, the reactive gas may start to be supplied before the time t4 at which the plasma is supplied. Accordingly, a reactive gas density in a reaction space may become more uniform. Accordingly, since the reactive gas is supplied before the time t4, an active species density in the reaction space may become more uniform and properties (e.g., a wet etch rate ratio (WERR)) of a deposited film over the substrate may become more uniform.

In some embodiments, an inert gas such as Ar may be used as a purge gas. The purge gas may be continuously supplied to a reactor during the period from the time t2 to the time t6. In this case, as described above, a gas mixture of $N_2$ and $H_2$ or $NH_3$ may be supplied as a reactive gas.

In an optional embodiment, a nitrogen gas may be used as a purge gas. The nitrogen gas may be used as a reactive purge gas, and in this case, the nitrogen gas may be activated only when plasma is supplied and may react with a source gas to form an AlN layer.

Operation S130 is a step of depositing a SiN thin film by using a P-PECVD method. The deposition of the SiN thin film by using the P-PECVD method may be performed in-situ in the reactor in which operation S120 has been performed by using the PEALD method.

The AlN layer deposited in operation S120 may be oxidized when being exposed to air. Accordingly, the AlN/SiN layer may be deposited in-situ by continuously performing operation S130 in the same reactor. An AlN/SiN layer may be deposited by continuously performing operation S130 in the same reactor.

In operation S130, a reactive gas, a purge gas, and plasma are continuously supplied during a period from the time t6 to a time t10, whereas a source gas is intermittently supplied during a period from the time t6 to a time t7. When steps performed during the period from the time t6 to the time t10 are referred to as one cycle, a SiN thin film with a desired thickness may be deposited by repeatedly performing the cycle n times. In operation S130, a gas mixture of $N_2$ and $H_2$ or $NH_3$ may be used as the reactive gas. In an embodiment, a SiN thin film may be deposited to a thickness equal to or greater than 30 Å. In a preferable embodiment, a SiN thin film may be deposited to a thickness ranging from about 30 Å to about 60 Å.

Since the AlN layer may have a thickness ranging from about 20 Å to about 30 Å and the SiN thin film may have a thickness ranging from about 30 Å to about 60 Å as described above, a ratio of a thickness of the AlN layer to a thickness of the SiN layer may range from 1:1.5 to 1:2. However, a thickness of the AlN layer, a thickness of the SiN layer, and a ratio between the thicknesses above are conditions introduced to satisfy a process condition required in designing a device in which the film has to have a thickness of less than 100 Å and to have excellent hermetic properties (see FIG. 13). Accordingly, an individual thickness (i.e., a thickness of an individual layer) of a double-film structure according to the present disclosure is not limited thereto.

In an optional embodiment, during operations S110 through S130, a process temperature may be maintained at a low temperature ranging from about 250° C. to about 350° C. Accordingly, while a multi-metal layer structure is formed, damage to a sub interlayer dielectric layer (in particular, a low-k dielectric layer) may be prevented. Also, since plasma is applied during operations S110 through S130, a reaction time may speed up, a deposition rate may be higher than that of an existing thermal ALD process, and productivity per unit time may increase. Also, since a thin film with a thin thickness is deposited in cycles, thin film uniformity may be improved.

Figure 11:
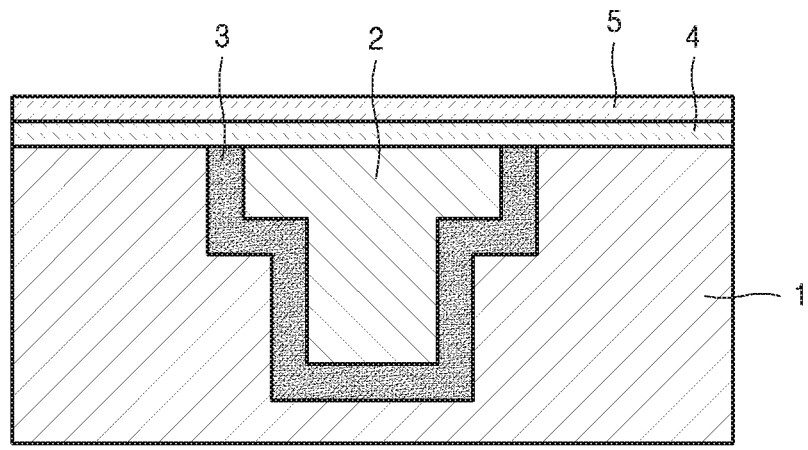
FIGS. 11 through 12 are cross-sectional views for explaining a method of forming a metal interconnection according to other embodiments.
Figure 12:
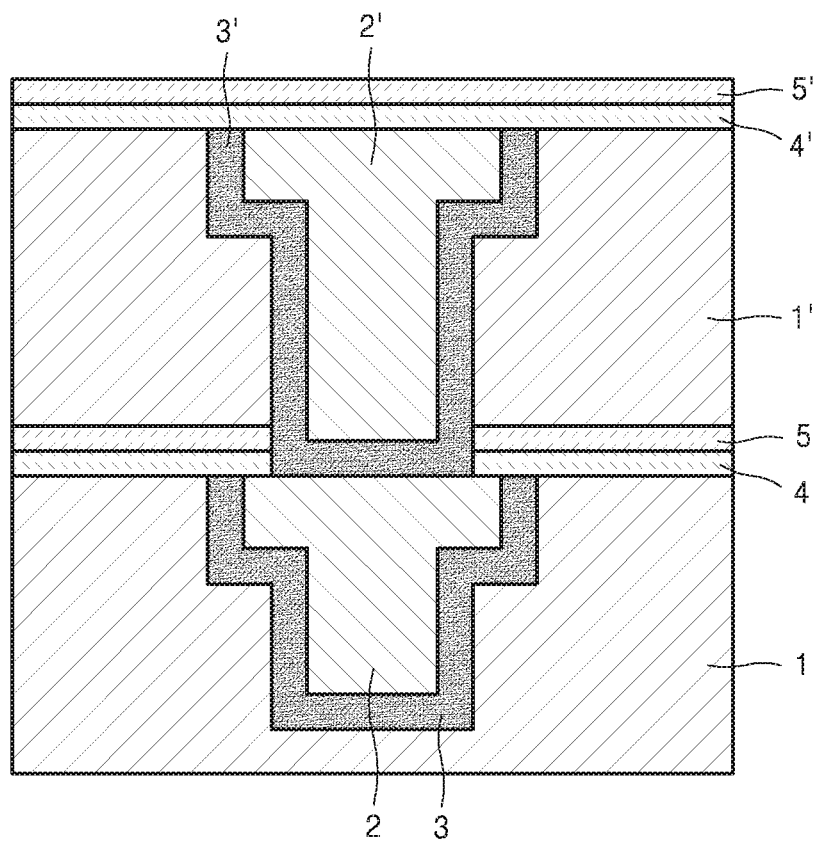

FIGS. 11 and 12 are cross-sectional views illustrating a metal interconnection of a device manufactured in a semiconductor apparatus according to other embodiments. A metal interconnection and a semiconductor device including the metal interconnection according to embodiments may be a structure formed by using the manufacturing method according to the above embodiments, and thus a repeated explanation thereof will not be given.

Referring to FIG. 11, a metal interconnection may be, for example, a copper wiring, and may be applied to a logic device or a memory device. The metal interconnection may include the interlayer dielectric layer 1 that is a low-k dielectric layer, the metal layer 2, the diffusion barrier layer 3, and a capping layer.

The interlayer dielectric layer 1 may be formed of a material having a low dielectric constant equal to or less than 2.5, and may include a tetraethyl orthosilicate ($Si(C_2H_5O)_4$ or TEOS)-based material (e.g., SiOC or SICOH). The interlayer dielectric layer 1 may have a porous structure. The interlayer dielectric layer 1 may surround side surfaces of the metal layer 2 and the diffusion barrier layer 3.

The diffusion barrier layer 3 may prevent a metal element of the metal layer 2 from diffusing and affecting film quality of the interlayer dielectric layer 1 as described above. The metal layer 2 is a wiring layer formed of aluminum or copper, and the diffusion barrier layer 3 and the metal layer 2 may be referred to as one element (e.g., the metal layer 2).

The capping layer may have a double-layer structure including the first layer 4 and the second layer 5 as described above, and may include a first nitride layer (e.g., an aluminum nitride layer) and a second nitride layer (e.g., a silicon nitride layer). The first layer 4 may contact at least a part (e.g., a top surface) of the metal layer 2 and the interlayer dielectric layer 1. The first layer 4 may directly contact the metal layer 2 and the interlayer dielectric layer 1 (that is, with no element therebetween). The second layer 5 may be located on the first layer 4. In an optional embodiment, since the first layer and the second layer are formed in-situ, the first and second layers 4 and 5 may directly contact each other.

FIG. 12 is a view illustrating a bi-layer wiring structure obtained by forming an additional wiring structure (i.e., a second metal layer 2') on a wiring structure (i.e., the metal layer 2 (referred to as the first metal layer 2)) of FIG. 11.

Referring to FIG. 12, the second metal layer 2' may be formed on the first metal layer 2. In more detail, for example, when the first layer 4 is an aluminum nitride layer and the second layer 5 is a silicon nitride layer, the second metal layer 2' may contact a top surface of the first metal layer 2, a side surface of the aluminum nitride layer, and a side surface of the silicon nitride layer.

Although the second metal layer is denoted by 2' in the present embodiment of FIG. 12, the metal layer (or the second metal layer) is not limited to 2'. For example, the second metal layer may be construed as including a diffusion barrier layer 3' including metal as described above. In this case, the second metal layer may directly contact a top surface of the first metal layer 2, a side surface of the aluminum nitride layer, and a side surface of the silicon nitride layer.

Figure 13:
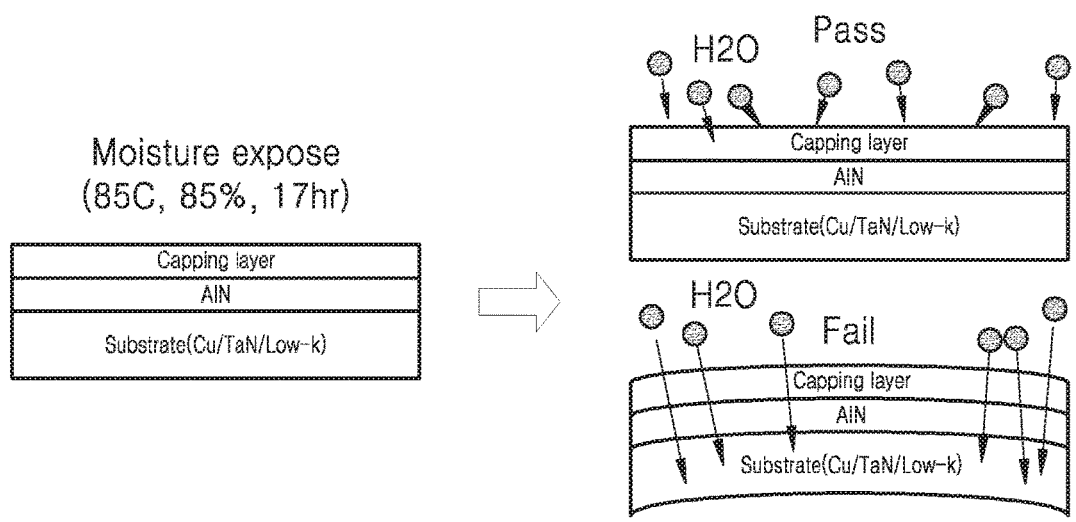
FIG. 13 is a diagram for explaining an experiment for determining whether a double-layer structure has appropriate hermetic properties on a substrate according to an embodiment.

FIG. 13 is a diagram for explaining an experiment for determining whether a double-layer structure has appropriate hermetic properties on a substrate according to an embodiment. The substrate includes a metal layer, a diffusion barrier layer, and an interlayer dielectric layer (including, for example, TEOS) according to the above embodiments. In particular, TEOS easily absorbs water. As TEOS absorbs water, a volume of the substrate increases and a compressive stress is generated (see portion FAIL at the bottom right).

In order to form a capping layer for preventing the permeation of water, when the capping layer is exposed for 17 hours in an atmosphere with a temperature of 85° C. and a humidity of 85%, a change in a stress of a substrate has to be less than 50 MPa. In general, as a thickness of a capping layer decreases, the capping layer is more vulnerable to the permeation of water. When a conventional SiCN capping layer has a thickness equal to or less than 100 Å, a condition that a change in a stress has to be less than 50 MPa is not satisfied.

However, according to embodiments, since a double-layer structure including different materials is used, a condition that a change in a stress has to be less than 50 MPa may be satisfied.

Table 1 shows a result obtained after evaluating hermetic properties of a double-layer structure (including AlN 20 Å/SiN 30 Å) according to an embodiment against water ($H_2O$) through the experiment of FIG. 13.

TABLE 1

| Slot No. | AlN thickness | SiN thickness | Si precursor | Change in stress (ΔMPa) | Pass/Fail |
|---|---|---|---|---|---|
| 01 | 20 | 30 | BDEAS | −38 | Pass |
| 02 | 20 | 40 | BDEAS | −40 | Pass |
| 03 | 20 | 30 | $SiH_4$ | −4 | Pass |
| 04 | 20 | 40 | $SiH_4$ | −5 | Pass |

As shown in Table 1, hermetic properties of an existing SiCN layer with a thickness equal to or less than 100 Å degrade whereas a layer with a thinner thickness according to the present disclosure has excellent hermetic properties.

According to the one or more embodiments, instead of a SiCN film that is an existing capping layer, an AlN thin film is deposited and a SiN thin film is deposited on the AlN thin film. Due to such a double-layer structure, a capping layer may have a thickness of several nanometers which is less than that of the SiCN film and may ensure excellent hermetic properties.

Embodiments should not be construed as limited to the particular shapes of portions illustrated herein for better understanding of the present disclosure but may be to include deviations in shapes.

While one or more embodiments have been described with reference to the figures, it will be understood by one of ordinary skill in the art that various changes in form and details may be made therein without departing from the spirit and scope of the disclosure as defined by the following claims.

What is claimed is:

1. A method of forming a metal interconnection, the method comprising:
    depositing a low-k dielectric layer;
    forming a trench in the low-k dielectric layer;
    forming a barrier layer in the trench;
    filling a metal on the barrier layer;
    planarizing the metal; and
    forming a capping layer on the planarized metal,
    wherein the capping layer comprises at least two layers and has a thickness equal to or less than 100 Å,
    wherein the forming of the capping layer comprises depositing a first nitride layer and a second nitride layer, and
    wherein the depositing of the first nitride layer and the second nitride layer comprises:
    depositing an aluminum nitride (AlN) layer; and
    depositing a silicon nitride (SiN) layer,
    wherein a ratio of a thickness of the AlN layer to a thickness of the SiN layer ranges from 1:15 to 1:2, and
    wherein, when the capping layer comprising the AlN layers and SiN layer is exposed for 17 hours at a temperature of 85° C. and a humidity of 85%, a change in strees of a thin film is equal to or less than 50 MPa.

2. The method of claim 1, wherein the AlN layer is formed by using a plasma-enhanced atomic layer deposition (PEALD) method.

3. The method of claim 2, wherein the depositing of the AlN layer comprises a plurality of cycles,
    wherein each of the plurality of cycles comprises:
    supplying an aluminum (Al) source gas;
    supplying a purge gas;
    supplying a reactive gas and activating the reactive gas by using plasma; and
    supplying the purge gas,
    wherein the purge gas is continuously supplied to a reaction space during the plurality of cycles.

4. The method of claim 3, wherein the Al source gas comprises trimethyl aluminum ($Al(CH_3)_3$ or TMA), and the reactive gas comprises a gas mixture of nitrogen and hydrogen.

5. The method of claim 1, wherein the SiN layer is formed by using a pulsed plasma-enhanced chemical vapor deposition (P-PECVD) method.

6. The method of claim 1, wherein a thickness of the SiN layer is at least 30 Å.

7. The method of claim 1, wherein the first nitride layer and the second nitride layer are formed in-situ in the same reactor.

8. A method of forming a metal interconnection, the method comprising:
   depositing a low-k dielectric layer;
   forming a trench in the low-k dielectric layer;
   forming a barrier layer in the trench;
   filling a metal on the barrier layer;
   planarizing the metal; and
   forming a capping layer on the planarized metal,
   wherein the capping layer comprises at least two layers and has a thickness equal to or less than 100 Å,
   wherein the forming of the capping layer comprises depositing a first nitride layer and a second nitride layer,
   wherein the depositing of the first nitride layer and the second nitride layer comprises:
      depositing an aluminum nitride (AlN) layer; and
      depositing a silicon nitride (SiN) layer,
   wherein the SiN layer is formed by using a pulsed plasma-enhanced chemical vapor deposition (P-PECVD) method,
   wherein the depositing of the SiN layer comprises a plurality of cycles,
   wherein each of the plurality of cycles comprises:
      supplying a silicon (Si) source gas;
      supplying a purge gas;
      supplying a reactive gas and activating the reactive gas by using plasma; and
      supplying the purge gas, and
   wherein the reactive gas, the purge gas, and the plasma are continuously supplied to a reaction space during the plurality of cycles.

9. The method of claim 8, wherein the Si source gas comprises Si and H elements.

10. The method of claim 9, wherein the Si source gas comprises at least one from among $SiH_4$, bis(diethylamino) silane (BDEAS), and diisopropylamino silane (DIPAS).

11. The method of claim 8, wherein the reactive gas comprises a gas mixture of nitrogen and hydrogen.

12. A method of forming a metal interconnection, the method comprising:
   depositing a low-k dielectric layer;
   forming a trench in the low-k dielectric layer;
   forming a barrier layer in the trench;
   filling a metal on the barrier layer;
   planarizing the metal; and
   forming a capping layer on the planarized metal, wherein the capping layer comprises at least two layers and has a thickness equal to or less than 100 Å,
   wherein the forming of the capping layer comprises depositing a first nitride layer and a second nitride layer,
   wherein the depositing of the first nitride layer and the second nitride layer comprises:
      depositing an aluminum nitride (AlN) layer; and
      depositing a silicon nitride (SiN) layer,
   wherein the SiN layer is formed by using a pulsed plasma-enhanced chemical vapor deposition (P-PECVD) method,
   wherein the method further comprises performing plasma processing before the deposition of the first nitride layer and the second nitride layer,
   wherein performing the plasma processing comprises at least one cycle,
   wherein each of the at least one cycle comprises:
      supplying a nitrogen-containing gas;
      activating the nitrogen-containing gas by using plasma; and
      supplying a purge gas, and
   wherein a metal oxide on the metal is reduced into a metal during the cycle.

13. A method of forming a metal interconnection, the method comprising:
   depositing a low-k dielectric layer;
   forming a trench in the low-k dielectric layer;
   forming a barrier layer in the trench;
   filling a metal on the barrier layer;
   planarizing the metal; and
   forming a capping layer on the planarized metal,
   wherein the capping layer comprises at least two layers and has a thickness equal to or less than 100 Å,
   wherein the forming of the capping layer comprises depositing a first nitride layer and a second nitride layer,
   wherein the depositing of the first nitride layer and the second nitride layer comprises:
      depositing an aluminum nitride (AlN) layer; and
      depositing a silicon nitride (SiN) layer,
   wherein the SiN layer is formed by using a pulsed plasma-enhanced chemical vapor deposition (P-PECVD) method, and,
   wherein the forming of the capping layer is performed at a temperature ranging from about 250° C. to about 350° C.

14. A method of forming a metal interconnection, the method comprising:
   depositing a low-k dielectric layer;
   forming a trench in the low-k dielectric layer;
   forming a barrier layer in the trench;
   filling a metal on the barrier layer;
   planarizing the metal; and
   forming a capping layer on the planarized metal,
   wherein the capping layer comprises at least two layers and has a thickness equal to or less than 100 Å,
   wherein the forming of the capping layer comprises depositing a first nitride layer and a second nitride layer,
   wherein the depositing of the first nitride layer and the second nitride layer comprises:
      depositing an aluminum nitride (AlN) layer; and
      depositing a silicon nitride (SiN) layer,
   wherein the SiN layer is formed by using a plasma-enhanced atomic layer deposition (PEALD) method, and
   wherein a ratio of power of plasma supplied during the depositing of the AlN layer to power of plasma supplied during the depositing of the SiN layer ranges from about 10:1 to 8:1.

15. A method of manufacturing a semiconductor device, the method comprising:
   depositing a low-k dielectric layer;
   forming a trench in the low-k dielectric layer;
   forming a barrier layer in the trench;

filling copper on the barrier layer to form a copper layer;
planarizing the copper layer;
applying plasma to the planarized copper layer;
forming an aluminum nitride (AlN) layer on the planarized copper layer by using a plasma-enhanced atomic layer deposition (PEALD) method; and
forming a silicon nitride (SiN) layer on the AlN layer in-situ in a reactor in which the AlN layer has been formed,
wherein a sum of a thickness of the AlN layer and a thickness of the SiN layer ranges from about 50 Å to about 100Å, and
wherein the forming the AlN layer and the forming of the SiN layer are performed at a temperature ranging from about 250° C. to about 350° C.

16. A method of manufacturing a semiconductor device, the method comprising: forming a first dielectric layer; forming a first metal layer in the first dielectric layer; and forming a capping layer with a thickness less than 100 Å on the first dielectric layer and the first metal layer, wherein the forming of the capping layer comprises: forming an aluminum nitride layer; and forming a silicon nitride layer on the aluminum nitride layer, and wherein the aluminum nitride layer is located between the first metal layer and the silicon nitride layer; and forming a second dielectric layer on the said capping layer; forming a second metal layer in the said second dielectric layer; and forming a second capping layer with a thickness less than 100 Å on the second dielectric layer and the second first metal layer, wherein the forming of the second capping layer comprises: forming an second aluminum nitride layer; forming a second silicon nitride layer on the second aluminum nitride layer; and wherein a part of the second metal layer contacts the first metal layer and the side wall of the said first capping, layer.

* * * * *